United States Patent
Bouche et al.

(10) Patent No.: US 12,094,822 B2
(45) Date of Patent: Sep. 17, 2024

(54) BURIED POWER RAILS WITH SELF-ALIGNED VIAS TO TRENCH CONTACTS

(71) Applicant: Intel Corporation, Santa Clara, CA (US)

(72) Inventors: Guillaume Bouche, Portland, OR (US); Andy Chih-Hung Wei, Yamhill, OR (US); Changyok Park, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 706 days.

(21) Appl. No.: 16/950,240

(22) Filed: Nov. 17, 2020

(65) Prior Publication Data
US 2022/0157722 A1     May 19, 2022

(51) Int. Cl.
*H01L 23/528*     (2006.01)
*H01L 21/768*     (2006.01)
(Continued)

(52) U.S. Cl.
CPC .... *H01L 23/5286* (2013.01); *H01L 21/76897* (2013.01); *H01L 21/823821* (2013.01);
(Continued)

(58) Field of Classification Search
CPC ........... H01L 23/5286; H01L 21/76897; H01L 21/823821; H01L 21/823871;
(Continued)

(56) References Cited

U.S. PATENT DOCUMENTS

| | | |
|---|---|---|
| 10,020,381 B1 | 7/2018 | Fan et al. |
| 2018/0040719 A1 | 2/2018 | Wang et al. |

(Continued)

FOREIGN PATENT DOCUMENTS

| | | |
|---|---|---|
| CN | 113380880 A | 9/2021 |
| EP | 3454366 A1 | 3/2019 |

(Continued)

OTHER PUBLICATIONS

Non Final Office Action in U.S. Appl. No. 16/812,428 dated Jun. 29, 2021, 12 pages.
(Continued)

*Primary Examiner* — Karen Kusumakar
*Assistant Examiner* — Adam S Bowen
(74) *Attorney, Agent, or Firm* — Akona IP PC

(57) ABSTRACT

Transistor arrangements fabricated by forming a metal gate cut as an opening that is non-selective to the gate sidewalls are disclosed. The etch process may be used to provide a power rail if the opening is at least partially filled with an electrically conductive material. Once an electrically conductive material has been deposited within the opening to form a power rail, recessing such a material in portions of the power rail that face gate stacks of various transistors may provide further improvements in terms of reduced parasitic capacitance. A mask for a trench contact to be used to electrically couple the power rail to a S/D region of a transistor may be used as a mask when the electrically conductive material of the power rail is recessed to realize a via that is self-aligned to the trench contact.

19 Claims, 29 Drawing Sheets

(51) Int. Cl.
*H01L 21/8238* (2006.01)
*H01L 23/522* (2006.01)
*H01L 27/092* (2006.01)
*H01L 29/06* (2006.01)
*H01L 29/66* (2006.01)
*H01L 29/78* (2006.01)

(52) U.S. Cl.
CPC .. *H01L 21/823871* (2013.01); *H01L 23/5226* (2013.01); *H01L 23/5283* (2013.01); *H01L 27/0924* (2013.01); *H01L 29/0673* (2013.01); *H01L 29/66795* (2013.01); *H01L 29/785* (2013.01)

(58) Field of Classification Search
CPC ............. H01L 23/5226; H01L 23/5283; H01L 27/0924; H01L 29/0673; H01L 29/66795; H01L 29/785; H01L 21/76895; H01L 21/76898; H01L 23/535; H01L 27/0886; H01L 29/42392; H01L 2029/7858; H10B 10/12
See application file for complete search history.

(56) References Cited

U.S. PATENT DOCUMENTS

| | | |
|---|---|---|
| 2018/0053694 A1 | 2/2018 | Cheng et al. |
| 2018/0069000 A1 | 3/2018 | Bergendahl et al. |
| 2018/0261514 A1 | 9/2018 | Xie et al. |
| 2018/0294267 A1 | 10/2018 | LiCausi et al. |
| 2018/0350810 A1 | 12/2018 | Bergendahl et al. |
| 2018/0374951 A1* | 12/2018 | Jambunathan .... H01L 21/02524 |
| 2019/0013246 A1 | 1/2019 | Wallace et al. |
| 2019/0067277 A1 | 2/2019 | Tsai et al. |
| 2019/0067290 A1 | 2/2019 | Wang et al. |
| 2019/0067417 A1 | 2/2019 | Ching et al. |
| 2019/0164805 A1 | 5/2019 | Chou et al. |
| 2019/0164837 A1 | 5/2019 | Hung et al. |
| 2019/0164839 A1 | 5/2019 | Tsai et al. |
| 2019/0165178 A1 | 5/2019 | Chen et al. |
| 2019/0348516 A1 | 11/2019 | Ramaswamy et al. |
| 2020/0006075 A1 | 1/2020 | Wang et al. |
| 2020/0006334 A1* | 1/2020 | Hsueh ................. H01L 21/0217 |
| 2020/0075428 A1 | 3/2020 | Venigalla et al. |
| 2020/0083222 A1 | 3/2020 | Kim et al. |
| 2020/0098681 A1 | 3/2020 | Kim et al. |
| 2020/0105603 A1 | 4/2020 | Chang et al. |
| 2020/0135578 A1 | 4/2020 | Ching et al. |
| 2020/0176318 A1 | 6/2020 | Jang et al. |
| 2020/0373331 A1* | 11/2020 | Kim .................... H01L 27/1203 |
| 2021/0028070 A1 | 1/2021 | Volkovich et al. |
| 2021/0074697 A1 | 3/2021 | Baek et al. |
| 2021/0098309 A1 | 4/2021 | Min et al. |
| 2021/0098471 A1 | 4/2021 | Chen et al. |
| 2021/0134722 A1 | 5/2021 | Zhang et al. |
| 2021/0280708 A1 | 9/2021 | Wei et al. |

FOREIGN PATENT DOCUMENTS

| | | |
|---|---|---|
| EP | 3671825 A1 | 6/2020 |
| EP | 4002452 A1 | 5/2022 |
| TW | 202002004 A | 1/2020 |
| TW | 202137484 A | 10/2021 |

OTHER PUBLICATIONS

Final Office Action in U.S. Appl. No. 16/812,428 dated Nov. 9, 2021, 28 pages.
Extended European Search Report in European Application No. 22157125.0 dated Jul. 8, 2022, 12 pages.

* cited by examiner

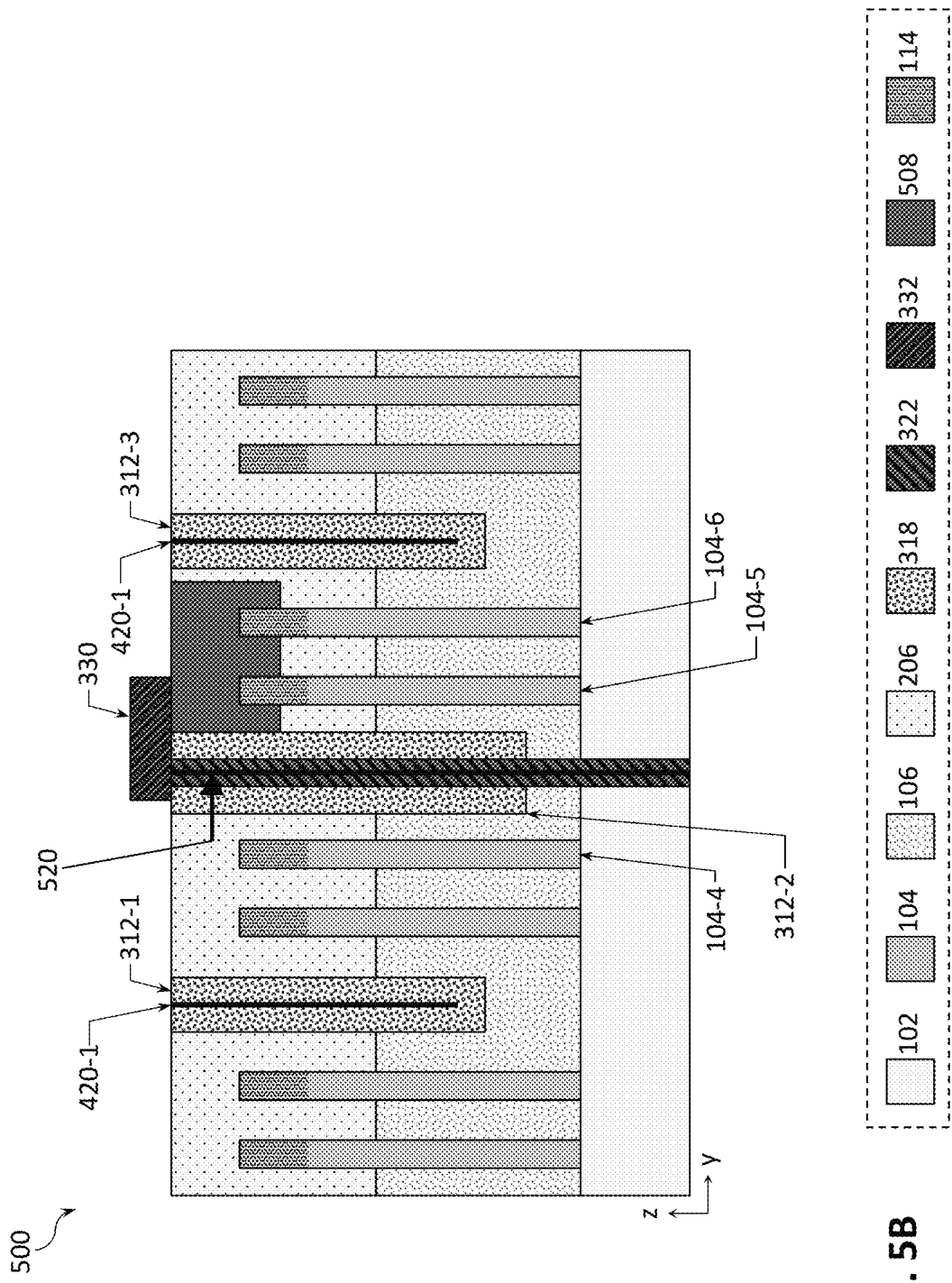

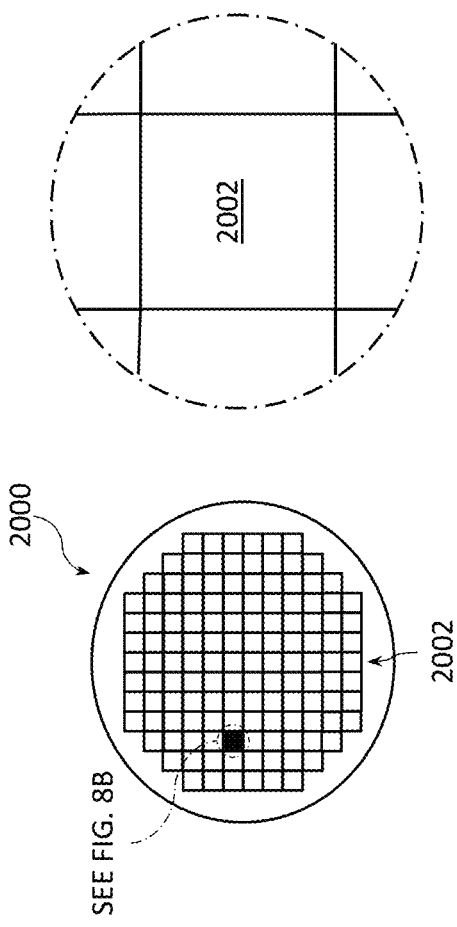

BURIED POWER RAILS WITH SELF-ALIGNED VIAS TO TRENCH CONTACTS

TECHNICAL FIELD

This disclosure relates generally to the field of semiconductor devices, and more specifically, to transistors.

BACKGROUND

A field-effect transistor (FET), e.g., a metal-oxide-semiconductor (MOS) FET (MOSFET), is a three-terminal device that includes source, drain, and gate terminals and uses electric field to control current flowing through the device. A FET typically includes a semiconductor channel material, a source and a drain regions provided in the channel material, and a gate stack that includes at least a gate electrode material and may also include a gate dielectric material, the gate stack provided over a portion of the channel material between the source and the drain regions. Because gate electrode materials often include metals, gates of transistors are commonly referred to as "metal gates."

Recently, FETs with non-planar architectures, such as fin-based FETS (FinFETs, also sometimes referred to as "wrap-around gate transistors" or "tri-gate transistors") and nanoribbon/nanowire transistors (also sometimes referred to as "all-around gate transistors"), have been extensively explored as alternatives to transistors with planar architectures.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 5B provides a cross-sectional side view of the IC structure of FIG. 3A with a cross-section taken along a S/D contact to which a trench contact is coupled, according to another embodiment of the disclosure.

FIGS. 8A and 8B are top views of, respectively, a wafer and dies that may include one or more IC structures with one or more BPRs with self-aligned vias to trench contacts in accordance with any of the embodiments disclosed herein.

DETAILED DESCRIPTION

Overview

Figure 1:
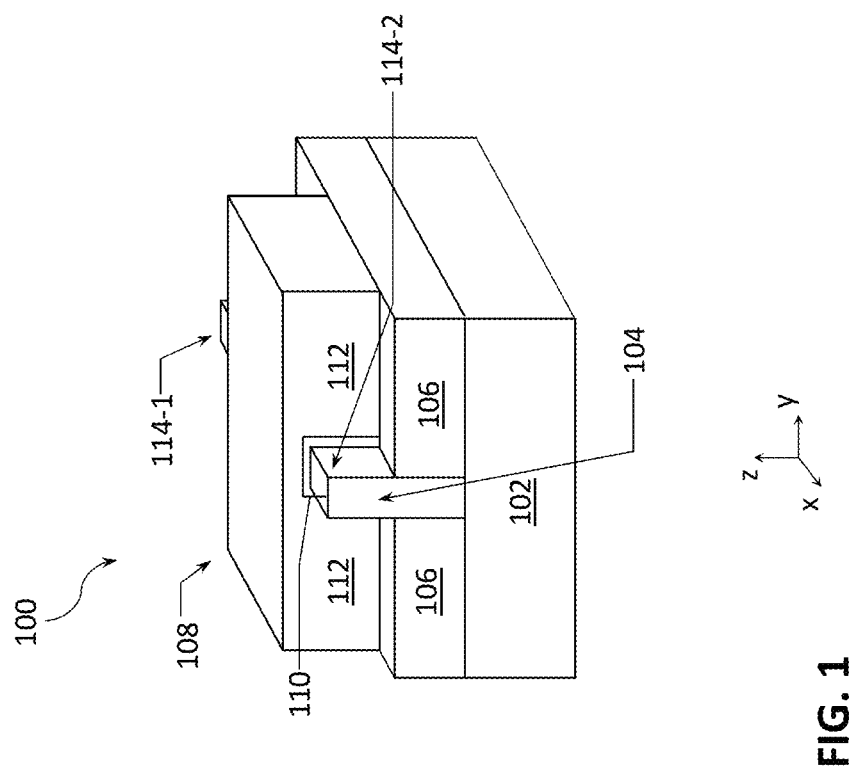
FIG. 1 is a perspective view of an example FinFET, according to some embodiments of the disclosure.

The systems, methods and devices of this disclosure each have several innovative aspects, no single one of which is solely responsible for all of the desirable attributes disclosed herein. Details of one or more implementations of the subject matter described in this specification are set forth in the description below and the accompanying drawings.

For purposes of illustrating transistor arrangements with BPRs with self-aligned vias to trench contacts, proposed herein, it might be useful to first understand phenomena that may come into play in such arrangements. The following foundational information may be viewed as a basis from which the present disclosure may be properly explained. Such information is offered for purposes of explanation only and, accordingly, should not be construed in any way to limit the broad scope of the present disclosure and its potential applications. While some of the following descriptions may be provided for the example of transistors being implemented as FinFETs, embodiments of the present disclosure are equally applicable to transistor arrangements employing transistors of other architectures, such as nanoribbon or nanowire transistors.

As described above, recently, FETs with non-planar architectures, such as FinFETs and nanoribbon/nanowire transistors, have been extensively explored as alternatives to transistors with planar architectures.

In a FinFET, a semiconductor structure shaped as a fin extends away from a base (e.g., from a semiconductor substrate), and a gate stack may wrap around the upper portion of the fin (i.e., the portion farthest away from the base), potentially forming a gate on 3 sides of the fin. The portion of the fin around which the gate stack wraps around is referred to as a "channel" or a "channel portion" of a FinFET. A semiconductor material of the channel portion is commonly referred to as a "channel material" of the transistor. A source region and a drain region are provided in the fin on the opposite sides of the gate stack, forming, respectively, a source and a drain of a FinFET.

In a nanoribbon transistor, a gate stack may be provided around a portion of an elongated semiconductor structure called "nanoribbon", forming a gate on all sides of the nanoribbon. The "channel" or the "channel portion" of a nanoribbon transistor is the portion of the nanoribbon around which the gate stack wraps around. A source region and a drain region are provided in the nanoribbon on each side of the gate stack, forming, respectively, a source and a drain of a nanoribbon transistor. In some settings, the term "nanoribbon" has been used to describe an elongated semiconductor structure that has a substantially rectangular transverse cross-section (i.e., a cross-section in a plane perpendicular to the longitudinal axis of the structure), while the term "nanowire" has been used to describe a similar structure but with a substantially circular transverse cross-section.

Taking FinFETs as an example, oftentimes, fabrication of an IC device having an array of FinFETs involves, first, providing a plurality of fins (typically parallel to one another), and then providing metal gate lines that cross over multiple fins (the metal gate lines often, but not always, being substantially perpendicular to the lengths, or longitudinal axes, of the fins, the metal gate lines provided in a plane substantially parallel to the plane of the support structure on which the fins are formed). A metal gate line crossing a first fin of the plurality of fins may form a gate of a transistor in the first fin, while the metal gate line crossing an adjacent second fin may form a gate of a transistor in the second fin. Since the metal gate line crosses over both the first and the second fins, the metal gate line is electrically continuous over the first and second fins, thereby providing an electrical coupling between the gate of the transistor in the first fin and the gate of the transistor in the second fin. In a later part of a fabrication process, it may be desirable to disrupt this continuity, e.g., if the design is such that it requires that the gate of the transistor in the first fin is decoupled from the gate of the transistor in the second fin.

As the dimensions of IC devices are ever-decreasing, disrupting the electrical continuity of a metal gate line (a process commonly referred to as a "metal gate cut") to decouple gates of transistors on adjacent fins in a manner that is sufficiently accurate, cost-efficient, and does not inadvertently compromise performance of an IC device is far from trivial. One conventional approach includes using a combination of masks and etch-selective materials (i.e., materials that are etched by different etchants) to selectively etch the gate electrode materials in areas where the metal gate line is to be disrupted. Selective etch is typically an isotropic etch, meaning that a given material is etched substantially in all directions, and may result in significant bloating of the actual gate cut relative to the desired shape. In extreme cases, lateral encroachment of such gate cuts may disable one or more fins.

Described herein are transistor arrangements fabricated by forming a metal gate cut as an opening (e.g., a trench opening) that is non-selective to the gate sidewalls, in an etch process that can remove both the gate electrode materials and the surrounding dielectrics. Such an etch process may provide improvements in terms of accuracy, cost-efficiency, and device performance, compared to conventional approaches to forming metal gate cuts. In addition, such a process may be used to provide power rails (i.e., electrical interconnects for providing power and/or signals to one or more transistors of a transistor arrangement), if the opening of a metal gate cut is to be at least partially filled with an electrically conductive material. Providing the electrically conductive material of a power rail in the opening in between the fins, as opposed to being provided over the fins, may provide improvements in terms of reduced metal line resistance and reduced voltage droop.

Further embodiments of the present disclosure are based on recognition that, an electrically conductive material has been deposited within the opening to form a power rail, recessing such a material in portions of the power rail that face gate stacks of various transistors may provide further improvements in terms of reduced parasitic capacitance. Because of such recess, the power rail may be referred to as a "buried" power rail. In some embodiments, the BPR may extend all the way through the support structure (e.g., a substrate, a wafer, a chip, or a die) over which the transistor arrangement is provided, so that an electrical connection to the power rail may, advantageously, be provided from the back side of the support structure. Furthermore, in some embodiments, a mask for a trench contact that is to be used to electrically couple the power rail to a S/D region of a transistor may be used as a mask when the electrically conductive material of the power rail is recessed. Using such a mask will result in formation of a via structure of the electrically conductive material of the power rail, the via structure providing electrical coupling between the recessed portions of the power rail and the S/D region of the transistor, and advantageously being self-aligned to the trench contact. BPRs with self-aligned vias to trench contacts as described herein may be used to address the scaling challenges of conventional transistor arrangements and enable high density arrangements compatible with advanced complementary metal-oxide-semiconductor (CMOS) processes. Other technical effects will be evident from various embodiments described here.

While descriptions provided herein refer to FinFETs, these descriptions are equally applicable to embodiments any other non-planar FETs besides FinFETs, e.g., to nanoribbon transistors, nanowire transistors, or transistors such as nanoribbon/nanowire transistors but having transverse cross-sections of any geometry (e.g., oval, or a polygon with rounded corners).

IC structures as described herein, in particular IC structures with one or more transistor arrangements with BPRs with self-aligned vias to trench contacts as described herein, may be used for providing electrical connectivity to one or more components associated with an IC or/and between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

For purposes of explanation, specific numbers, materials and configurations are set forth in order to provide a thorough understanding of the illustrative implementations. However, it will be apparent to one skilled in the art that the present disclosure may be practiced without the specific details or/and that the present disclosure may be practiced with only some of the described aspects. In other instances, well-known features are omitted or simplified in order not to obscure the illustrative implementations.

Further, references are made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, if a collection of drawings designated with different letters are present, e.g., FIGS. 6A-6B, such a collection may be referred to herein without the letters, e.g., as "FIG. 6."

In the drawings, some schematic illustrations of example structures of various devices and assemblies described herein may be shown with precise right angles and straight lines, this is simply for ease of illustration, and embodiments of these assemblies may be curved, rounded, or otherwise irregularly shaped as dictated by, and sometimes inevitable due to, the manufacturing processes used to fabricate semiconductor device assemblies. Therefore, it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication. Furthermore, although a certain number of a given element may be illustrated in some of the drawings (e.g., a certain number of BPRs, a certain number of fins, a certain number of metal gate cuts, etc.), this is simply for ease of illustration, and more, or less, than that number may be included in an IC structure with one or more BPRs with self-aligned vias to trench contacts as described herein. Still further, various views shown in some of the drawings are intended to show relative arrangements of various elements therein. In other embodiments, various IC structures with one or more BPRs with self-aligned vias to trench contacts as described herein, or portions thereof, may include other elements or components that are not illustrated (e.g., transistor portions, various components that may be in electrical contact with any of the metal lines, etc.). Inspection of layout and mask data and reverse engineering of parts of a device to reconstruct the circuit using e.g., optical microscopy, TEM, or SEM, and/or inspection of a cross-section of a device to detect the shape and the location of various device elements described herein using e.g., Physical Failure Analysis (PFA) would allow determination of presence of one or more BPRs with self-aligned vias to trench contacts as described herein.

Various operations may be described as multiple discrete actions or operations in turn, in a manner that is most helpful in understanding the claimed subject matter. However, the order of description should not be construed as to imply that these operations are necessarily order dependent. These operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges.

The description uses the phrases "in an embodiment" or "in embodiments," which may each refer to one or more of the same or different embodiments. The terms "comprising," "including," "having," and the like, as used with respect to embodiments of the present disclosure, are synonymous. The disclosure may use perspective-based descriptions such as "above," "below," "top," "bottom," and "side" to explain various features of the drawings, but these terms are simply for ease of discussion, and do not imply a desired or required orientation. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, various aspects of the illustrative implementations will be described using terms commonly employed by those skilled in the art to convey the substance of their work to others skilled in the art.

For example, some descriptions may refer to a particular source or drain region or contact being either a source region/contact or a drain region/contact. However, unless specified otherwise, which region/contact of a transistor is considered to be a source region/contact and which region/contact is considered to be a drain region/contact is not important because under certain operating conditions, designations of source and drain are often interchangeable. Therefore, descriptions provided herein may use the term of a "S/D region/contact" to indicate that the region/contact can be either a source region/contact, or a drain region/contact.

In another example, if used, the terms "package" and "IC package" are synonymous, as are the terms "die" and "IC die," the term "insulating" means "electrically insulating," the term "conducting" means "electrically conducting," unless otherwise specified. Although certain elements may be referred to in the singular herein, such elements may include multiple sub-elements. For example, "an electrically conductive material" may include one or more electrically conductive materials.

In another example, if used, the terms "oxide," "carbide," "nitride," etc. refer to compounds containing, respectively, oxygen, carbon, nitrogen, etc., the term "high-k dielectric" refers to a material having a higher dielectric constant than silicon oxide, while the term "low-k dielectric" refers to a material having a lower dielectric constant than silicon oxide.

In yet another example, a term "interconnect" may be used to describe any element formed of an electrically conductive material for providing electrical connectivity to one or more components associated with an IC or/and between various such components. In general, the "interconnect" may refer to both trench contacts (also sometimes referred to as "lines") and vias. In general, a term "trench contact" may be used to describe an electrically conductive element isolated by a dielectric material typically comprising an interlayer low-k dielectric that is provided within the plane of an IC chip. Such trench contacts are typically stacked into several levels, or several layers of metallization stacks. On the other hand, the term "via" may be used to describe an electrically conductive element that interconnects two or more trench contacts of different levels. To that end, a via may be provided substantially perpendicularly to the plane of an IC chip and may interconnect two trench contacts in adjacent levels or two trench contacts in not adjacent levels. A term "metallization stack" may be used to refer to a stack of one or more interconnects for providing connectivity to different circuit components of an IC chip.

Furthermore, the term "connected" may be used to describe a direct electrical or magnetic connection between the things that are connected, without any intermediary devices, while the term "coupled" may be used to describe either a direct electrical or magnetic connection between the things that are connected, or an indirect connection through one or more passive or active intermediary devices. The term "circuit" may be used to describe one or more passive and/or active components that are arranged to cooperate with one another to provide a desired function.

The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

Example FinFET

FIG. 1 is a perspective view of an example FinFET 100, according to some embodiments of the disclosure. The FinFET 100 illustrates one example of transistors that may be implemented in various transistor arrangements described herein, e.g., in the transistor arrangements shown in FIGS. 2-7. The FinFET 100 shown in FIG. 1 is intended to show relative arrangement(s) of some of the components therein. In various embodiments, the FinFET 100, or portions thereof, may include other components that are not illustrated (e.g., any further materials, such as e.g. spacer materials, surrounding the gate stack of the FinFET 100, electrical contacts to the S/D regions of the FinFET 100, etc.).

As shown in FIG. 1, the FinFET 100 may be provided over a base 102, where the term "base" may refer to any suitable support structure on which a transistor may be built, e.g., a substrate, a die, a wafer, or a chip. As also shown in FIG. 1, the FinFET 100 may include a fin 104, extending away from the base 102. A portion of the fin 104 that is closest to the base 102 may be enclosed by an insulator material 106, commonly referred to as a "shallow trench isolation" (STI). The portion of the fin 104 enclosed on its' sides by the STI 106 is typically referred to as a "subfin portion" or simply a "subfin." As further shown in FIG. 1, a gate stack 108 that includes at least a layer of a gate electrode material 112 and, optionally, a layer of a gate dielectric 110, may be provided over the top and sides of the remaining upper portion of the fin 104 (e.g., the portion above and not enclosed by the STI 106), thus wrapping around the upper-most portion of the fin 104. The portion of the fin 104 over which the gate stack 108 wraps around may be referred to as a "channel portion" of the fin 104 because this is where, during operation of the FinFET 100, a conductive channel may form. The channel portion of the fin 104 is a part of an active region of the fin 104. A first S/D region 114-1 and a second S/D region 114-2 (also commonly referred to as "diffusion regions") are provided on the opposite sides of the gate stack 108, forming source and drain terminals of the FinFET 100.

In general, implementations of the present disclosure may be formed or carried out on a support structure such as a semiconductor substrate, composed of semiconductor material systems including, for example, N-type or P-type materials systems. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V, group II-VI, or group IV materials. Although a few examples of materials from which the substrate may be formed are described here, any material that may serve as a foundation upon which transistor arrangements with one or more BPRs with self-aligned vias to trench contacts as described herein may be built falls within the spirit and scope of the present disclosure. In various embodiments, the base 102 may include any such substrate material that provides a suitable surface for forming the FinFET 100.

As shown in FIG. 1, the fin 104 may extend away from the base 102 and may be substantially perpendicular to the base 102. The fin 104 may include one or more semiconductor materials, e.g. a stack of semiconductor materials, so that the upper-most portion of the fin (namely, the portion of the fin 104 enclosed by the gate stack 108) may serve as the channel region of the FinFET 100. Therefore, as used herein, the term "channel material" of a transistor may refer to such upper-most portion of the fin 104, or, more generally, to any portion of one or more semiconductor materials in which a conductive channel between source and drain regions may be formed during operation of a transistor.

As shown in FIG. 1, the STI material 106 may enclose the sides of the fin 104. A portion of the fin 104 enclosed by the STI 106 forms a subfin. In various embodiments, the STI material 106 may be a low-k or high-k dielectric including, but not limited to, elements such as hafnium, silicon, oxygen, nitrogen, titanium, tantalum, lanthanum, aluminum, zirconium, barium, strontium, yttrium, lead, scandium, niobium, and zinc. Further examples of dielectric materials that may be used in the STI material 106 may include, but are not limited to silicon nitride, silicon oxide, silicon dioxide, silicon carbide, silicon nitride doped with carbon, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate.

Above the subfin portion of the fin 104, the gate stack 108 may wrap around the fin 104 as shown in FIG. 1. In particular, the gate dielectric 110 may wrap around the upper-most portion of the fin 104, and the gate electrode 112 may wrap around the gate dielectric 110. The interface between the channel portion of the fin 104 and the subfin portion of the fin 104 is located proximate to where the gate electrode 112 ends.

The gate electrode 112 may include one or more gate electrode materials, where the choice of the gate electrode materials may depend on whether the FinFET 100 is a P-type metal-oxide-semiconductor (PMOS) transistor or an N-type metal-oxide-semiconductor (NMOS) transistor. For a PMOS transistor, gate electrode materials that may be used in different portions of the gate electrode 112 may include, but are not limited to, ruthenium, palladium, platinum, cobalt, nickel, and conductive metal oxides (e.g., ruthenium oxide). For an NMOS transistor, gate electrode materials that may be used in different portions of the gate electrode 112 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode 112 may include a stack of a plurality of gate electrode materials, where zero or more materials of the stack are workfunction (WF) materials and at least one material of the stack is a fill metal layer. Further materials/layers may be included next to the gate electrode 112 for other purposes, such as to act as a diffusion barrier layer or/and an adhesion layer.

If used, the gate dielectric 110 may include a stack of one or more gate dielectric materials. In some embodiments, the gate dielectric 110 may include one or more high-k dielectric materials. In various embodiments, the high-k dielectric materials of the gate dielectric 110 may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric 110 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 110 during manufacture of the FinFET 100 to improve the quality of the gate dielectric 110.

In some embodiments, the gate stack 108 may be surrounded by a dielectric spacer, not specifically shown in FIG. 1. The dielectric spacer may be configured to provide separation between the gate stacks 108 of different FinFETs 100 which may be provided along a single fin (e.g., different FinFETs provided along the fin 104, although FIG. 1 only illustrates one of such FinFETs), as well as between the gate stack 108 and the source/drain contacts disposed on each side of the gate stack 108. Such a dielectric spacer may include one or more low-k dielectric materials. Examples of the low-k dielectric materials that may be used as the dielectric spacer include, but are not limited to, silicon dioxide, carbon-doped oxide, silicon nitride, fused silica glass (FSG), and organosilicates such as silsesquioxane, siloxane, and organosilicate glass. Other examples of low-k dielectric materials that may be used as the dielectric spacer include organic polymers such as polyimides, polynorbornenes, benzocyclobutene, perfluorocyclobutane, or polytetrafluoroethylene (PTFE). Still other examples of low-k dielectric materials that may be used as the dielectric spacer include silicon-based polymeric dielectrics such as hydrogen silsesquioxane (HSQ) and methylsilsesquioxane (MSQ). Other examples of low-k materials that may be used in a dielectric spacer include various porous dielectric materials, such as for example porous silicon dioxide or porous carbon-doped silicon dioxide, where large voids or pores are created in a dielectric in order to reduce the overall dielectric constant of the layer, since voids can have a dielectric constant of nearly 1. When such a dielectric spacer is used, then the lower portions of the fin 104, e.g., the subfin portion of the fin 104, may be surrounded by the STI material 106 which may, e.g., include any of the high-k dielectric materials described herein.

In some embodiments, the fin 104 may be composed of semiconductor material systems including, for example, N-type or P-type materials systems. In some embodiments, the fin 104 may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. In some embodiments, the fin 104 may include a combination of semiconductor materials where one semiconductor material is used for the channel portion and another material, sometimes referred to as a "blocking material," is used for at least a portion of the subfin portion of the fin 104. In some embodiments, the subfin and the channel portions of the fin 104 are each formed of monocrystalline semiconductors, such as e.g. Si or Ge. In a first embodiment, the subfin and the channel portion of the fin 104 are each formed of compound semiconductors with a first sub-lattice of at least one element from group III of the periodic table (e.g., Al, Ga, In), and a second sub-lattice of at least one element of group V of the periodic table (e.g., P, As, Sb). The subfin may be a binary, ternary, or quaternary III-V compound semiconductor that is an alloy of two, three, or even four elements from groups III and V of the periodic table, including boron, aluminum, indium, gallium, nitrogen, arsenic, phosphorus, antimony, and bismuth.

For some example N-type transistor embodiments (i.e., for the embodiments where the FinFET 100 is an NMOS), the channel portion of the fin 104 may advantageously include a III-V material having a high electron mobility, such as, but not limited to InGaAs, InP, InSb, and InAs. For some such embodiments, the channel portion of the fin 104 may be a ternary III-V alloy, such as InGaAs, GaAsSb, InAsP, or InPSb. For some $In_xGa_{1-x}As$ fin embodiments, In content (x) may be between 0.6 and 0.9, and may advantageously be at least 0.7 (e.g., $In_{0.7}Ga_{0.3}As$). In some embodiments with highest mobility, the channel portion of the fin 104 may be an intrinsic III-V material, i.e., a III-V semiconductor material not intentionally doped with any electrically active impurity. In alternate embodiments, a nominal impurity dopant level may be present within the channel portion of the fin 104, for example to further fine-tune a threshold voltage Vt, or to provide HALO pocket implants, etc. Even for impurity-doped embodiments however, impurity dopant level within the channel portion of the fin 104 may be relatively low, for example below $10^{15}$ dopant atoms per cubic centimeter ($cm^{-3}$), and advantageously below $10^{13}$ $cm^{-3}$. The subfin portion of the fin 104 may be a III-V material having a band offset (e.g., conduction band offset for N-type devices) from the channel portion. Example materials include, but are not limited to, GaAs, GaSb, GaAsSb, GaP, InAlAs, GaAsSb, AlAs, AlP, AlSb, and AlGaAs. In some N-type transistor embodiments of the FinFET 100 where the channel portion of the fin 104 is InGaAs, the subfin may be GaAs, and at least a portion of the subfin may also be doped with impurities (e.g., P-type) to a greater impurity level than the channel portion. In an alternate heterojunction embodiment, the subfin and the channel portion of the fin 104 are each, or include, group IV semiconductors (e.g., Si, Ge, SiGe). The subfin of the fin 104 may be a first elemental semiconductor (e.g., Si or Ge) or a first SiGe alloy (e.g., having a wide bandgap).

For some example P-type transistor embodiments (i.e., for the embodiments where the FinFET 100 is a PMOS), the channel portion of the fin 104 may advantageously be a group IV material having a high hole mobility, such as, but not limited to Ge or a Ge-rich SiGe alloy. For some example embodiments, the channel portion of the fin 104 may have a Ge content between 0.6 and 0.9, and advantageously may be at least 0.7. In some embodiments with highest mobility, the channel portion may be intrinsic III-V (or IV for P-type devices) material and not intentionally doped with any electrically active impurity. In alternate embodiments, one or more a nominal impurity dopant level may be present within the channel portion of the fin 104, for example to further set a threshold voltage Vt, or to provide HALO pocket implants, etc. Even for impurity-doped embodiments however, impurity dopant level within the channel portion is relatively low, for example below $10^{15}$ cm$^{-3}$, and advantageously below $10^{13}$ cm$^{-3}$. The subfin of the fin 104 may be a group IV material having a band offset (e.g., valance band offset for P-type devices) from the channel portion. Example materials include, but are not limited to, Si or Si-rich SiGe. In some P-type transistor embodiments, the subfin of the fin 104 is Si and at least a portion of the subfin may also be doped with impurities (e.g., N-type) to a higher impurity level than the channel portion.

Turning to the first S/D region 114-1 and the second S/D region 114-2 on respective different sides of the gate stack 108, in some embodiments, the first S/D region 114-1 may be a source region and the second S/D region 114-2 may be a drain region. In other embodiments this designation of source and drain may be interchanged, i.e., the first S/D region 114-1 may be a drain region and the second S/D region 114-2 may be a source region. Although not specifically shown in FIG. 1, the FinFET 100 may further include S/D electrodes (also commonly referred to as "S/D contacts"), formed of one or more electrically conductive materials, for providing electrical connectivity to the S/D regions 114, respectively. In some embodiments, the S/D regions 114 of the FinFET 100 may be regions of doped semiconductors, e.g., regions of doped channel material of the fin 104, so as to supply charge carriers for the transistor channel. In some embodiments, the S/D regions 114 may be highly doped, e.g. with dopant concentrations of about $1 \cdot 10^{21}$ cm$^{-3}$, in order to advantageously form Ohmic contacts with the respective S/D electrodes, although these regions may also have lower dopant concentrations and may form Schottky contacts in some implementations. Irrespective of the exact doping levels, the S/D regions 114 of the FinFET 100 are the regions having dopant concentration higher than in other regions, e.g., higher than a dopant concentration in a region of the semiconductor channel material between the first S/D region 114-1 and the second S/D region 114-2, and, therefore, may be referred to as "highly doped" (HD) regions.

In some embodiments, the S/D regions 114 may generally be formed using either an implantation/diffusion process or an etching/deposition process. In the former process, dopants such as boron, aluminum, antimony, phosphorous, or arsenic may be ion-implanted into the one or more semiconductor materials of the upper portion of the fin 104 to form the S/D regions 114. An annealing process that activates the dopants and causes them to diffuse further into the fin 104 may follow the ion implantation process. In the latter process, the one or more semiconductor materials of the fin 104 may first be etched to form recesses at the locations for the future source and drain regions. An epitaxial deposition process may then be carried out to fill the recesses with material (which may include a combination of different materials) that is used to fabricate the S/D regions 114. In some implementations, the S/D regions 114 may be fabricated using a silicon alloy such as silicon germanium or silicon carbide. In some implementations, the epitaxially deposited silicon alloy may be doped in situ with dopants such as boron, arsenic, or phosphorous. In further embodiments, the S/D regions 114 may be formed using one or more alternate semiconductor materials such as germanium or a group III-V material or alloy. Although not specifically shown in the perspective illustration of FIG. 1, in further embodiments, one or more layers of metal and/or metal alloys may be used to form the source and drain contacts (i.e., electrical contacts to each of the S/D regions 114).

The FinFET 100 may have a gate length, GL, (i.e. a distance between the first S/D region 114-1 and the second S/D region 114-2), a dimension measured along the fin 104 in the direction of the x-axis of the example reference coordinate system x-y-z shown in FIG. 1, which may, in some embodiments, be between about 5 and 40 nanometers, including all values and ranges therein (e.g. between about 22 and 35 nanometers, or between about 15 and 25 nanometers). The fin 104 may have a thickness, a dimension measured in the direction of the y-axis of the reference coordinate system x-y-z shown in FIG. 1, that may, in some embodiments, be between about 4 and 15 nanometers, including all values and ranges therein (e.g. between about 5 and 10 nanometers, or between about 7 and 12 nanometers). The fin 104 may have a height, a dimension measured in the direction of the z-axis of the reference coordinate system x-y-z shown in FIG. 1, which may, in some embodiments, be between about 30 and 350 nanometers, including all values and ranges therein (e.g. between about 30 and 200 nanometers, between about 75 and 250 nanometers, or between about 150 and 300 nanometers).

Although the fin 104 illustrated in FIG. 1 is shown as having a rectangular cross-section in a z-y plane of the reference coordinate system shown in FIG. 1, the fin 104 may instead have a cross-section that is rounded or sloped at the "top" of the fin 104, and the gate stack 108 (including the different portions of the gate dielectric 110) may conform to this rounded or sloped fin 104. In use, the FinFET 100 may form conducting channels on three "sides" of the channel portion of the fin 104, potentially improving performance relative to single-gate transistors (which may form conducting channels on one "side" of a channel material or substrate) and double-gate transistors (which may form conducting channels on two "sides" of a channel material or substrate).

While FIG. 1 illustrates a single FinFET 100, in some embodiments, a plurality of FinFETs may be arranged next to one another (with some spacing in between) along the fin 104.

Example IC Structures with BPRs

Figure 2:
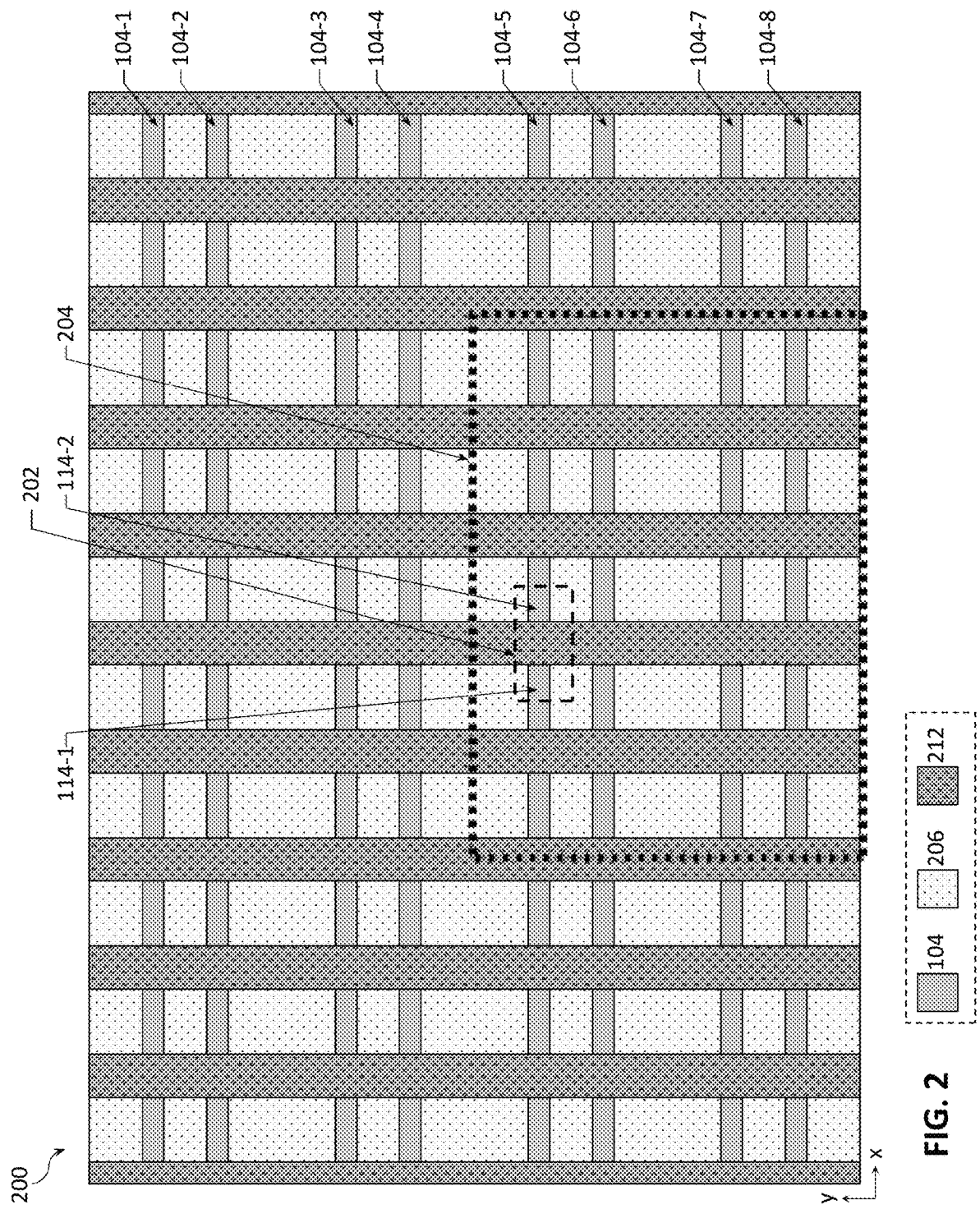
FIG. 2 is a top-down view of an example integrated circuit (IC) structure in which at least one buried power rail (BPR) with self-aligned vias to trench contacts according to various embodiments of the disclosure may be implemented.
Figure 3A:
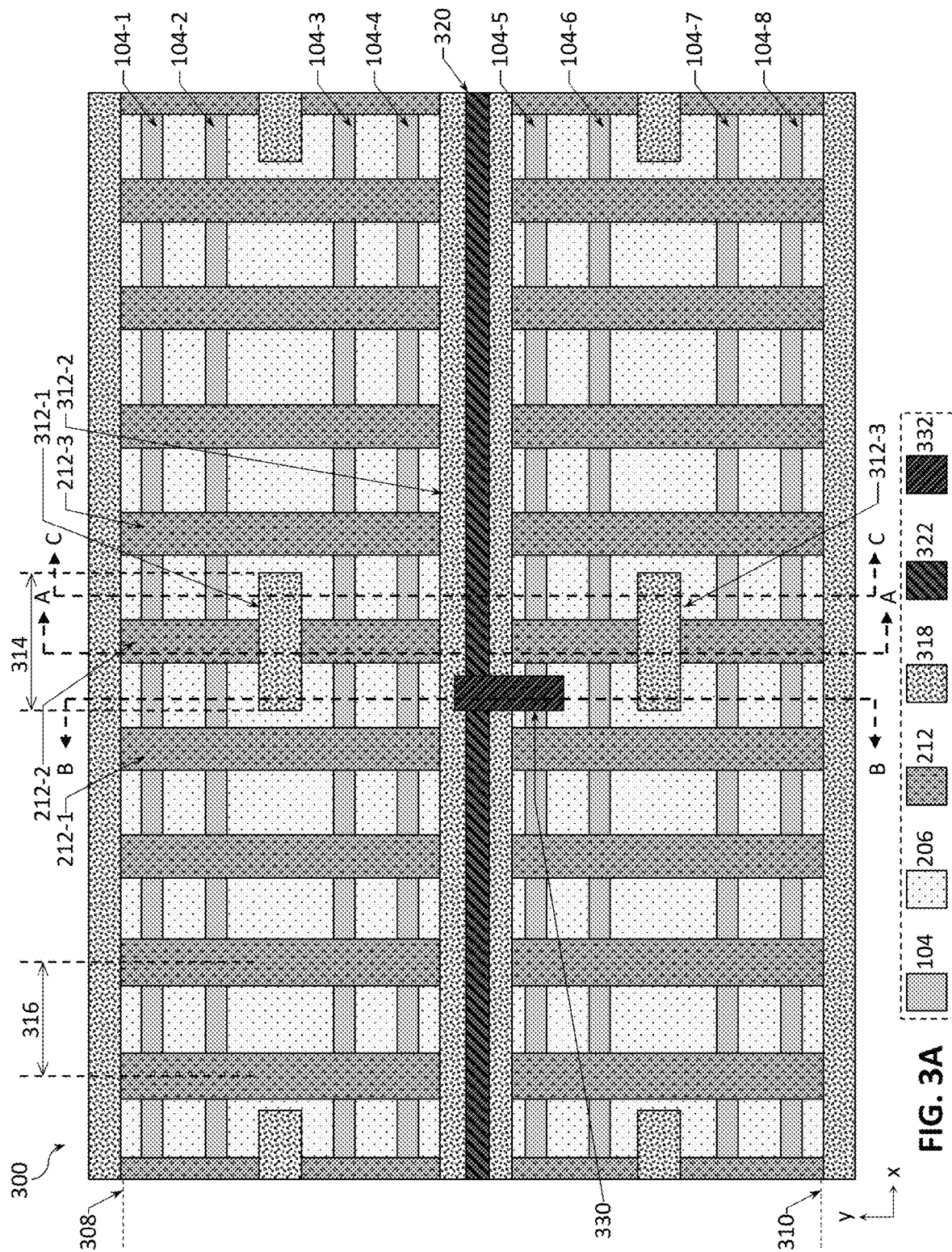
FIG. 3A is a top-down view of the IC structure of FIG. 2 with a BPR with a self-aligned via to a trench contact, according to some embodiments of the disclosure.

FIGS. 2 and 3A provide top-down views (i.e., the views of the x-y plane of the example reference coordinate system shown in FIG. 1) of an example IC structure that provides a transistor arrangement for which one or more BPRs with self-aligned vias to trench contacts according to various embodiments of the disclosure may be implemented. In particular, FIG. 2 illustrates an IC structure 200 without any metal gate cuts or BPRs, while FIG. 3A illustrates an IC structure 300 with at least one BPR and with optional metal gate cuts across some metal gate lines, according to some embodiments of the disclosure. The transistor arrangements shown in FIGS. 2 and 3 are intended to show relative arrangement(s) of some of the components therein and in various embodiments, the IC structures shown in FIGS. 2 and 3, or portions thereof, may include other components that are not illustrated (e.g., any further materials, such as spacer materials, STI, S/D regions or electrical contacts thereto, etc.). Same holds for subsequent drawings of the present disclosure.

A legend provided within a dashed box at the bottom of FIGS. 2 and 3A illustrates colors/patterns used to indicate some portions or materials of some of the elements shown in FIGS. 2 and 3A, so that these drawings are not cluttered by too many reference numerals (the same holds for subsequent drawings of the present disclosure that include a legend at the bottom of the drawings). For example, FIGS. 2 and 3A use different colors/patterns to identify the fins 104, dielectric spacers 206, and metal gate lines 212.

The IC structures shown in FIGS. 2 and 3A, and in some of the subsequent drawings, are examples of how a plurality of the FinFETs 100 may be arranged in an IC device. Therefore, the IC structures shown in FIGS. 2-3 and in some of the subsequent drawings illustrate some elements labeled with the same reference numerals as those used in FIG. 1 to indicate similar or analogous elements in these drawings, so that, in the interests of brevity, descriptions of a given element provided with reference to one drawing does not have to be repeated again for other drawings. For example, FIGS. 2 and 3A illustrate the fin 104 (in particular, a plurality of such fins), and example S/D regions 114 for one example FinFET of the IC structures of FIGS. 2 and 3A. The same holds for subsequent drawings of the present disclosure—elements with reference numerals used in one drawing and shown again in another drawing refer to similar or analogous elements so that their descriptions do not have to be repeated for each drawing.

As shown in FIG. 2, the IC structure 200 may include a plurality of fins 104, which, in some embodiments, may extend substantially parallel to one another. Different instances of the fins 104 are shown in FIG. 2 with a dash and a different reference numeral after the reference numeral for the fin, 104 (the same notation is used for other elements in other drawings). The IC structure 200 illustrates an example of 8 fins 104, labeled as fins 104-1 through 104-8, but, in other embodiments, any other number of two or more fins 104 may be implemented in the IC structure 200.

Once the fins 104 are fabricated, metal gate lines 212 may be provided over the fins 104, crossing multiple fins 104. In some embodiments, the metal gate lines 212 may extend substantially perpendicular to the length of the fins 104. For example, if the fins 104 extend in the direction of the x-axis of the example coordinate system used in the present drawings (as shown in FIG. 1), then the metal gate lines 212 may extend in the direction of the y-axis, as is shown in FIG. 2. In some embodiments, the metal gate lines 212 may be shaped as ridges, substantially perpendicular to the length of the fins 104 and enclosing different portions of the fins 104. At least portions of the metal gate lines 212 provided over the fins 104, i.e., where gates of FinFETs may be formed, as described with reference to FIG. 1, may include the gate electrode material 112, thus forming gate stacks 108, described above. In some embodiments, all of the metal gate lines 212 (i.e., also between the fins 104) are formed of one or more of the gate electrode material 112. In some embodiments, the gate electrode material 112 used in one portion of a given metal gate line 212 may have a material composition that is different from the material composition of the gate electrode material 112 used in another portion of that particular metal gate line 212. For example, the material composition of a portion of a given metal gate line 212 crossing the fins 104 in which NMOS transistors are to be formed may be different from the material composition of a portion of that metal gate line 212 crossing the fins 104 in which PMOS transistors are to be formed. For example, the fins 104-1 and 104-2 may be fins in which NMOS transistors can be formed, while the fins 104-3 and 104-4 may be fins in which PMOS transistors can be formed.

A dashed contour shown in FIG. 2 illustrates an example of a FinFET 202 formed in one of the fins 104, namely, in the fin 104-5. The FinFET 202 may be an example of the FinFET 100, described above. FIG. 2 illustrates the S/D regions 114 for the FinFET 202, and a portion of the metal gate line 212 crossing the fin 104-5 forms the gate stack 108 of the FinFET 202. A plurality of other such FinFETs are also shown in FIG. 2, although they are not specifically labeled with reference numerals in order to not clutter the drawings.

In some embodiments, a plurality of FinFETs 202 may be arranged to form a cell with a particular logic function, e.g., a cell 204, shown in FIG. 2 to be within a dotted contour. The cell 204 illustrates an example IC cell (i.e., a unit of an IC device) that may implement a certain functionality, which cell may then be provided multiple times in an array form. Of course, in other embodiments of the IC structure 200, the cells may be different from the cell 204 and/or the FinFETs 202 may be arranged in ways that do not include repeating cell units.

FIG. 2 further illustrates that portions of the IC structure 200 surrounding the upper portions of the fins 104 may be enclosed by a dielectric material 206, which may include one or more of the dielectric spacer materials, described above. Although the top-down view of FIG. 2 illustrates the tops of the fins 104 in the portions where the metal gate lines 212 are not crossing the fins, in some embodiments, the dielectric material 206 may cover the tops of the fins 104 in those portions (in which case the fins 104 would not be visible in the top-down view of the IC structure 200).

As described above, a given design may require that some of the metal gate lines 212 are cut to accommodate a BPR. In some further embodiments, a given design may require that some of the metal gate lines 212 are cut to disrupt the electrical continuity between different portions of the IC structure 200 and decouple the gates of different FinFETs 202. FIG. 3A is a top-down view of an IC structure 300 which is the IC structure of FIG. 2 with a BPR 320 provided across some of the metal gate lines 212 of the IC structure 200. FIG. 3A further illustrates metal gate cuts 312 provided in some of the metal gate lines 212 of the IC structure 200, according to some embodiments of the disclosure. Although a certain number of the BPRs 320 and the metal gate cuts 312 is shown in the IC structure 300, this is only for the purpose of illustrating various features of different BPRs and metal gate cuts according to embodiments of the present disclosure, and in other embodiments of the IC structure 300, any other number of the BPRs 320 and the metal gate cuts 312, implemented in other locations than those shown in FIG. 3A, may be implemented.

In various embodiments, some of the metal gate cuts 312 may cross only a single metal gate line 212, as is shown in FIG. 3A with the metal gate cuts 312-1 and 312-3 (some other examples of such metal gate cuts are also shown in FIG. 3A but not specifically labeled in order to not clutter the drawing), while other metal gate cuts 312 may cross multiple metal gate lines 212, as is shown in FIG. 3A with the metal gate cut 312-2 (some other examples of such a metal gate cut are also shown in FIG. 3A but not specifically labeled in order to not clutter the drawing). In some embodiments, the metal gate cuts 312 provided across only a single metal gate line 212 may extend to about the mid-point between that metal gate line 212 and the next adjacent metal gate line 212, which may be in both directions of the length of the metal gate cut 312 (the length of a metal gate cut being a dimension measured along the x-axis of the example coordinate system used in the present drawings). This is illustrated in FIG. 3A for the metal gate cut 312-1, provided in the metal gate line 212-2, between the metal gate line 212-1 and the metal gate line 212-3. As shown in FIG. 3A, the length 314 of the metal gate cut 312-1 maybe greater than the width of the metal gate line 212-2 that it cuts (the width of a metal gate line being a dimension measured along the x-axis of the example coordinate system used in the present drawings). In other words, the edge of the metal gate cut 312 in the plane that is perpendicular to the longitudinal axis of the fins 104 (the longitudinal axis of the fins 104 being lines parallel the x-axis of the example coordinate system used in the present drawings) may extend beyond the sidewall of the metal gate line 212 that it cuts by about 30% (e.g., at least about 40% or at least about 50%) of the distance between that metal gate line 212 and the closest next adjacent metal gate line 212 that is not cut. Thus, in some embodiments, the length 314 may be substantially equal to the gate-to-gate pitch (e.g., measured as the distance between the centers of two closest adjacent metal gate lines 212, shown in FIG. 3A as a distance 316).

In various embodiments, the metal gate cuts 312 may be, substantially, openings formed in the gate electrode material 112 of the metal gate lines 212, which openings may subsequently be filled with one or more dielectric materials 318 (referred to in the following as a "metal gate cut dielectric 318"). The metal gate cut dielectric 318 may, in general, include any of the dielectric materials described above, e.g., any of the dielectric spacer materials described above. However, it is likely that the exact material composition of the metal gate cut dielectric 318 filling the openings of the metal gate cuts 312 may be different from the material composition of the one or more dielectric materials of the dielectric spacer 206. In this case, the metal gate cuts 312 may be clearly distinguishable in images of various characterization equipment, such as in cross-sectional or planar TEM, or with cross-sectional SEM.

If a BPR for providing signals and power to various portions of the IC structure 300 is to be formed on the basis of a given metal gate cut 312, the opening for the metal gate cut 312 may be at least partially filled with one or more electrically conductive materials. In this manner, BPRs may be formed substantially in the same process as that used to form the metal gate cuts 312 (or an extension of that process). For example, FIG. 3A illustrates that the BPR 320 may be formed on the basis of the metal gate cut 312-2, by lining at least portions of the sidewalls of the metal gate cut 312-2 with the metal gate cut dielectric 318 and then at least partially filling the lines opening with one or more electrically conductive materials 322 (referred to in the following as a "BPR metal 322"). In some embodiments, various electrically conductive materials 322 may include one or more metals or metal alloys with metals such as copper, ruthenium, palladium, platinum, cobalt, nickel, hafnium, zirconium, titanium, tantalum, molybdenum, and aluminum. In some embodiments, the electrically conductive materials 322 may include one or more electrically conductive alloys, oxides (e.g., conductive metal oxides), carbides (e.g., hafnium carbide, zirconium carbide, titanium carbide, tantalum carbide, and aluminum carbide), or nitrides (e.g. hafnium nitride, zirconium nitride, titanium nitride, tantalum nitride, and aluminum nitride) of one or more metals. FIG. 3A further illustrates a trench contact 330, formed of a trench contact metal 332, which may include any of the electrically conductive materials described above, and which may, but does not have to, have the same material composition as the BPR metal 322. As is shown in FIG. 3A, each of the fins 104 may have a long axis substantially parallel to the support structure over which they are provided (e.g., the base 102) and different fins 104 may extend substantially parallel to one another. The BPR 320 may also have a long axis substantially parallel to those of the fins 104, and be provided between two adjacent fins 104. In some embodiments, the BPR 320 may extend, in a direction parallel to a longitudinal axis of the fins 104, across multiple gate pitches. An example of that is shown in FIG. 3A with the metal gate cut 312-2, in which the BPR 320 is provided, extending across the entire IC structure 300, although in other embodiments, the metal gate cut 312-2 in which the BPR 320 is formed may be shorter in length than what is shown in FIG. 3A.

Figure 3B:
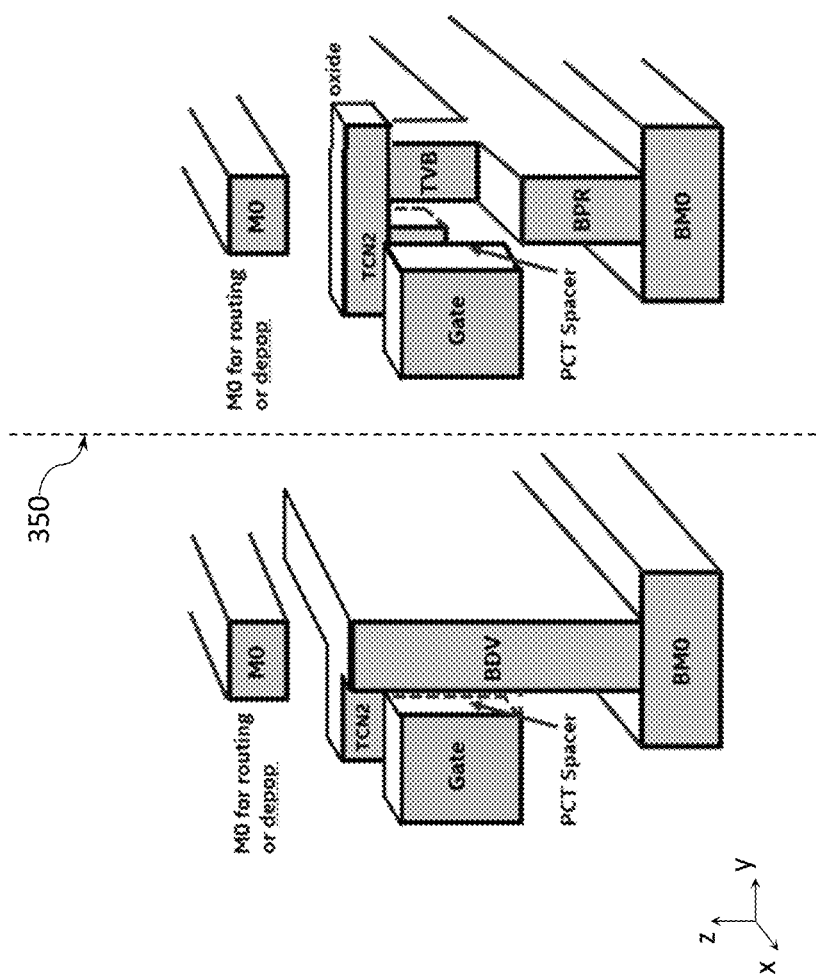
FIG. 3B provides perspective views of a power rail that is not buried and a BPR with a self-aligned via to a trench contact, according to some embodiments of the disclosure.

As briefly described above, in order to form the BPR 320, the BPR metal 322 may be recessed within portions of the opening for the metal gate cut 312-2 facing gate stacks of various transistors. FIG. 3B provides perspective views of a power rail that is not buried (shown in FIG. 3B to the left of a dashed line 350) and a BPR with a self-aligned via to a trench contact (shown in FIG. 3B to the right of a dashed line 350), according to some embodiments of the disclosure. The power rail that is not buried is labeled in FIG. 3B as "BDV." As can be seen in FIG. 3B, the BDV faces the gate stack (labeled as "Gate"), with a small separation filled with a dielectric material (labeled as "PCT spacer"), thus effectively forming a capacitor that may add to the parasitic capacitance of the device. On the other hand, the BPR shown on the right side of FIG. 3B is recessed in an area where the BDV faces the gate stack, thus reducing or eliminating the problem of parasitic capacitance associated with the BDV. The BPR shown on the right side of FIG. 3B may be the BPR 320, described herein. FIG. 3B further illustrates a via (labeled as "TVB") that is self-aligned to a trench contact (labeled as "TCN2") and provides electrical coupling between the trench contact TCN2 and the BPR.

Figure 4A:
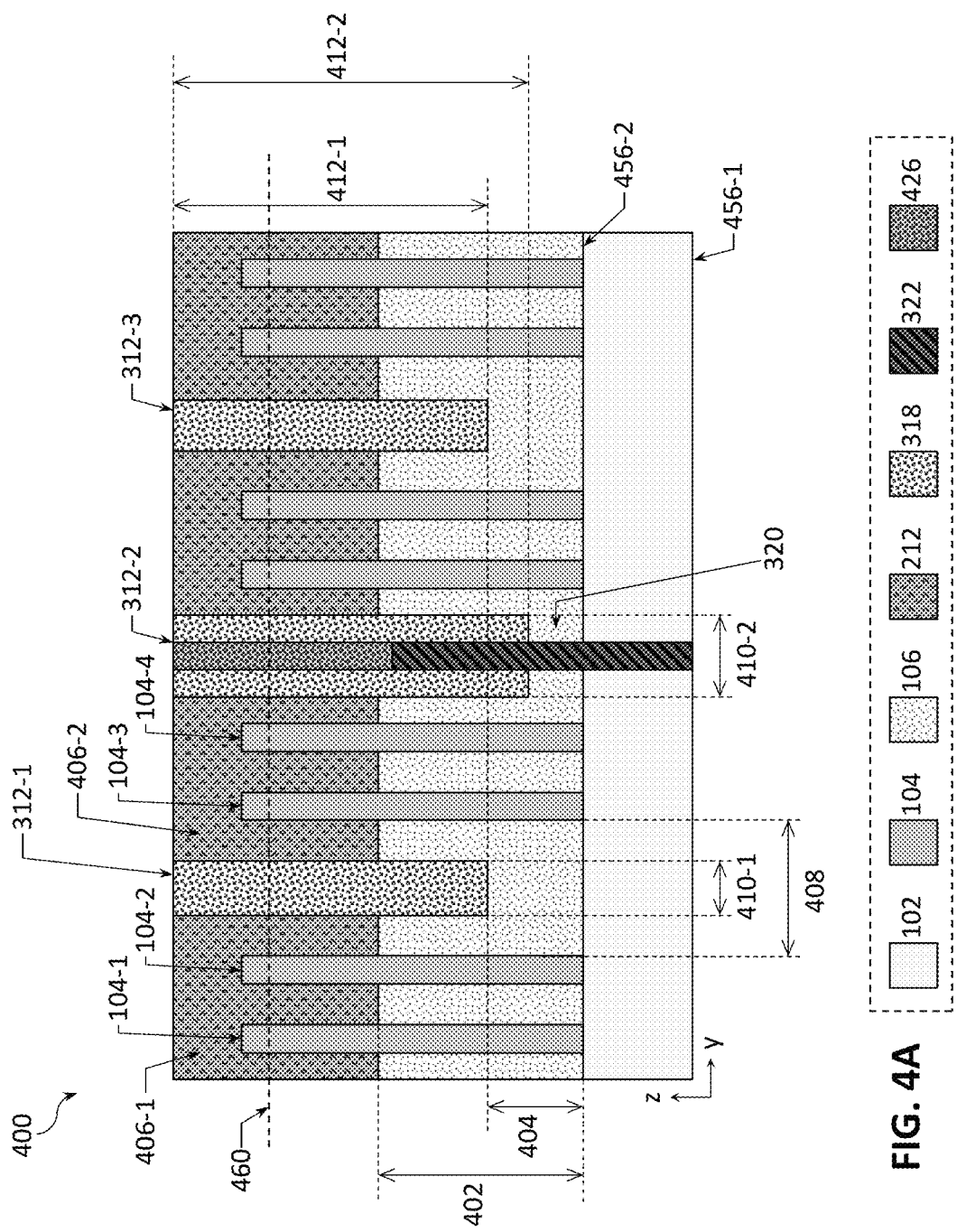
FIG. 4A provides a cross-sectional side view of the IC structure of FIG. 3A with a cross-section taken along an example metal gate line, according to one embodiment of the disclosure.
Figure 4B:
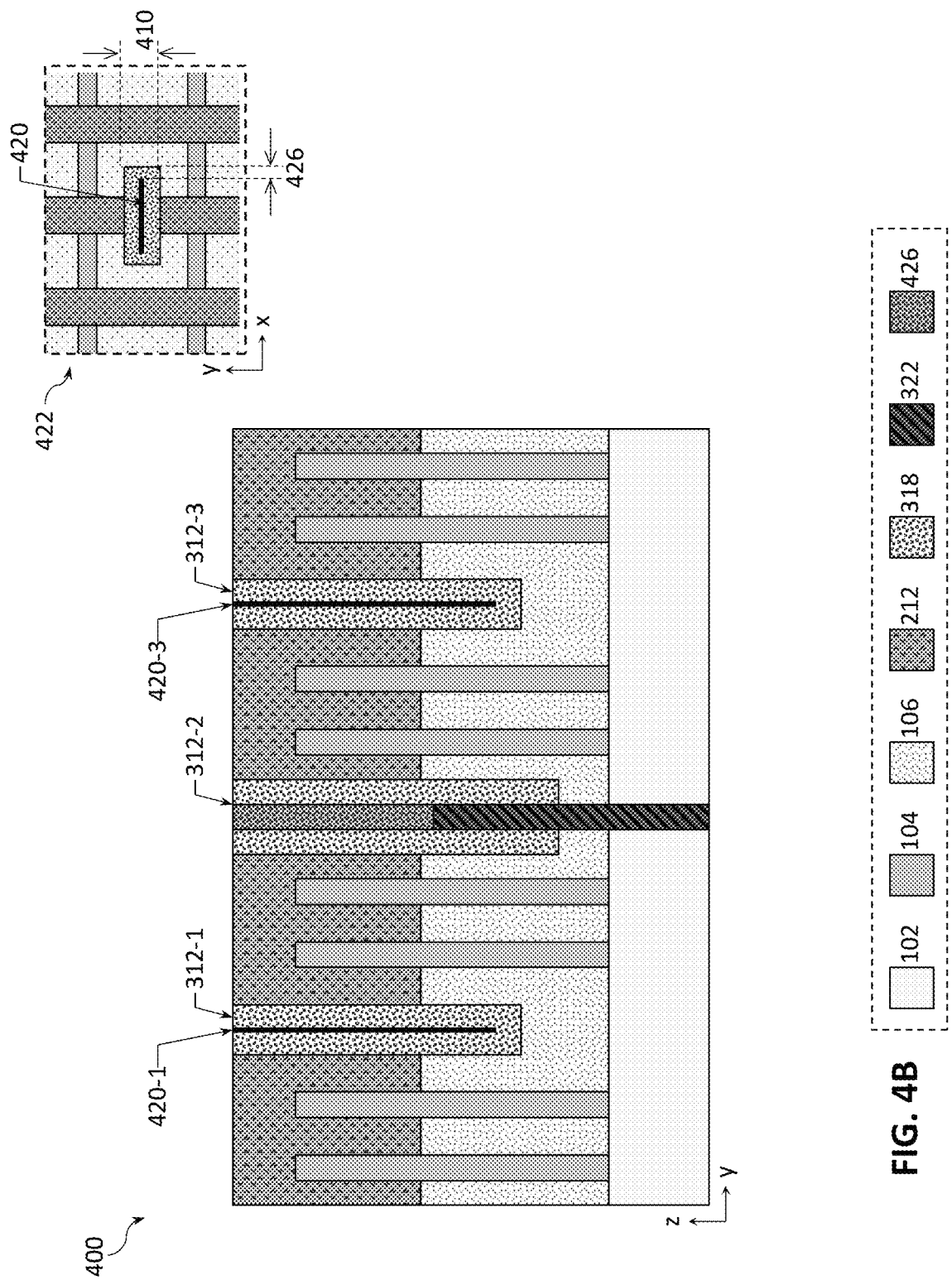
FIG. 4B provides a cross-sectional side view of the IC structure of FIG. 3A with a cross-section taken along an example metal gate line, according to another embodiment of the disclosure.
Figure 4C:
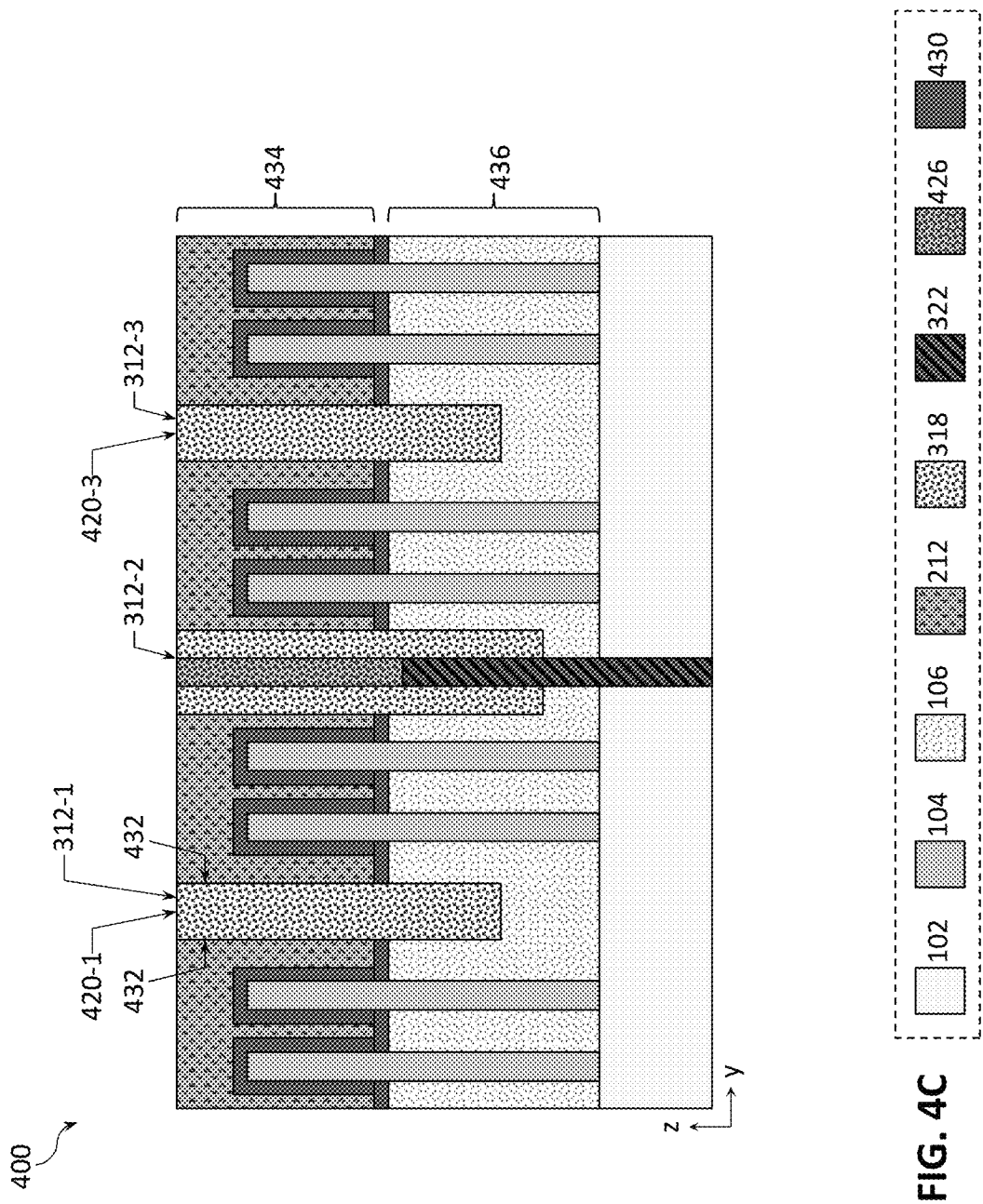
FIG. 4C provides a cross-sectional side view of the IC structure of FIG. 3A with a cross-section taken along an example metal gate line, according to yet another embodiment of the disclosure.
Figure 5A:
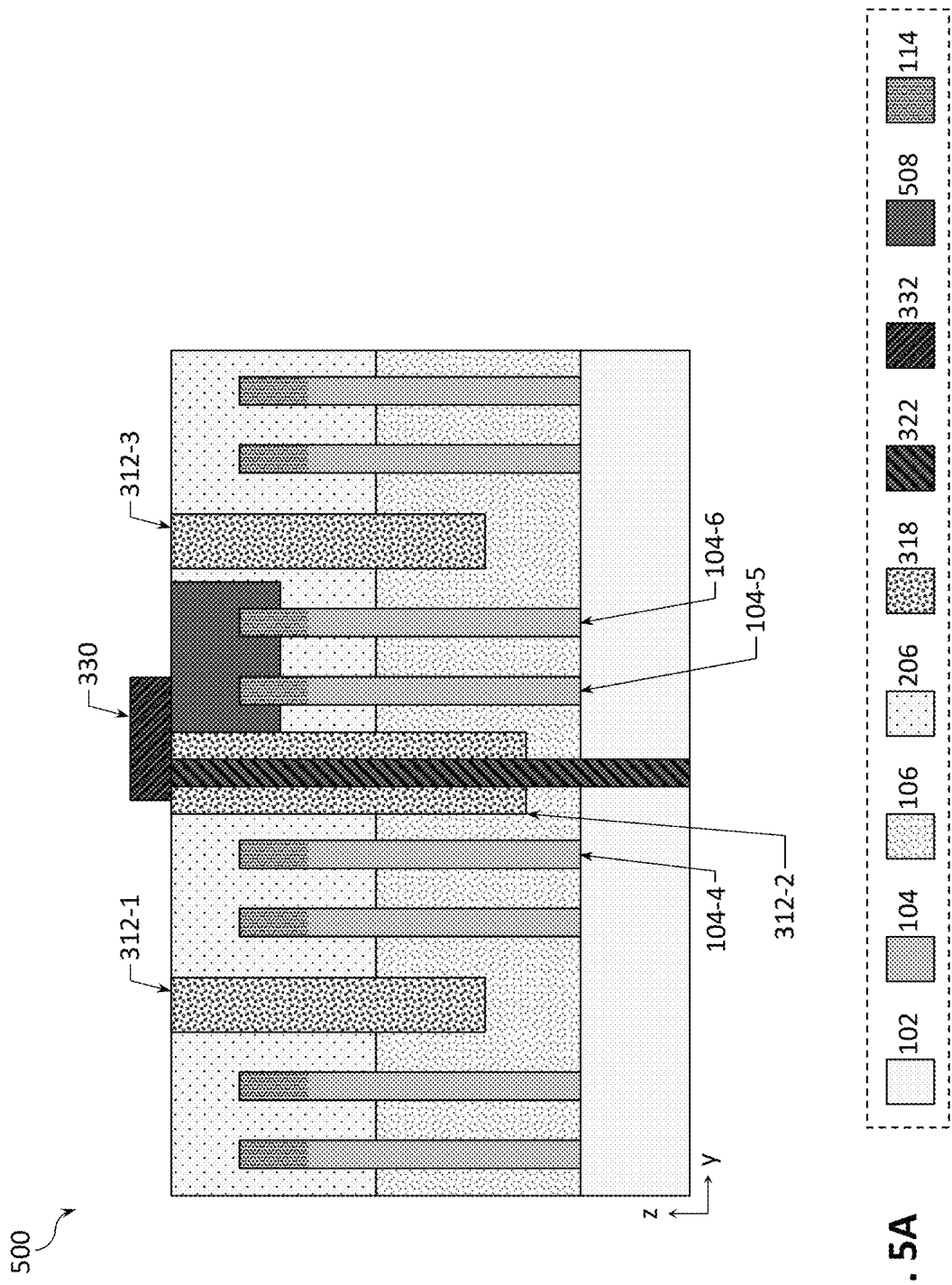
FIG. 5A provides a cross-sectional side view of the IC structure of FIG. 3A with a cross-section taken along a source or drain (S/D) contact to which a trench contact is coupled, according to one embodiment of the disclosure.
Figure 5C:
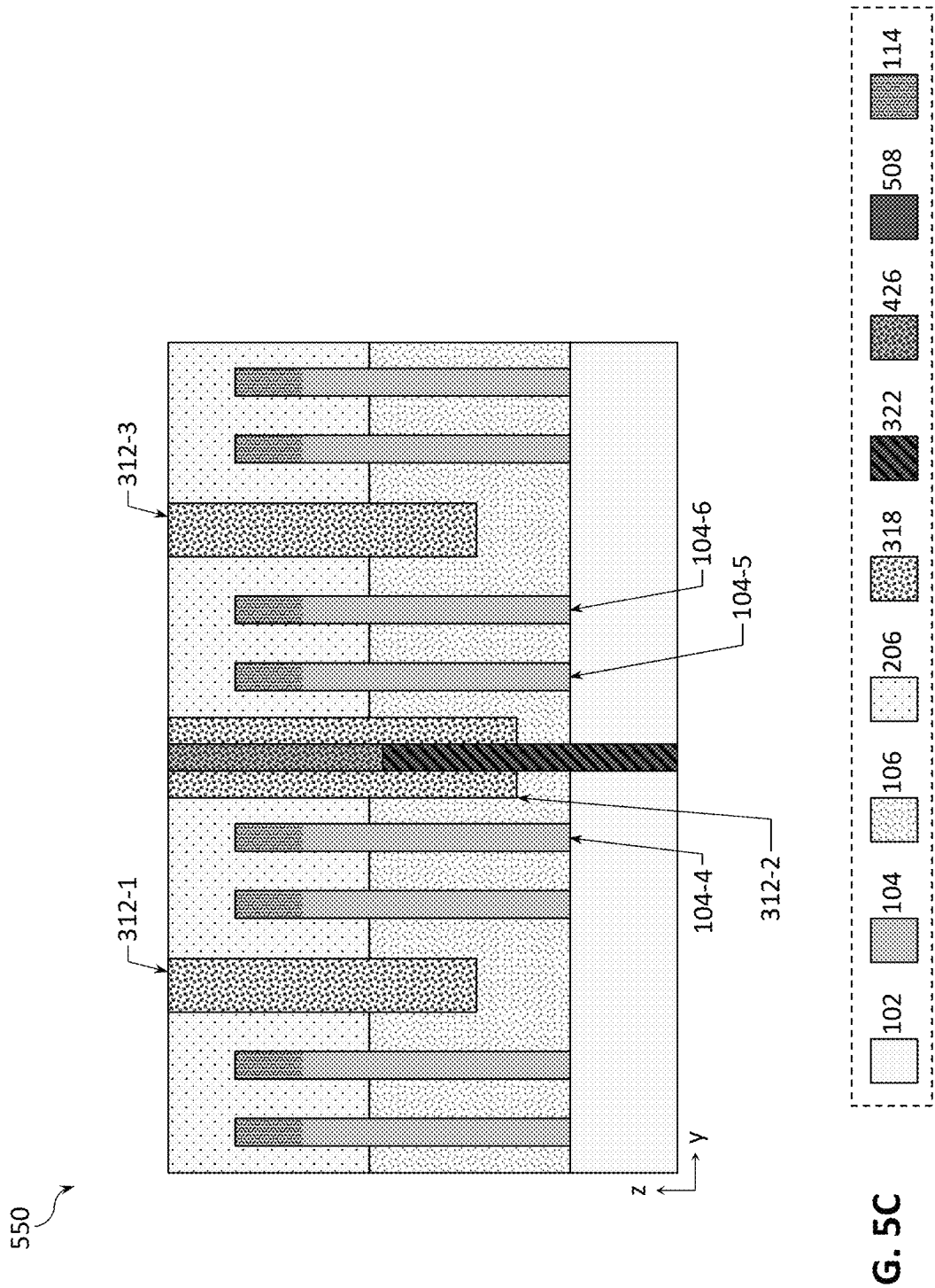
FIG. 5C provides a cross-sectional side view of the IC structure of FIG. 3A with a cross-section taken along a S/D contact to which a trench contact is not coupled, according to one embodiment of the disclosure.

In order to further illustrate the details of the example BPR 320 and various metal gate cuts 312 of the IC structure 300, cross-sectional side views along planes A-A and B-B (indicated in FIG. 3A) are shown in FIGS. 4A-4C and FIGS. 5A-5B, respectively. Furthermore, a cross-sectional side views along a plane C-C (also indicated in FIG. 3A) is shown FIG. 5C. Thus, FIGS. 4A-4C provide cross-sectional side views along one of the metal gate lines 212 (i.e., along the plane A-A) for different embodiments of the IC structure 300, FIGS. 5A-5B provide cross-sectional side views along the first S/D regions 114-1 (i.e., along the plane B-B) of transistors 202 for different embodiments of the IC structure 300, and FIG. 5C provides a cross-sectional side view along the second S/D regions 114-2 (i.e., along the plane C-C) of transistors 202 of the IC structure 300. FIGS. 4A-4C and FIGS. 5A-5C provide the views of the y-z plane of the example reference coordinate system shown in FIG. 1, where each of the portions of the IC structure 300 shown in FIGS. 4A-4C and FIGS. 5A-5C are portions between lines 308 and 310, illustrated in FIG. 3A.

In some embodiments, because of the non-selective nature of the etch used to form the metal gate cuts 312, described in greater detail below, the metal gate cuts 312 may, characteristically, not be aligned with the bottom of the metal gate lines 212. This is shown in a cross-sectional side view 400 of FIG. 4A with the bottom of the metal gate line 212 being farther away from the base 102 than the bottoms of all of the metal gate cuts 312 shown in FIG. 4A. For example, in some embodiments, a distance 402 from the base 102 to the metal gate line 212 may be at least about 3 nanometers larger, e.g., at least about 5 nanometers larger or at least about 10 nanometers larger, than a distance 404 from the base 102 to the bottom of the metal gate cut 312-1. In other words, the opening of the metal gate cut 312-1 may extend further towards the base 102 than the gate electrode material 112 of the metal gate line 212, e.g., at least about 5 nanometers further. In other words, the metal gate cuts 312 may extend through the gate electrode material 112 of the metal gate line 212 and into the STI 106, as is shown in FIG. 4A.

FIG. 4A also illustrates how the metal gate cuts 312 provide discontinuity in the gate electrode materials 112 over different fins 104. For example, the metal gate cut 312-1 is an opening in the gate electrode material 112 of the metal gate line 212, the opening separating the gate electrode material 112 into a first portion, shown in FIG. 4A as a portion 406-1, that wraps around the fin 104-2, and a second portion, shown in FIG. 4A as a portion 406-2, that wraps around the fin 104-3. When the metal gate cut 312-1 is at least partially filled with one or more dielectric materials, such an opening disrupts electrical continuity between the portion 406-1 and the portion 406-2 of the gate electrode material 112, thus decoupling the gates of the respective FinFETs formed in the fin 104-2 and the fin 104-3.

In some embodiments, the distance between the fins 104, e.g., a distance 408 between the fin 104-2 and the fin 104-3, shown in FIG. 4A, may be between about 10 and 200 nanometers, including all values and ranges therein, e.g., between about 20 and 75 nanometers, or between about 30 and 50 nanometers, e.g., around about 38 nanometers. In some embodiments, the width of the metal gate cuts 312 (a dimension measured along the y-axis of the example coordinate system used in the present drawings) may be based on the distance between the fins 104 because the metal gate cuts 312 are to be provided between the fins 104. In some embodiments, the aspect ratio of the metal gate cuts 312, i.e., a ratio of the depth of an opening formed to create the metal gate cut 312 (a dimension measured along the z-axis of the example coordinate system used in the present drawings) to the width of the opening, may also depend on the distance between the fins 104. In some embodiments, the aspect ratio of the metal gate cuts 312 may be between about 2 and 30, including all values and ranges therein, e.g., between about 2 and 20, or between about 5 and 15, e.g., around about 10.

In some embodiments, the aspect ratio of the metal gate cut 312 which will be used to form the BPR 320, e.g., of the metal gate cut 312-2, may be between about 2 and 15, including all values and ranges therein, e.g., between about 2 and 10, or between about 3 and 8. In some embodiments, the aspect ratio of the metal gate cut 312-2 may be equal or smaller than the aspect ratio of the metal gate cut 312-1. However, in other embodiments, this does not have to be the case and the aspect ratio of the metal gate cut 312-2 may be greater than the aspect ratio of the metal gate cut 312-1. Typically, the opening for the metal gate cut to form the BPR 320 will extend further towards the base 102 than the opening for other metal gate cuts 312, e.g., than the opening for the metal gate cut 312-1, e.g., at least about 5 nanometers further, including all values and ranges therein, e.g., at least about 10 nanometers further or at least about 20 nanometers further.

In some embodiments, the metal gate cuts 312 that extend over multiple metal gate lines 212 and in which the BPRs 320 are to be formed may be wider and deeper than the metal gate cuts 312 that extend over smaller number of metal gate lines, e.g., over only one metal gate line. This is shown in FIG. 4A with the metal gate cut 312-2 being both wider (where, again, the width is measured along the y-axis of the example coordinate system used in the present drawings) and deeper (where, again, the depth is measured along the z-axis of the example coordinate system used in the present drawings) than the metal gate cuts 312-1 and 312-3. For example, as shown in FIG. 4A, in some embodiments, a width 410-1 of the metal gate cut 312-1 may be smaller than a width 410-2 of the metal gate cut 312-2, e.g., at least 5% smaller, including all values and ranges therein, e.g., at least 10% smaller or at least 30% smaller. Furthermore, as also shown in FIG. 4A, in some embodiments, a depth 412-1 of the metal gate cut 312-1 may be smaller than a depth 412-2 of the metal gate cut 312-2, e.g., at least 5% smaller, including all values and ranges therein, e.g., at least 10% smaller or at least 30% smaller. In some implementations, the fact that, in a given transistor arrangement, the metal gate cuts 312 that are wider than other metal gate cuts 312 are also deeper may be characteristic of the fabrication method used to form the openings for these metal gate cuts in accordance with embodiments of the present disclosure, described below. For example, this may be indicative of the ion bombardment used to form the openings—if an opening is wider (as, e.g., defined by a mask used to create the opening), then more ions may get in, resulting in a deeper etch, compared to openings of smaller dimensions.

Turning to the BPR 320, FIG. 4A illustrates that it may be formed in the metal gate cut 312-2 by providing the BPR metal 322 within an opening for the metal gate cut 312-2 that has been lined with the metal gate cut dielectric 318 and then recessing the BPR metal 322 within the opening. The upper portion of the opening (i.e., where the BPR metal 322 has been recessed) may then be filled with a refill dielectric 426, which may include any of the dielectric materials described above. In some embodiments, the refill dielectric 426 may have a different material composition than the STI 106 or the dielectric spacer 206, e.g., the refill dielectric 426 may be silicon oxide, while the STI 106 and/or the dielectric spacer 206 may be low-k dielectrics. The base 102, or, more generally, any support structure 102, may include a first face 456-1 and an opposing second face 456-2. The fins 104 may be provided over the second face 456-2. In general, the BPR metal 322 of the BPR 320 may be recessed so that the top of the BPR 320 (e.g., an interface between the refill dielectric 426 and the BPR metal 322, shown in FIG. 4A) is closer to the first face 456-1 than the top of the gate stack of the metal gate line 212. In some embodiments, the top of the BPR 320 may be closer to the first face 456-1 than the top of the gate stack of the metal gate line 212 by at least half of a dimension of the gate stack in the cross-section shown in FIG. 4A, i.e., the top of the BPR 320 may be below a dashed line 460 illustrated in FIG. 4A. However, to achieve greater improvement with respect to reducing the parasitic capacitance between the BPR 320 and the gate stacks nearby, the top of the BPR 320 may be recessed to be below the metal gate line 212, as is illustrated in FIG. 4A. The top of the BPR 320 is shown in FIG. 4A to be slightly below the bottom of the metal gate line 212 (or, phrased differently, below the top of the subfin portion of the fins 104) to illustrate that, in general, the top of the BPR 320 is not in any way self-aligned with respect to the bottom of the metal gate line 212. In other embodiments, the top of the BPR 320 may be slightly above the bottom of the metal gate line 212, or, in some embodiments, the top of the BPR 320 may happen to be aligned with the bottom of the metal gate line 212, depending on the etch process used to recess the BPR metal 322 to form the BPR 320.

FIG. 4A further illustrates that, in some embodiments, the BPR metal 322 may extend further towards the base 102 beyond the bottom of the opening 312-2 that was filled with the metal gate cut dielectric 318. This may be characteristic of the fabrication method used to form the BPR 320 that extends all the way through the IC structure 300 to enable backside contact formation in some embodiments, described below. In such embodiments, the BPR 320 may extend between the first face 456-1 and the second face 456-2 of the base 102.

The openings for the metal gate cuts which are relatively narrow and have a relatively high aspect ratio may be difficult to fill uniformly with the dielectric materials. Therefore, in some embodiments, at least some of the metal gate cuts 312 may exhibit a characteristic seam substantially in the middle of the opening used to form the metal gate cut. Example seams in the cross-sectional side view 400 are shown in FIG. 4B as seams 420-1 and 420-3 for the metal gate cuts 312-1 and 312-3, respectively. An inset 422 provided in FIG. 4B shows the seam 420 (which may, e.g., be the seam 420-1 or the seam 420-3) in a portion of the top-down view of the IC structure 300. As can be seen from the inset 422 of FIG. 4B, in some embodiments, the seams 420 may extend in planes substantially parallel to the longitudinal axis of the fins 104. Furthermore, as can also be seen from the inset 422 of FIG. 4B, in some embodiments, the seam 420 may be located about at the midway point of the width of the metal gate cut 312 (e.g., of the width 410-1, described above). In some embodiments, the distance from the end of the metal gate cut 312 to the edge of the seam 420, shown in the inset 422 as a distance 426, at two edges of the seam 420, may be approximately the same midway distance (e.g., the distance 426 may be close to half of the width 410). This may be characteristic of using atomic layer deposition (ALD) deposition to fill the opening for the metal gate cut 312 with the metal gate cut dielectric 318.

Figure 4D:
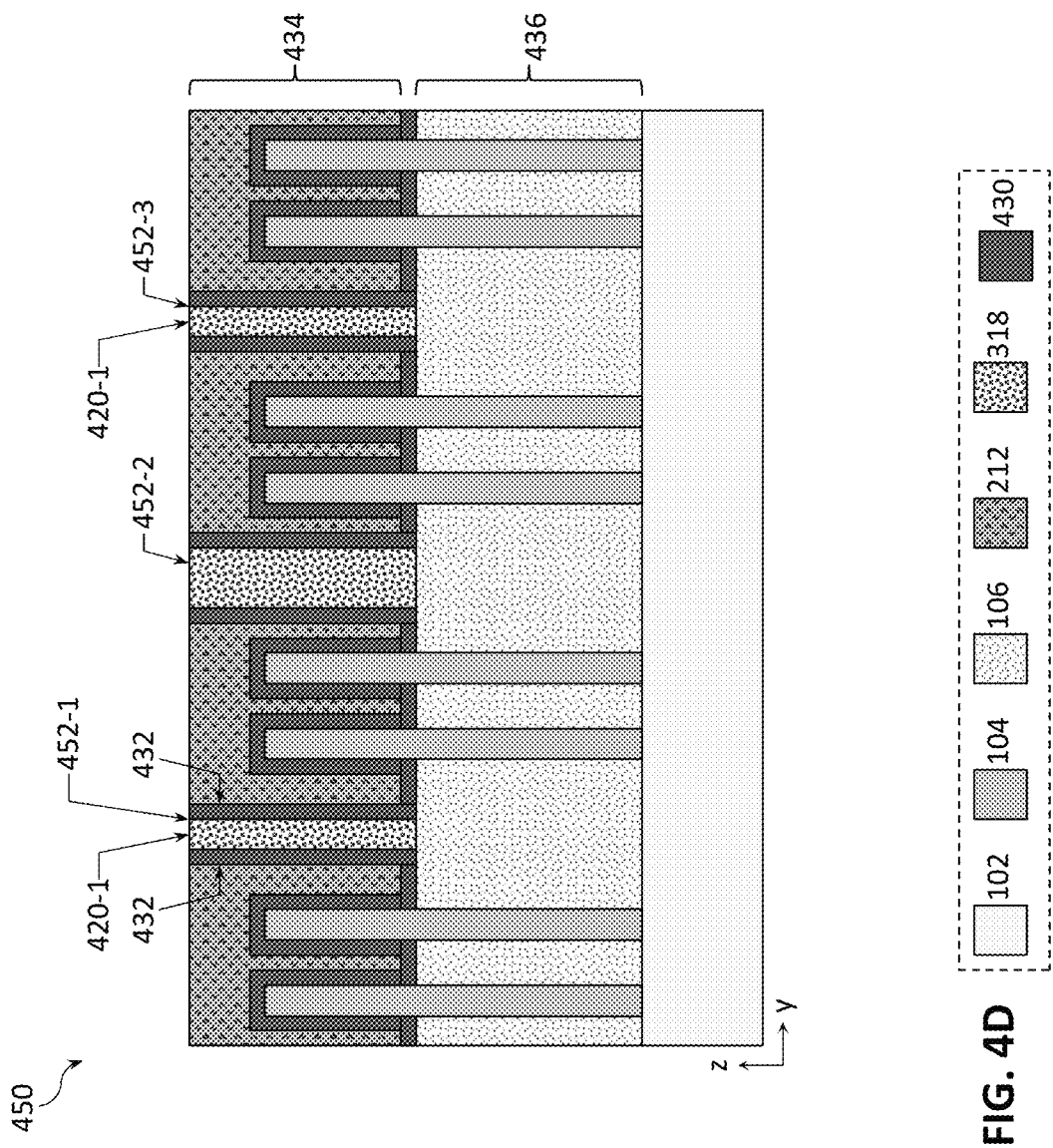
FIG. 4D provides a cross-sectional side view of a transistor arrangement with a polygate cut.

Other characteristic features of the metal gate cuts 312 filled with the metal gate cut dielectric 318 may be illustrated with reference to FIG. 4C and FIG. 4D. FIG. 4C provides an illustration of a metal gate cut in a cross-sectional side view of the transistor arrangement of FIG. 3A with a cross-section taken along an example metal gate line, according to some embodiments of the disclosure. FIG. 4D provides an illustration of a conventional polygate cut in a cross-sectional side view of a transistor arrangement analogous to that shown in FIG. 3A with a cross-section taken along an example metal gate line. Similar to FIGS. 4A and 4B, FIG. 4C illustrates the cross-sectional side view 400 of the IC structure 300 of FIG. 3A with a cross-section taken along one of the metal gate lines 212, along the plane A-A shown in FIG. 3A. In particular, FIG. 4C specifically illustrates a material 430 which may include the gate dielectric 110 as described above, and may further, optionally, include one or more capping metals, such as titanium nitride or tantalum nitride, which may be present in the cross-sectional side view 400. Although not specifically shown in FIG. 4B, the gate dielectric material 430 may also be present there, in the same locations as shown in FIG. 4C. FIG. 4C illustrates that, in some embodiments, the metal gate cut dielectric 318 in the metal gate cuts 312 may be in contact with (or abut) the gate electrode material 112 of the metal gate line 212, for the portions of the metal gate cuts which are in the metal gate lines 212, and, for the portions of the metal gate cuts which extend into the STI 106, be in contact with (or abut) the STI 106. Sidewalls labeled as 432 for one example metal gate cut shown in FIG. 4C, namely, the metal gate cut 312-1 (but applicable to all metal gate cuts 312), illustrate how the metal gate cut dielectric 318 at least partially filling the metal gate cut 312-1, e.g., by at least lining the sidewalls 432, may be in contact with the gate electrode material 112 (e.g., any of the workfunction materials described above) of the metal gate line 212 in a portion 434 (i.e., a portion above the STI 106). Simultaneously, because the metal gate cuts 312 extend into the STI 106, the metal gate cut dielectric 318 at least partially filling the metal gate cut 312-1 may be in contact with the STI 106 in a portion 436 (i.e., a portion where the STI 106 is). This is another feature characteristic of the opening for the metal gate cuts 312 being formed by a non-selective etch process after the gate stacks of the metal gate lines 212 have been formed. In contrast, FIG. 4D illustrates a portion 450 of a transistor arrangement similar to that shown in FIG. 4C, but fabricated as a result of applying a conventional polygate cut process where polygate cuts 452 (shown as 3 cuts, similar to the cuts 312 shown in FIG. 4C) are formed in a polygate material which is provided as a part of forming the gate stacks. In such a process, the cuts 452 are formed first, and after that the high-k dielectric material 110 and, optionally, one or more capping materials are deposited around the fins, as shown in FIG. 4D with the material 430. After that, the gate electrode material 112 is deposited around the fins, to finish formation of the gate stacks. As a result of this process, the material 430 will be lining the sidewalls 432 of the polygate cuts 452, as shown in FIG. 4D, so the one or more dielectric materials filling the remaining portion of the polygate cuts 452 would not be in contact with the gate electrode material 112. Furthermore, because of the selective etch process used to form conventional polygate cuts 452 (i.e., an etch process where only the polygate material is etched selectively, and the STI 106 is not etched), the polygate cuts 452 would not extend into the STI 106, in contrast to the metal gate cuts 312 shown in FIG. 4C. Comparison of FIGS. 4C and 4D also reveals another advantage of metal gate cuts as described herein over conventional polygate cuts as shown in FIG. 4D, namely, that for a given amount of the gate electrode material 112 provided laterally from the fins, the critical dimensions of the metal gate cuts as described herein can afford to be bigger because the sidewalls of the metal gate cuts are not going to be covered with the material 430 as in FIG. 4D.

FIGS. 5A-5C illustrate further details of the BPR 320.

The BPR 320 may be electrically decoupled from various other electrically conductive materials of the IC structure 300, e.g., from the gate electrode materials of the metal gate lines 212, by having the dielectric liner of the metal gate cut dielectric 318. The BPR 320 may then be used to provide power and/or signals to various portions of the IC structure 300, e.g., to one or more transistor terminals (e.g., to any of the S/D terminals 114), by providing electrical coupling to such portions. An example of that is shown in a cross-sectional side view 500 of FIG. 5A (i.e., a cross-section of the plane BB, along the first S/D region 114-1 of the transistor 202 shown in FIG. 3A), illustrating that the BPR metal 322 of the BPR 320 may be coupled to a S/D contact 508 by virtue of the trench contact 330. In particular, the S/D contact 508 may be electrically coupled to one portion of the trench contact 330 and another portion of the trench contact 330 may be electrically coupled to the BPR metal 322 of the BPR 320. Each of the S/D contacts 508 and the trench contact 330 may be made of one or more electrically conductive materials, such as those described above (e.g., with reference to the trench contact metal 332). However, in other embodiments, electrical connections between the BPR 320 and various components of the IC structure in which the BPR 320 may be implemented may be realized in many other ways, all of which being within the scope of the present disclosure.

The view of FIG. 5A illustrates first S/D regions 114-1 in the plurality of fins 104. The S/D contact 508 may provide electrical coupling to one or more of the first S/D regions 114-1, e.g., to the first S/D regions 114-1 of the fins 104-5 and 104-6, as shown in FIG. 5A. While only a single instance of the S/D contact 508 is shown in FIG. 5A, multiple instances of the S/D contact 508 may be included in the IC structure 300 and, in particular, in the cross-section shown in FIG. 5A (e.g., around the S/D regions of other fins). The same applies to other drawings illustrating the S/D contact 508.

As shown in FIG. 5A, the BPR metal 322 is not recessed in a portion of the BPR 320 that is covered by the trench contact 330. This is because, in some embodiments, during the fabrication of the IC structure 300 according to the method of FIG. 6, a mask for the future trench contact 330, which may have the dimensions, geometry, and location of the trench contact 330, may be used to remove the BPR metal 322 that is not covered by the mask, thus leaving the BPR metal 322 under the mask and, as a result, under the trench contact 330 that later replaces the mask. In such embodiments, the BPR metal 322 may be recessed everywhere in the IC structure 300 except where it is covered by the trench contact 330. An example of the BPR metal 322 being recessed in the IC structure 300 where it is not covered by the trench contact 330 is shown in FIG. 5C, illustrating a cross-sectional side view 550 of the IC structure of FIG. 3A with a cross-section taken along a S/D region to which the trench contact 330 is not coupled (i.e., a cross-section of the plane CC, along the second S/D region 114-2 of the transistor 202 shown in FIG. 3A), according to one embodiment of the disclosure. In other embodiments, the BPR metal 322 may only be recessed in portions of the IC structure 300 where, if it was not recessed, it would form a capacitor with the gate electrode material of one of the metal gate lines 212, thus reducing or eliminating the parasitic capacitance due to such capacitors.

In some embodiments, similar to the seams 420, described above, the BPR metal 322 of the BPR 320 may also exhibit a characteristic seam substantially in the middle of the opening used to form the metal gate cut for the BPR 320, shown as a seam 520 in the cross-sectional side view 500 of FIG. 5B. Descriptions provided with respect to the seam 420 are applicable to the seam 520 and, therefore, in the interests of brevity are not repeated. In some embodiments, the seam 520 may be present while the seams 420 may be absent, or vice versa. The rest of the descriptions of FIG. 5A are applicable to FIG. 5B and, therefore, in the interests of brevity are not repeated.

Example Fabrication Method

IC structures with the BPR 320 as described herein, e.g., any embodiments of the IC structure 300, described herein, may be fabricated using any suitable fabrication methods. One non-limiting example of a fabrication method is illustrated in FIGS. 6A-6B.

Figure 6A:
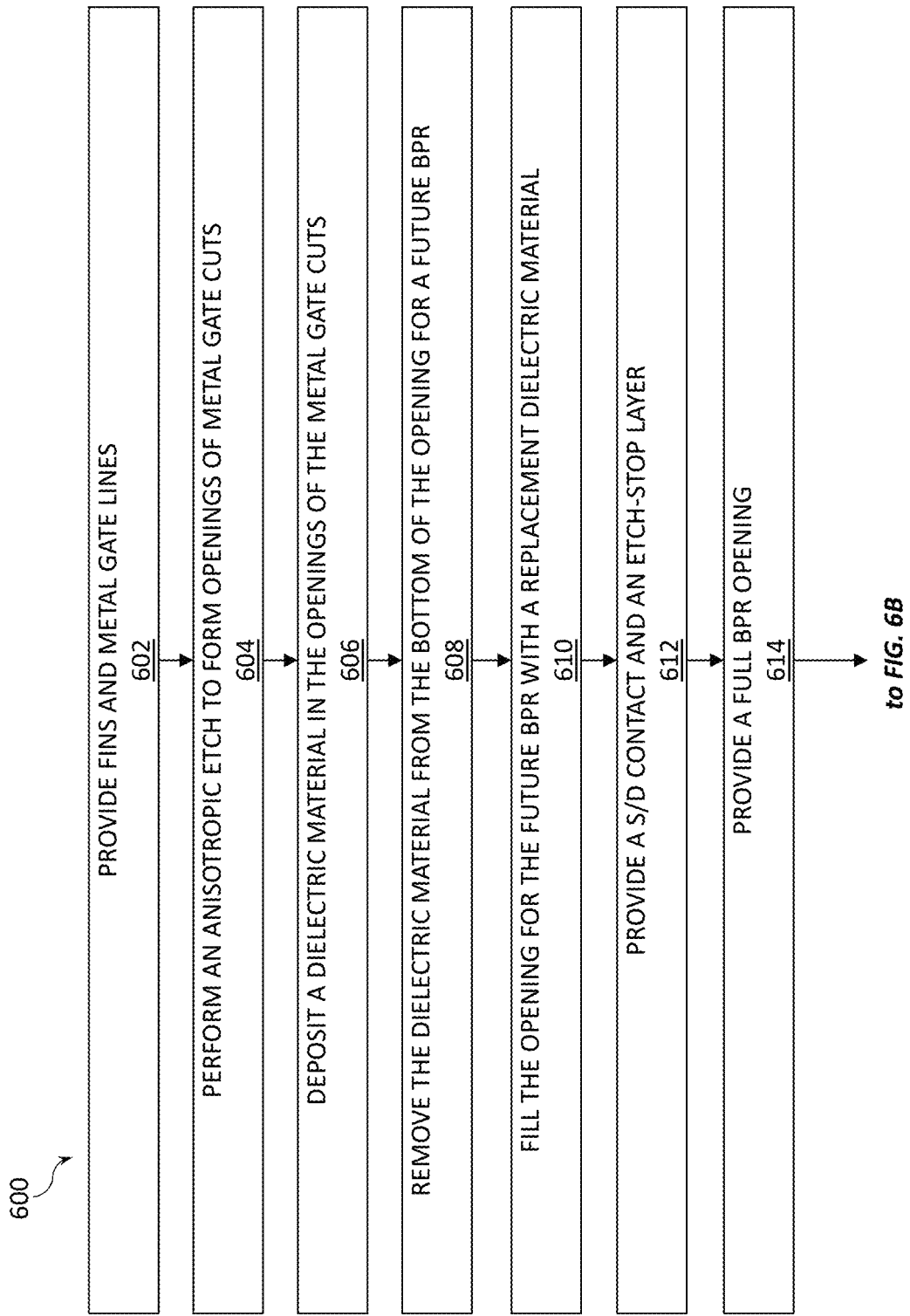
FIGS. 6A-6B provide a flow diagram of an example method of manufacturing an IC structure with one or more BPRs with self-aligned vias to trench contacts, according to one embodiment of the disclosure.
Figure 6B:
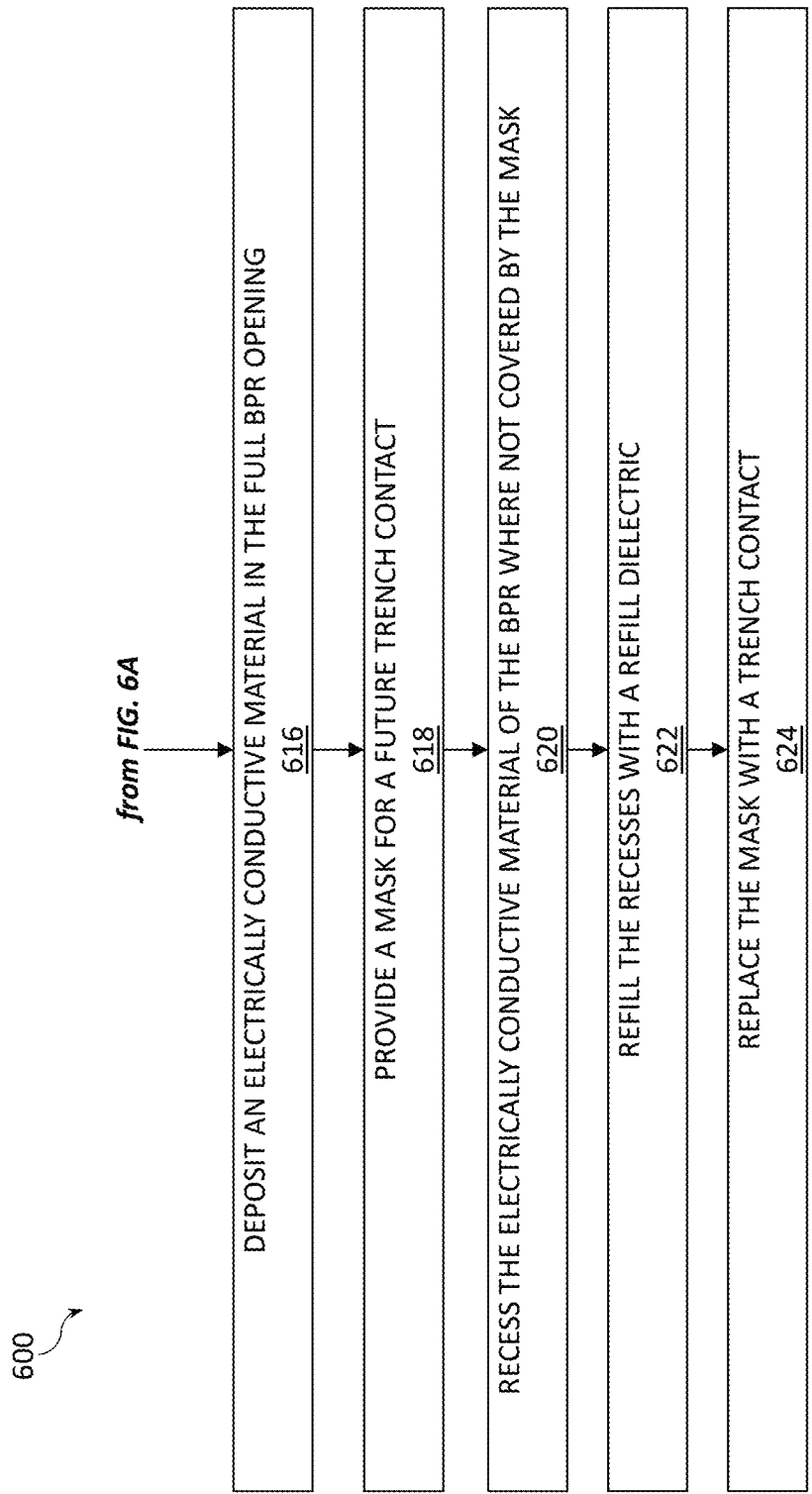

FIGS. 6A-6B provide a flow diagram of an example method 600 of manufacturing an IC structure with one or more BPRs with self-aligned vias to trench contacts, according to one embodiment of the disclosure.

Although the operations of the method 600 are illustrated once each and in a particular order, the operations may be performed in any suitable order and repeated as desired. For example, one or more operations may be performed in parallel to manufacture, substantially simultaneously, multiple IC structures with one or more BPRs with self-aligned vias to trench contacts as described herein. In another example, the operations may be performed in a different order to reflect the structure of a particular device assembly in which one or more BPRs with self-aligned vias to trench contacts as described herein will be included.

In addition, the example manufacturing method 600 may include other operations not specifically shown in FIG. 6, such as various cleaning or planarization operations as known in the art. For example, in some embodiments, a support structure, as well as layers of various other materials subsequently deposited thereon, may be cleaned prior to, after, or during any of the processes of the method 600 described herein, e.g., to remove oxides, surface-bound organic and metallic contaminants, as well as subsurface contamination. In some embodiments, cleaning may be carried out using e.g., a chemical solutions (such as peroxide), and/or with ultraviolet (UV) radiation combined with ozone, and/or oxidizing the surface (e.g., using thermal oxidation) then removing the oxide (e.g., using hydrofluoric acid (HF)). In another example, the arrangements/devices described herein may be planarized prior to, after, or during any of the processes of the method 600 described herein, e.g., to remove overburden or excess materials. In some embodiments, planarization may be carried out using either wet or dry planarization processes, e.g., planarization be a chemical mechanical planarization (CMP), which may be understood as a process that utilizes a polishing surface, an abrasive and a slurry to remove the overburden and planarize the surface.

Various operations of the method 600 may be illustrated with reference to the example embodiments shown in FIGS. 7A-7L, illustrating cross-sectional side views for various stages in the manufacture of an example IC structure with a BPR with a self-aligned via to a trench contact, in accordance with some embodiments, but the method 600 may be used to manufacture any suitable IC structures having one or more BPRs with self-aligned vias to trench contacts according to any embodiments of the present disclosure. In particular, FIGS. 7A-7L illustrate cross-sectional side views similar to the views shown in FIGS. 4 and 5 (i.e., along different ones of the planes AA, BB, and CC of FIG. 3A, depending on which view is deemed most suitable to illustrates a given operation of the method 600). Similar to FIGS. 2-5, a number of elements referred to in the description of FIGS. 7A-7L with reference numerals are illustrated in these figures with different patterns, with a legend showing the correspondence between the reference numerals and patterns being provided at the bottom of each drawing page containing FIGS. 7A-7L.

The method 600 may begin with a process 602 that includes providing one or more (typically, a plurality) of fins over a base, and providing one or more (typically, a plurality) of metal gate lines as ridges crossing and wrapping around upper portions of the fins. The process 602 is shown in FIG. 6A, and an example result of this process is illustrated with an IC structure 702, shown in FIG. 7A. The IC structure 702 illustrates a cross-section along the plane AA of FIG. 3A, showing the base 102 and a plurality of fins 104 (namely, 8 fins 104-1 through 104-8, as described above) extending away from the base 102, with lower portions of the fins being enclosed by the STI 106, while the upper portions of the fins are enclosed by the gate electrode materials of the metal gate lines 212. The IC structure 200 of FIG. 2 provides an example of a top-down view of the IC structure 702. In some embodiments, the process 602 may also include forming the S/D regions for various transistors of the fins 104. Methods for providing the fins 104 and the metal gate lines 212 are known in the art and, therefore, are not described here in detail.

The method 600 may then proceed with a process 604 that includes performing an anisotropic etch to provide one or more (typically, a plurality) of openings for the metal gate cuts, the openings extending across one or more of the metal gate lines. The process 604 is shown in FIG. 6A, and an example result of this process is illustrated with an IC structure 704, shown in FIG. 7B. The IC structure 704 illustrates a cross-section along the plane AA of FIG. 3A, showing openings for the future metal gate cuts 312-1, 312-2, and 312-3 formed in the IC structure 702. Dimensions of the openings may be as discussed above with respect to dimensions of the metal gate cuts 312-1, 312-2, and 312-3. In some embodiments, the anisotropic etch of the process 604 may include an etch that uses etchants in a form of e.g., chemically active ionized gas (i.e., plasma) using e.g., bromine (Br) and chloride (Cl) based chemistries. In some embodiments, during the etch of the process 604, the IC structure may be heated to elevated temperatures, e.g., to temperatures between about room temperature and 200 degrees Celsius, including all values and ranges therein, to promote that byproducts of the etch are made sufficiently volatile to be removed from the surface. In some embodiments, the anisotropic etch of the process 604 may include a dry etch, such as radio frequency (RF) reactive ion etch (RIE) or inductively coupled plasma (ICP) RIE. Although not specifically shown in FIG. 7B, in various embodiments, any suitable patterning techniques may be used in the process 604 to define the locations and the dimensions of the openings for the metal gate cuts, such as, but not limited to, photolithographic or electron-beam (e-beam) patterning, possibly in conjunction with the use of one or more masks.

Figure 7A:
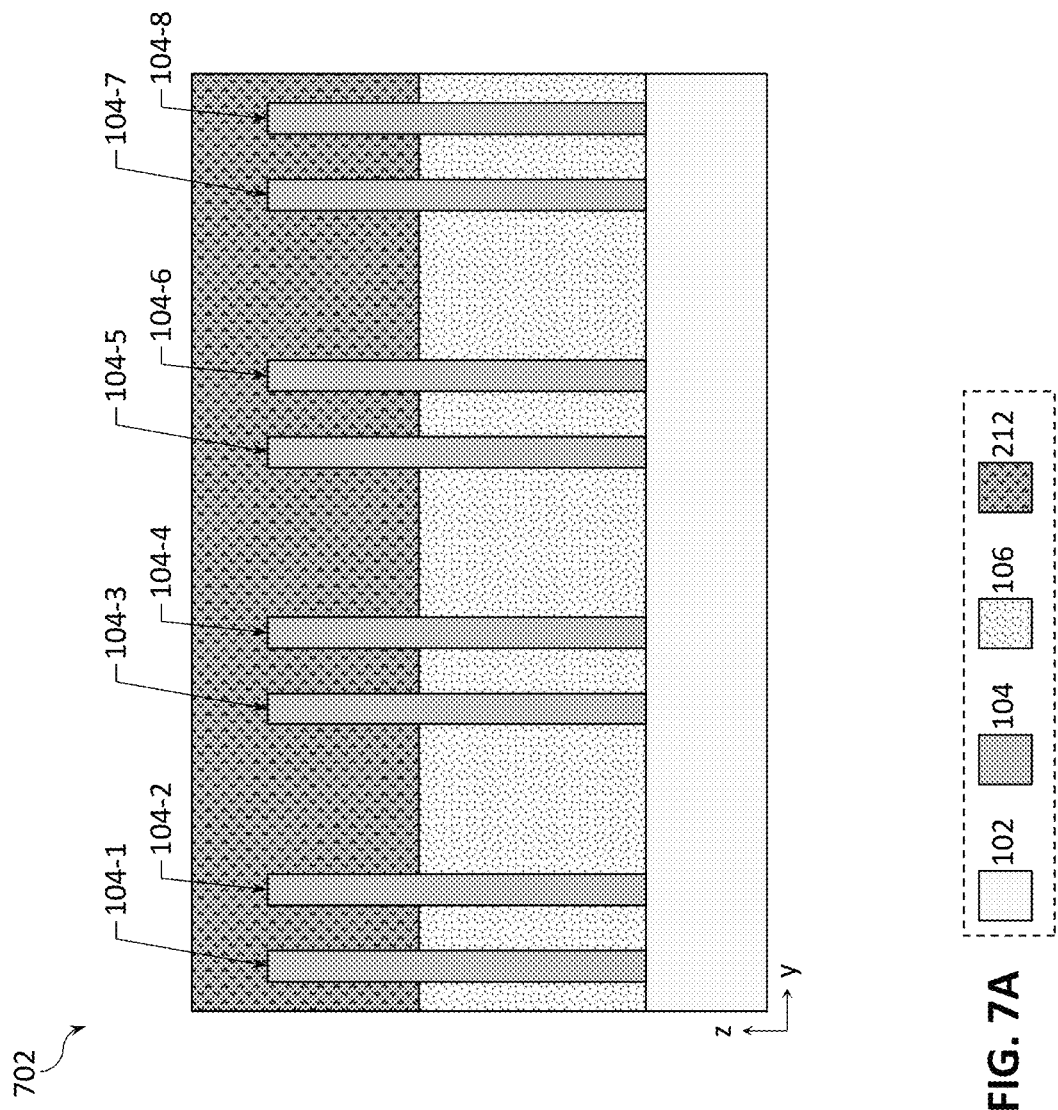
FIGS. 7A-7L are various views illustrating different example stages in the manufacture of an IC structure with one or more BPRs with self-aligned vias to trench contacts using the method of FIGS. 6A-6B, according to some embodiments of the present disclosure.
Figure 7B:
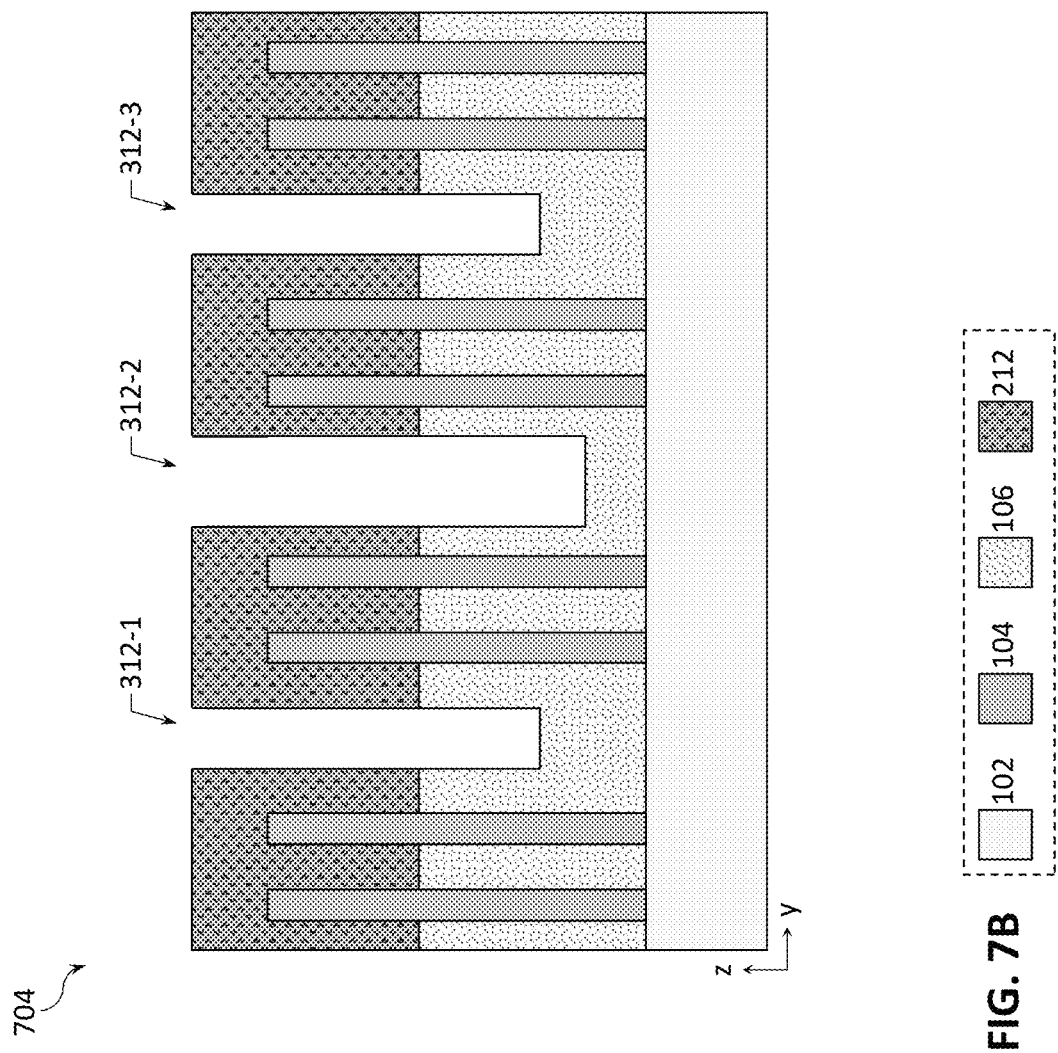
Figure 7C:
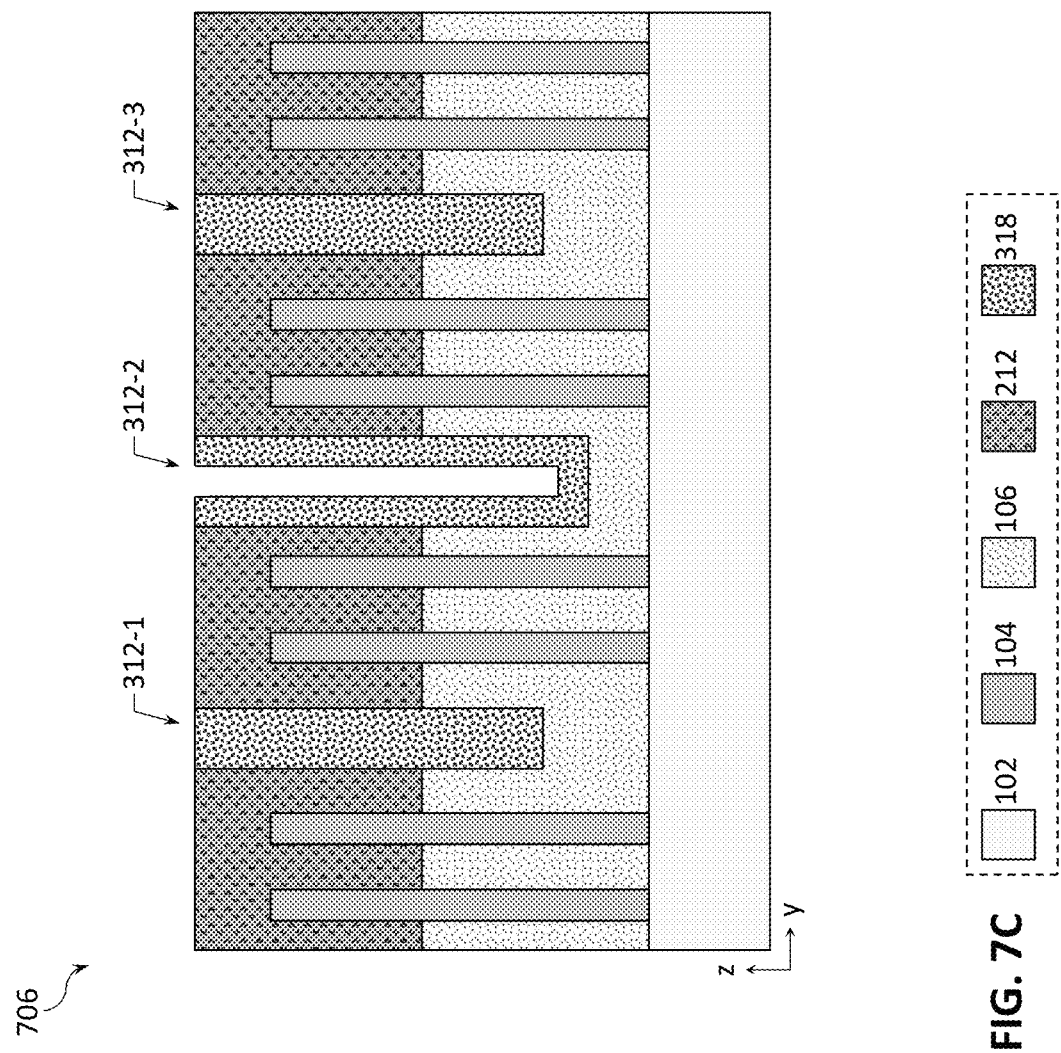
Figure 7D:
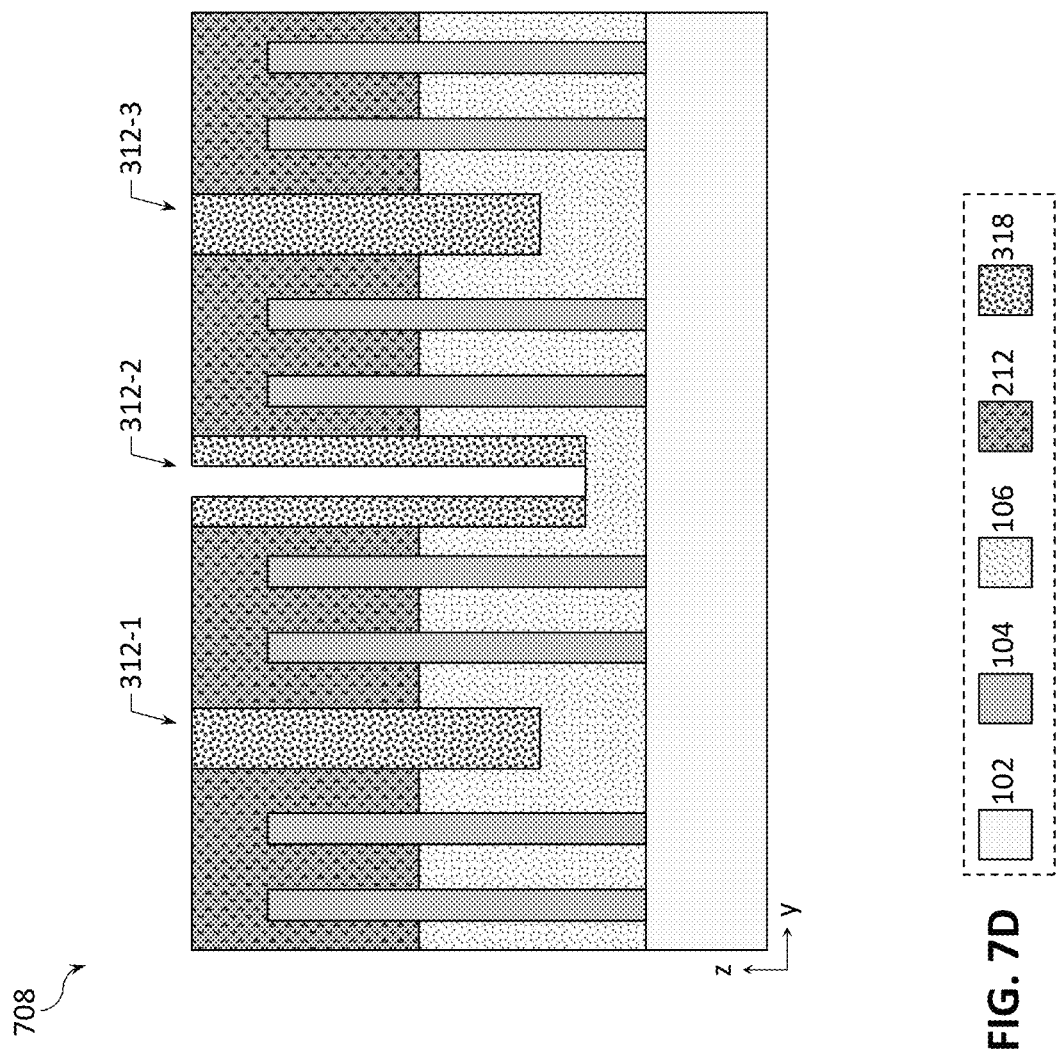

The method 600 may then proceed with a process 606 that includes depositing one or more dielectric materials in the openings formed in the process 604. The process 606 is shown in FIG. 6A, and an example result of this process is illustrated with an IC structure 706, shown in FIG. 7C. The IC structure 706 illustrates a cross-section along the plane AA of FIG. 3A, showing the openings for the metal gate cuts 312-1, 312-2, and 312-3 formed in the IC structure 704 now being lined, at their bottoms and the inner sidewalls, with the metal gate cut dielectric 318. To provide such a lining, a conformal deposition technique such as ALD may be used to deposit the metal gate cut dielectric 318. However, in other embodiments, any other suitable deposition techniques may be used to provide the metal gate cut dielectric 318 within the openings of the metal gate cuts, such as spin-coating, dip-coating, physical vapor deposition (PVD) (e.g., evaporative deposition, magnetron sputtering, or e-beam deposition), or chemical vapor deposition (CVD). It should be noted that FIG. 7C illustrates an embodiment where the metal gate cuts 312-1 and 312-3 are fully filled with the dielectric material 318. This embodiment may be implemented in combination with any other embodiments of the IC structure 300 described above. It should also be noted that, in other embodiments (not specifically shown in the drawings), the metal gate cuts 312-1 and 312-3 (i.e., the ones used to decouple the gates and not used as power rails) may be only partially filled with one or more dielectric materials, e.g., these openings may be only lined with the metal gate cut dielectric 318 (e.g., similar to how the metal gate cut 312-2 is shown to be only lined with the material 318). Furthermore, FIG. 7C illustrates that there is no metal gate cut dielectric 318 at the horizontal surfaces at the top of the IC structure 706. However, as a part of the process 606, the metal gate cut dielectric 318 may first be deposited over all surfaces of the IC structurer 704, thus also over the horizontal surfaces at the top of the IC structure 704, but, in a later part of the process 606, the excess of the metal gate cut dielectric 318 (e.g., the metal gate cut dielectric 318 at the horizontal surfaces at the top of the IC structure) may be removed using, e.g., a suitable polishing process such as CMP.

The method 600 may then include a process 608, in which the dielectric material at the bottom of an opening for the future BPR is removed. The process 608 is shown in FIG. 6A, and an example result of this process is illustrated with an IC structure 708, shown in FIG. 7D. The IC structure 708 illustrates a cross-section along the plane AA of FIG. 3A, showing that the metal gate cut dielectric 318 at the bottom of the opening for the metal gate cut 312-2 has been removed. The process 608 may include performing an anisotropic etch (e.g., an anisotropic etch as described with reference to the process 604), possibly in combination with using a suitable mask, to remove the metal gate cut dielectric 318 at the bottom of the opening for the metal gate cut 312-2 without substantially removing other materials of the IC structure 706.

Figure 7E:
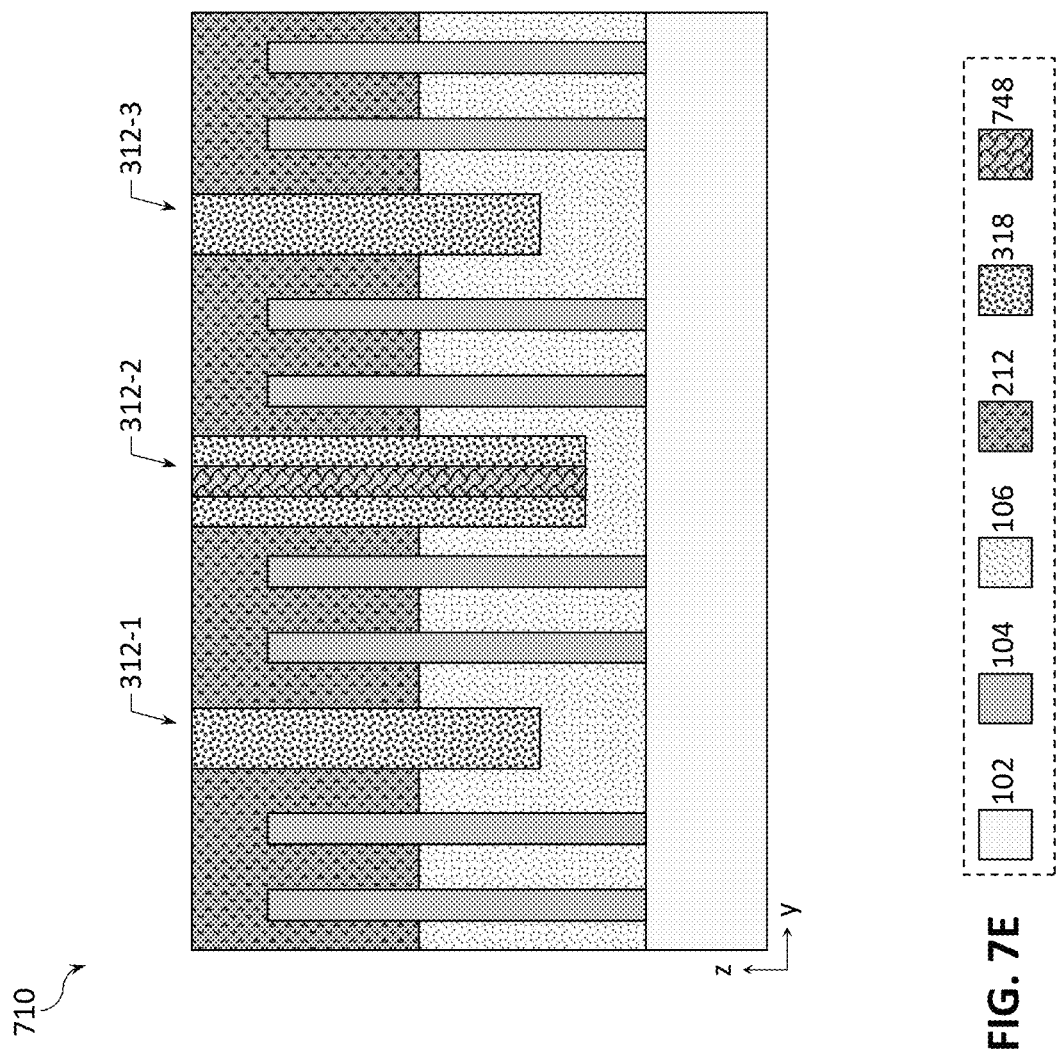
Figure 7F:
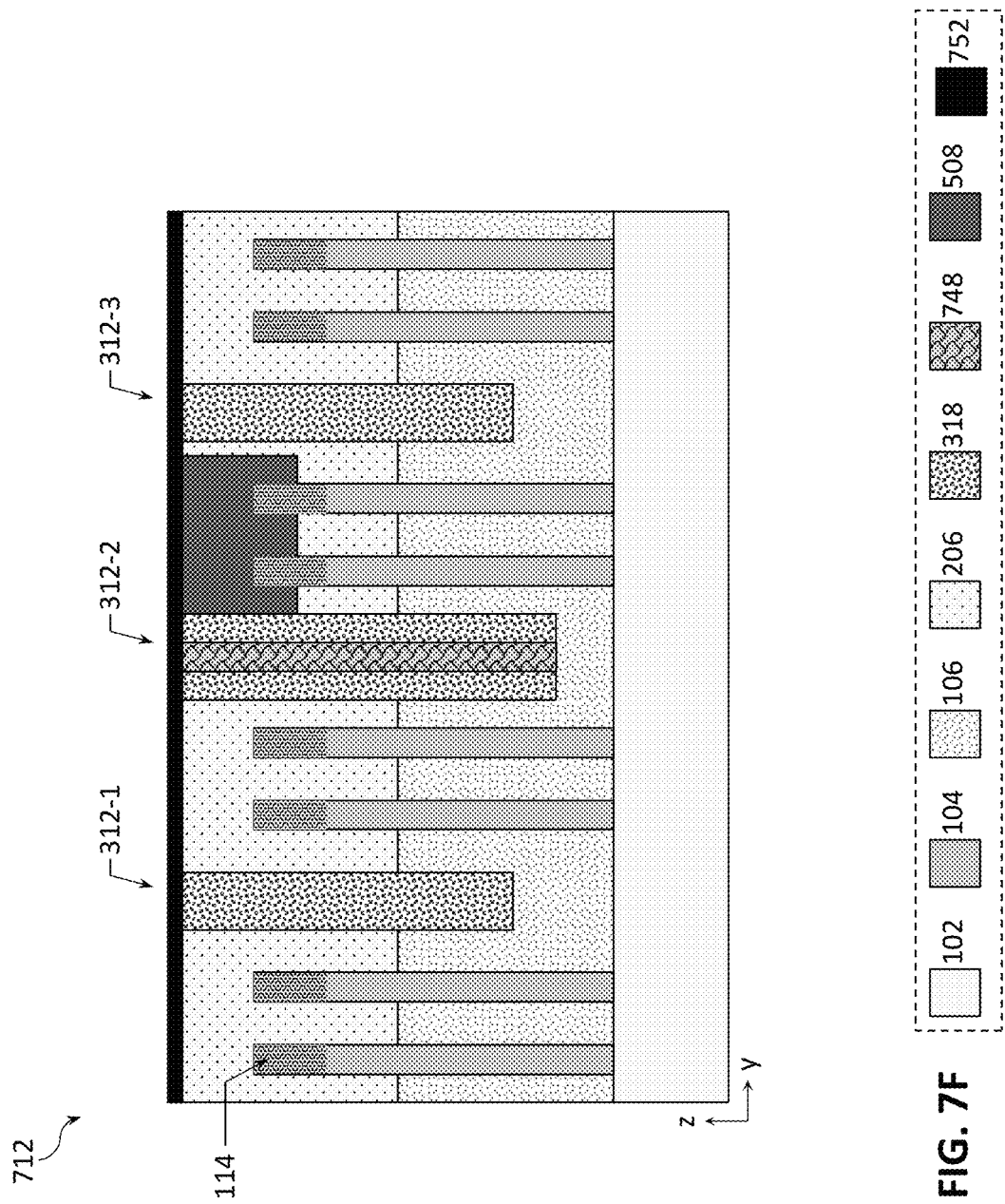

The method 600 may further include a process 610, in which the opening for the future BPR is filled with a replacement dielectric material. The process 610 is shown in FIG. 6A, and an example result of this process is illustrated with an IC structure 710, shown in FIG. 7E. The IC structure 710 illustrates a cross-section along the plane AA of FIG. 3A, showing that the opening for the metal gate cut 312-2 has been filled with a replacement dielectric material 748. The process 610 may be carried out as was described with reference to the process 606 to deposit the replacement dielectric material 748 into the opening for the metal gate cut 312-2. FIG. 7E illustrates that there is no replacement dielectric material 748 at the horizontal surfaces at the top of the IC structure 710. However, as a part of the process 610, the replacement dielectric material 748 may first be deposited over all surfaces of the IC structurer 708, including in the opening for the metal gate cut 312-2, thus also over the horizontal surfaces at the top of the IC structure 708, but, in a later part of the process 610, the excess of the replacement dielectric material 748 (e.g., the replacement dielectric material 748 at the horizontal surfaces at the top of the IC structure) may be removed using, e.g., a suitable polishing process such as CMP. In general, the replacement dielectric material 748 may include any of the dielectric materials described herein. In some embodiments, the replacement dielectric material 748 may include a dielectric material that is "softer" than the metal gate cut dielectric 318, meaning that it will be subsequently possible to remove this sacrificial material selectively to other dielectrics in a subsequent part of the process, for example using an oxygen plasma treatment or a wet process involving a dilute solution of a suitable acid. In some embodiments, the replacement dielectric material 748 may include a dielectric material that is sufficiently etch-selective with respect to the metal gate cut dielectric 318. As known in the art, two materials are said to have "sufficient etch selectivity" when etchants used to etch one material do not substantially etch the other, enabling selective etching of one material but not the other.

The method 600 may then proceed with a process 612, in which at least one S/D contact and an etch-stop layer is provided over the IC structure with the refill dielectric material in the opening for the future BPR. The process 612 is shown in FIG. 6A, and an example result of this process is illustrated with an IC structure 712, shown in FIG. 7F. The IC structure 712 illustrates a cross-section along the plane BB of FIG. 3A (i.e., a different cross-section from those illustrated in FIGS. 7A-7E), showing the S/D contact 508, as described above, and an etch-stop layer 752. Methods for providing the S/D contact(s) 508 are known in the art and, therefore, are not described here in detail. In various embodiments, the etch-stop layer 752 may include materials such as silicon nitride, or silicon carbon nitride, and may be deposited using any suitable deposition technique such as ALD, CVD, etc.

Figure 7G:
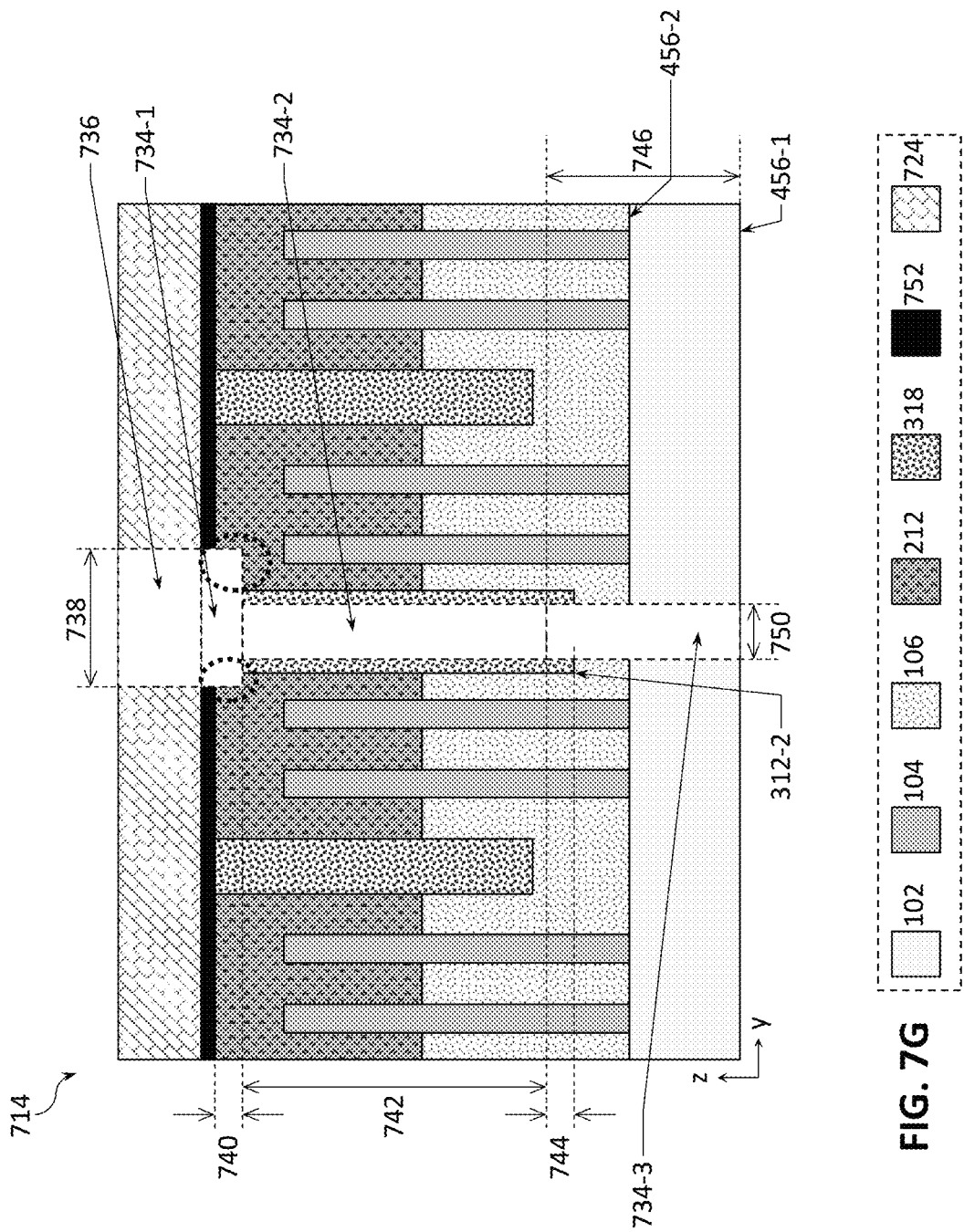
Figure 7H:
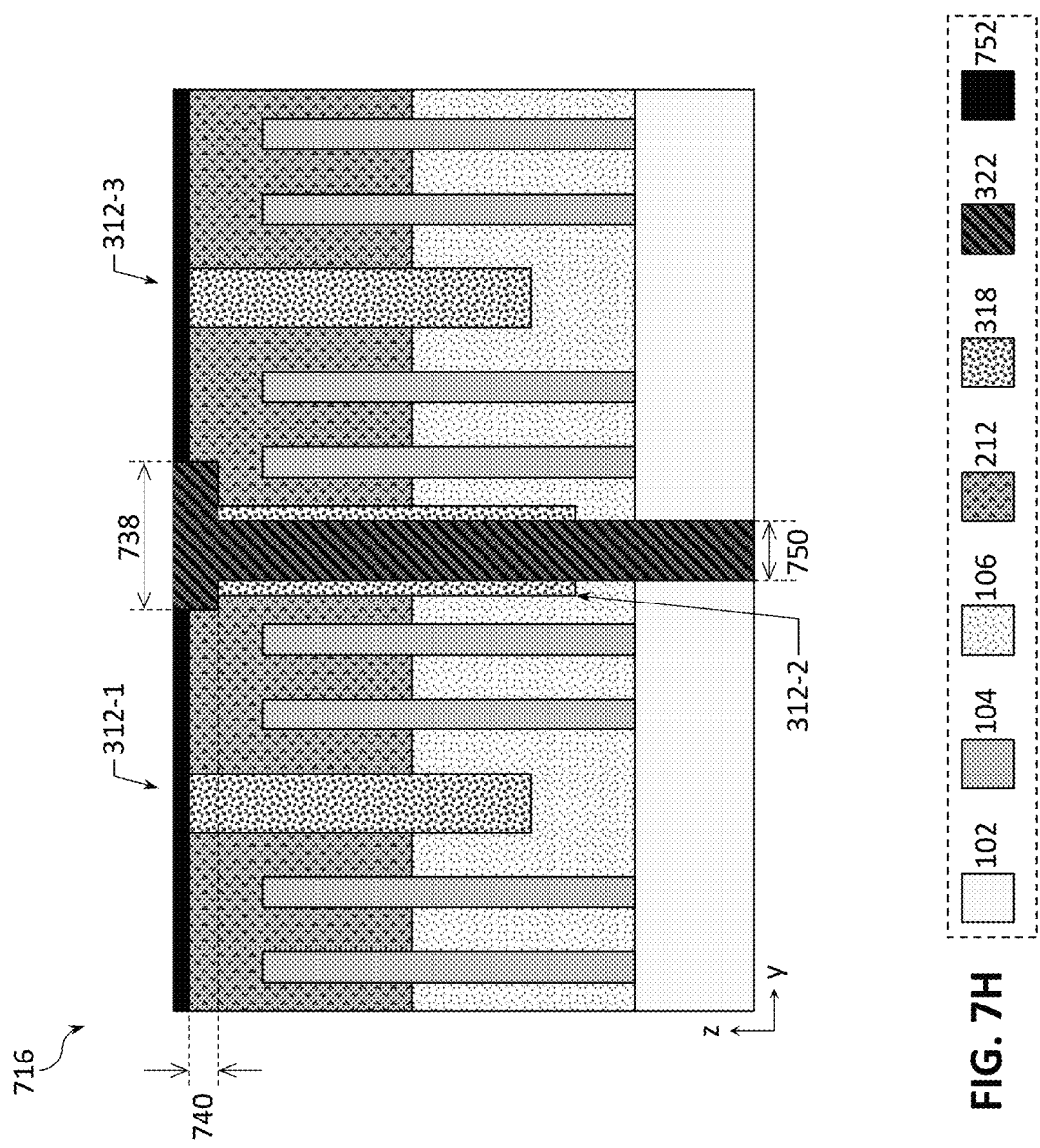

The method 600 may further include a process 614, in which a full BPR opening for the future BPR is provided through the etch-stop layer deposited in the process 612. The process 614 is shown in FIG. 6A, and an example result of this process is illustrated with an IC structure 714, shown in FIG. 7G. The IC structure 714 illustrates a cross-section along the plane AA of FIG. 3A (i.e., again the same cross-section as those illustrated in FIGS. 7A-7E), showing that, in some embodiments, a full BPR opening 734 may be formed of three separate openings, labeled in FIG. 7G as openings 734-1, 734-2, and 734-3, formed by different processes. FIG. 7G also illustrates a BPR mask 724. The BPR mask 724 may include any suitable mask material (e.g., any conventional lithographic stack of materials, which may, e.g., include a carbon hard mask) in which an opening 736 may be formed, defining the approximate location and dimensions (e.g., a width 738) for the first BPR opening 734-1. For example, the opening 736 may extend in the dimension of the x-axis of the example coordinate system, substantially above the metal gate cut 312-2, as the BPR 320 extends in the illustration of FIG. 3A. The opening 736 is not self-aligned to the metal gate cut 312-2 and, as a result, there may be a misalignment between the opening 736 and the metal gate cut 312-2, as is illustrated in FIG. 7G with the opening 736 extending further beyond the metal gate cut 312-2 on the right side than on the left side.

The opening 736 exposes the etch-stop layer 752 at the bottom. The first BPR opening 734-1 may then be formed using any suitable anisotropic etch process, e.g., RIE, that may etch through the etch-stop layer 752 exposed by the mask opening 736 and further down into the IC structure. FIG. 7G illustrates that the first BPR opening 734-1 may extend to a depth 740 with respect to the bottom of the etch-stop layer 752. In some embodiments, the depth 740 may be between about 0 and 50 nanometers, including all values and ranges therein, e.g., between about 1 and 40 nanometers, or between about 3 and 20 nanometers. The purpose of the first etch is to form the first BPR opening 734-1 that breaks through the etch-stop layer 752, so, in principle, the first etch does not have to etch further into the IC structure to a non-zero depth 740. However, such an etch into the IC structure may be inevitable in that the first etch is a timed etch and may not be timed perfectly so that the depth 740 is 0 nanometers, resulting in step-like shapes in the materials of the IC structure in areas along the first BPR opening 734-1 which are circled with dashed oval contours in FIG. 7G, which shapes are characteristic of the first etch as described herein. The dimensions and the location of the opening 734-1 may be substantially the same as those of the opening 736 (in other words, the opening 734-1 is self-aligned to the opening 736).

The first BPR opening 734-1 exposes the metal gate cut dielectric 318 and the replacement dielectric material 748 in the metal gate cut 312-2. A second etch may then be performed to remove the replacement dielectric material 748 exposed by the first BPR opening 734-1, forming a second BPR opening 734-2 having a depth 742.

FIG. 7G illustrates that, in some embodiments, some of the metal gate cut dielectric 318 at the sidewalls of the second BPR opening 734-2 may also be removed, e.g., if an isotropic etch is used to form the second BPR opening 734-2. An isotropic etch (e.g., a wet etch using dilute HF acid etch) may be beneficial to form the second BPR opening 734-2 since this etch process is much faster than anisotropic etches such as RIE, and, therefore, may be well suited to etch to the depth 742 because this depth is rather large, compared, e.g., to the depth 740. An isotropic etch may be particularly advantageous in combination with using the replacement dielectric material 748 that is softer than the metal gate cut dielectric 318, which would result in removing substantially all of the replacement dielectric material 748 while only removing a relatively small amount of the metal gate cut dielectric 318 at the sidewalls of the second BPR opening 734-2. The second BPR opening 734-2 may have a width 750, that is greater than the width of the metal gate cut 312-2 lined with the metal gate cut dielectric 318 in the process 606. Because of the isotropic nature of the second etch in such embodiments, the second BPR opening 734-2 may be self-aligned with respect to the opening for the metal gate cut 312-2 in that the distances from either sidewall of the second BPR opening 734-2 to the respective (i.e., nearest) sidewall of the opening for the metal gate cut 312-2 may be the same. Phrased differently, a center plane (i.e., an x-z plane substantially in the center) of the second BPR opening 734-2 may be aligned with a center plane of the opening for the metal gate cut 312-2, which would be characteristic of the second etch.

In some embodiments, the second BPR opening 734-2 may stop shortly before the bottom of the metal gate cut 312-2, e.g., at a distance 744 before the bottom of the metal gate cut 312-2. In some embodiments, the distance 744 may be between about 0 and 20 nanometers, including all values and ranges therein, e.g., between about 1 and 15 nanometers, or between about 3 and 10 nanometers. Stopping of the second etch shortly before the bottom of the metal gate cut 312-2 is reached may be beneficial in case the second etch is an isotropic etch, in which case stopping of the second etch at the distance 744 from the bottom of the metal gate cut 312-2 may prevent that the second etch starts spreading isotropically in the STI 106 below the metal gate cut 312-2.

Although not specifically shown in FIG. 7G, in other embodiments of the second etch of the process 614, the second etch may be such that it removes the replacement dielectric material 748 without substantially removing the metal gate cut dielectric 318, which may be the case in some embodiments of the method 600 (e.g., if the replacement dielectric material 748 is sufficiently etch-selective with respect to the metal gate cut dielectric 318). In some such embodiments, the second etch may include an anisotropic etch process such as RIE to remove the replacement dielectric material 748 exposed by the first BPR opening 734-1.

The second BPR opening 734-2 exposes the metal gate cut dielectric 318 and the replacement dielectric material 748 close to the bottom of the metal gate cut 312-2 (i.e., at the distance 744 from the bottom of the metal gate cut 312-2). A third etch may then be performed as an anisotropic etch, e.g., DRIE, to remove the replacement dielectric material 748 exposed by the second BPR opening 734-2 and to continue further down into the IC structure, forming a third BPR opening 734-3 having a depth 746. In some embodiments, the depth 746 may be such that the third BPR opening 734-3 extends all the way through the STI 106 and the support structure 102 (i.e., extends between the second face 456-2 and the second face 456-1 of the support structure 102). Such embodiments may be beneficial in case a backside interconnect (e.g., a power line) is to be coupled to the BPR 320 at the backside (i.e., at the first face 456-1) of the support structure 102. However, in other embodiments, the depth 746 may be such that the third opening 734-3 does not extend all the way to the first face 456-1) of the support structure 102.

In other embodiments of the process 614, other etch processes than those described above may be used to form the full BPR opening 734 (which may, but does not have to, include three separate BPR openings 734-1, 734-2, and 734-3) removing the replacement dielectric material 748 in the metal gate cut 312-2 at least by the depth 740 and the depth 742 below the etch-stop layer 752, and possibly extending further down by the depth 746. The BPR mask 724 may be removed at the end of the process 614.

The method 600 may then proceed with a process 616, in which an electrically conductive material is deposited within the full BPR opening formed in the process 614. The process 616 is shown in FIG. 6B, and an example result of this process is illustrated with an IC structure 716, shown in FIG. 7H. The IC structure 716 illustrates a cross-section along the plane AA of FIG. 3A, showing that the BPR opening 734, formed in the process 614, has been filled (at least partially) with the BPR metal 322, described above, using any suitable deposition process such as ALD, PVD (including sputtering), CVD, or electroplating.

The method 600 may further include a process 618, in which a mask for a future trench contact is provided over a portion of the electrically conductive material deposited within the full BPR opening in the process 616. The process 616 is shown in FIG. 6B, and an example result of this process is illustrated with an IC structure 718, shown in FIG. 7I. The IC structure 718 illustrates a cross-section along the plane BB of FIG. 3A (i.e., a different cross-section from those illustrated in FIGS. 7A-7E, 7G, and 7H), showing a trench contact mask 726. The location and dimensions of the trench contact mask 726 may be approximately as shown in FIG. 3A for the trench contact 330, as long as the trench contact mask 726 extends far enough in the direction of the y-axis to completely cover all of the BPR metal 322 covered by the mask, to ensure that the trench contact mask 726 protects the BPR metal 322 underneath from recession in the following process.

Figure 7I:
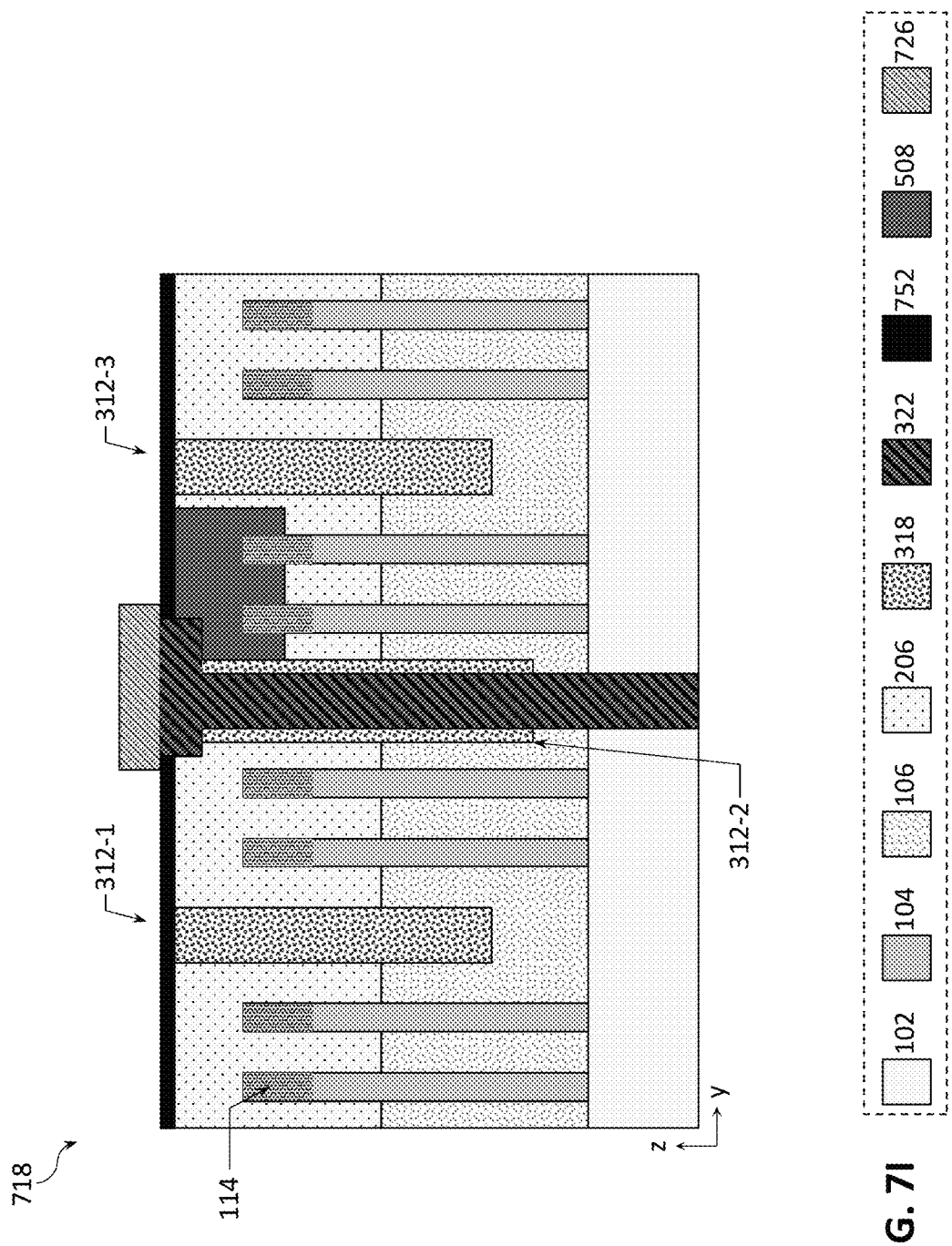
Figure 7J:
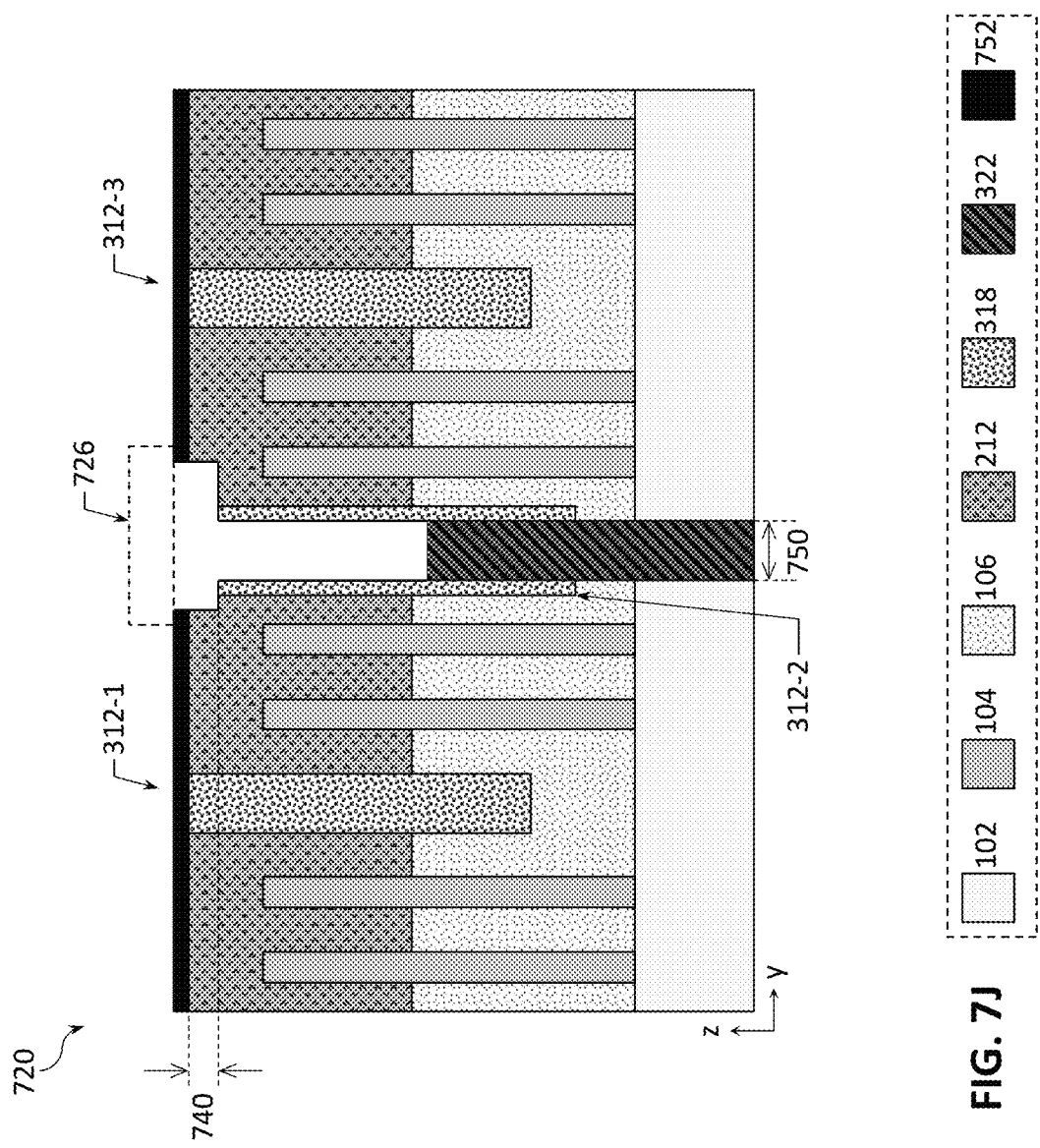
Figure 7K:
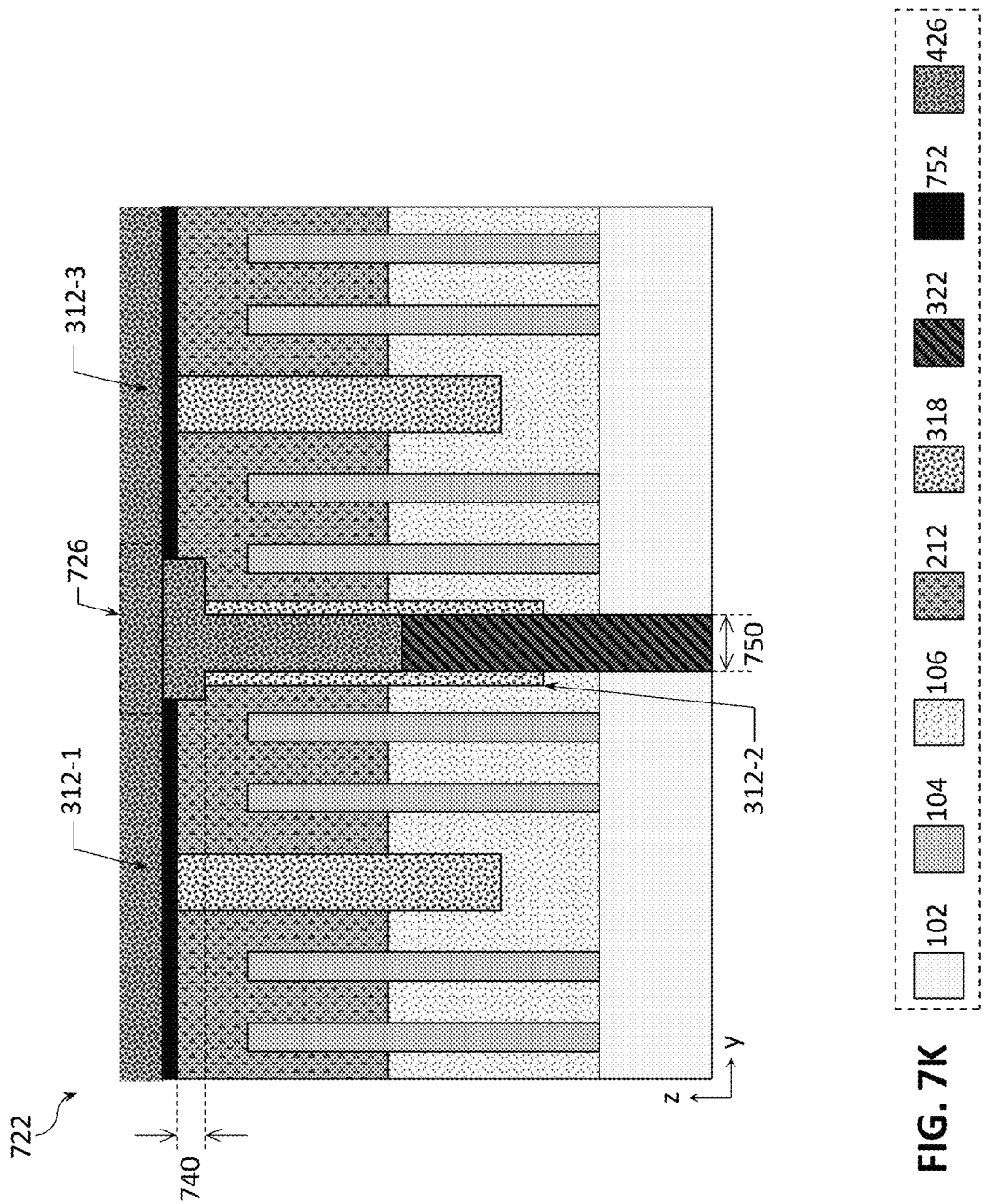
Figure 7L:
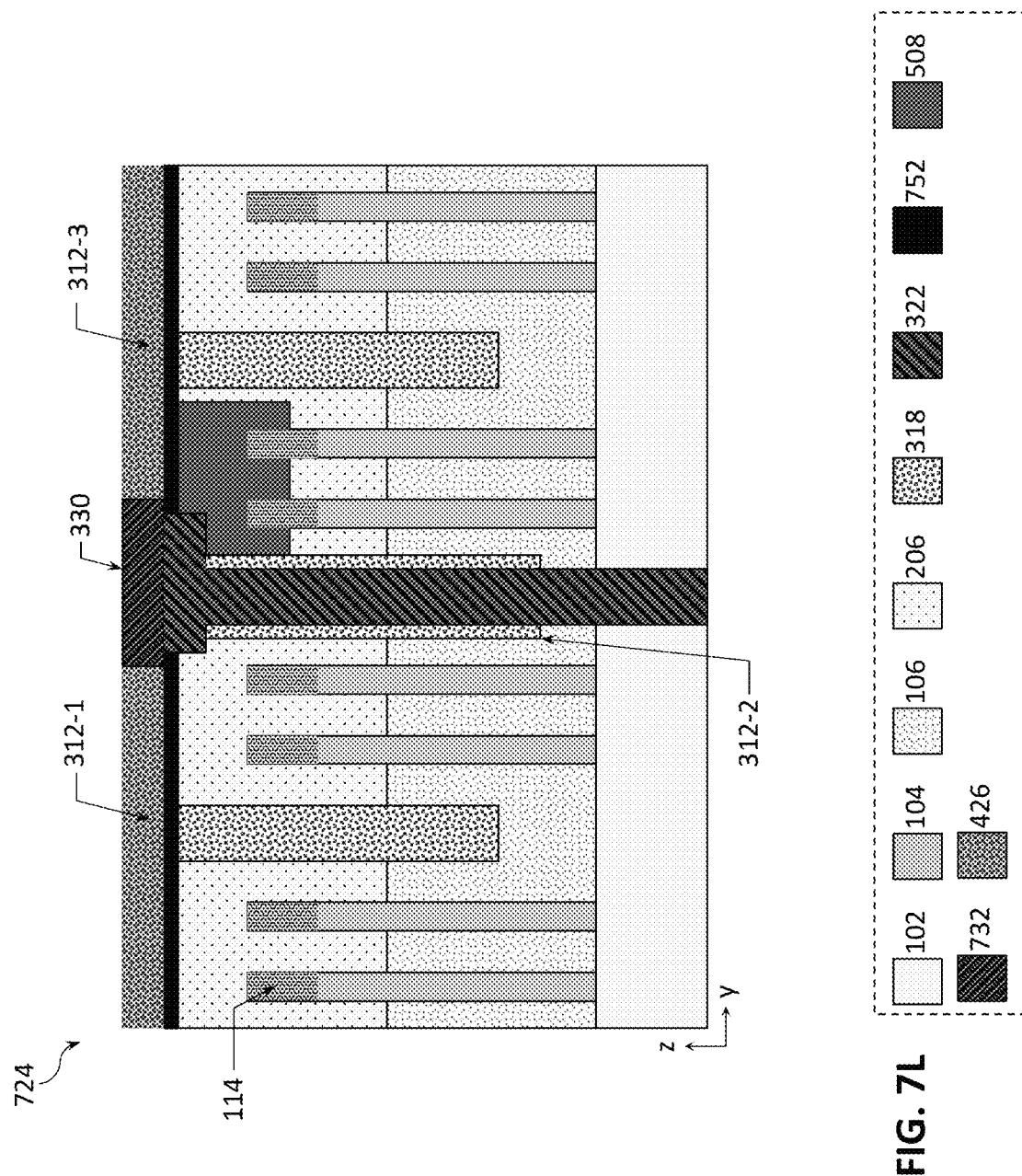

Next, the method 600 may include a process 620, in which the electrically conductive material deposited within the full BPR opening in the process 616 is recessed in portions of the IC structure not covered by the mask provided in the process 618. The process 620 is shown in FIG. 6B, and an example result of this process is illustrated with an IC structure 720, shown in FIG. 7J. The IC structure 720 illustrates a cross-section along the plane AA of FIG. 3A (i.e., again, the same cross-section as those illustrated in FIGS. 7A-7E, 7G, and 7H), showing that the BPR metal 322 is recessed in areas not covered by the trench contact mask 726 provided in the process 616. The trench contact mask 726 is illustrated in FIG. 7J with a dashed contour indicating that it is in a different plane than the illustration of FIG. 7J. If the result of the process 620 was shown for the cross-sectional side view as shown in FIG. 7I (i.e., along the plane BB), the BPR metal 322 would not be recessed (i.e., the result of the process 620 would be the same as the illustration of FIG. 7I) because it is protected by the trench contact mask 726. The process 620 may include any suitable process to etch the BPR metal 322 not covered by the trench contact mask 726 without substantially etching other portions of the IC structure, such as a selective anisotropic etch. Discussions provided above with respect to the recess of the BPR metal 322 within the metal gate cut 312-2 are applicable to the IC structure 720 and, therefore, in the interests of brevity, are not repeated.

The BPR metal 322 that is not recessed in the process 616 can, thus, form an electrically conductive via coupled between the BPR 320 that is formed by the recessed portion of the BPR metal 322 and the trench contact 330 which will replace the trench contact mask 726 in a later process of the method 600, thus coupling the BPR 320 to the first S/D region 114-1 of the transistor 202, as described above. Such a via may have several features characteristic of the use of the method 600 in that the via is self-aligned with respect to the trench contact 330 and to the BPR 320. One characteristic feature is that y-z plane sidewalls of the electrically conductive via (of the BPR metal 322) that is formed as a result of the recess of the process 620 (i.e., sidewalls in planes substantially perpendicular to the long axis of the BPR 320 and, hence, also substantially perpendicular to the long axis of the fins 104) may be aligned with corresponding y-z plane sidewalls of the trench contact mask 726, and therefore, of the future trench contact 330. Another characteristic feature is that x-z plane sidewalls of the electrically conductive via (of the BPR metal 322) that is formed as a result of the recess of the process 620 (i.e., sidewalls in planes substantially parallel to the long axis of the BPR 320 and, hence, also substantially parallel to the long axis of the fins 104) may be aligned with corresponding x-z plane sidewalls of the BPR 320. Yet another characteristic feature is that the material composition of the self-aligned via formed in the process 620 is substantially same as the material composition of the BPR 320 (i.e., both are formed of the BPR metal 322) and there are no barrier materials or liner materials between the electrically conductive material of the via formed in the process 620 and the electrically conductive material of the BPR 320. On the other hand, the material composition of the trench contact 330, formed in a later process of the method 600, may be different from the material composition of the self-aligned via formed in the process 620. Furthermore, because the self-aligned via formed in the process 620 is provided in the region that is opposite the first S/D region 114-1 of the transistor 202 (i.e., not opposite the gate stack of the transistor 202), the distance from the self-aligned via formed in the process 620 to the first S/D region 114-1 of the transistor 202 is smaller than a distance from the self-aligned via formed in the process 620 to the gate stack of the transistor 202. In some embodiments, the distance from the self-aligned via formed in the process 620 to the nearest fin 104 may be between about 2 and 100 nanometers, including all values and ranges therein, e.g., between about 3 and 60 nanometers, or between about 5 and 30 nanometers.

The method 600 may further include a process 622, in which the recesses formed in the process 620 are refilled with a refill dielectric. The process 622 is shown in FIG. 6B, and an example result of this process is illustrated with an IC structure 722, shown in FIG. 7K. The IC structure 722 illustrates a cross-section along the plane AA of FIG. 3A (i.e., again, the same cross-section as those illustrated in FIGS. 7A-7E, 7G, 7H, and 7J), showing that the regions where the BPR metal 322 was recessed in the process 622 have been refilled with the refill dielectric 426, as described above. Any suitable process for depositing dielectric materials may be used to deposit the refill dielectric 426 into the recesses formed in the process 620, e.g., any dielectric deposition processes described above.

The method 600 may conclude with a process 624, in which the mask provided in the process 618 is replaced with a trench contact. The process 624 is shown in FIG. 6B, and an example result of this process is illustrated with an IC structure 724, shown in FIG. 7L. Similar to FIG. 7I, the IC structure 724 illustrates a cross-section along the plane BB of FIG. 3A (i.e., a different cross-section from those illustrated in FIGS. 7A-7E, 7G, 7H, 7J, and 7K), showing that the trench contact mask 726 has been replaced with the trench contact 330. Methods like damascene metallization for replacing a trench contact mask with a trench contact are known in the art and, therefore, are not described.

The IC structure 724 is substantially the same as the IC structure 300, described above, except that it includes a few characteristic features indicative of the use of some processes of the method 600 that were not specifically illustrated or described with reference to the IC structure 300. Some such characteristic features were described above with reference to, e.g., the process 614. Thus, all of the descriptions provided with reference to the IC structure 300 are applicable to the IC structure 724, and vice versa (e.g., the IC structure 724 may be an example further embodiment of the IC structure 300, described above).

Variations and Implementations

The IC structures illustrated in and described with reference to FIGS. 1-7 do not represent an exhaustive set of assemblies in which one or more one or more BPRs with self-aligned vias to trench contacts as described herein may be integrated, but merely provide examples of such arrangements. For example, while descriptions and drawings provided herein refer to FinFETs, these descriptions and drawings are equally applicable to embodiments with any other non-planar FETs besides FinFETs that are formed on the basis of an elongated structure of a suitable channel material, e.g., to nanoribbon transistors, nanowire transistors, or transistors such as nanoribbon/nanowire transistors but having transverse cross-sections of any geometry (e.g., oval, or a polygon with rounded corners). In another example, although particular arrangements of materials are discussed with reference to FIGS. 1-7, intermediate materials may be included in various portions of these drawings.

Additionally, while FIGS. 1-7 may illustrate various elements, e.g., the metal gate cuts 312 or the S/D regions 114, as having perfectly straight sidewall profiles, i.e., profiles where the sidewalls extend perpendicularly to the support structure 102, these idealistic profiles may not always be achievable in real-world manufacturing processes. Namely, while designed to have straight sidewall profiles, real-world openings which may be formed as a part of fabricating various elements of the transistor arrangements illustrated in FIGS. 1-7 may end up having either so-called "non-reentrant" profiles, where the width at the top of the opening is larger than the width at the bottom of the opening, or "re-entrant" profiles, where the width at the top of the opening is smaller than the width at the bottom of the opening. Oftentimes, as a result of a real-world opening not having perfectly straight sidewalls, imperfections may form within the materials filling the opening. For example, typical for re-entrant profiles, a void may be formed in the center of the opening, where the growth of a given material filling the opening pinches off at the top of the opening. Therefore, descriptions of various embodiments of integrating one or more BPRs with self-aligned vias to trench contacts as provided herein are equally applicable to embodiments where various elements of such integrated structures look different from those shown in the drawings due to manufacturing processes used to form them.

Example Electronic Devices

The IC structures with one or more BPRs with self-aligned vias to trench contacts, disclosed herein, may be included in any suitable electronic device. FIGS. 8-11 illustrate various examples of apparatuses that may include one or more of the IC structures disclosed herein.

FIGS. 8A-8B are top views of a wafer 2000 and dies 2002 that may include one or more IC structures with one or more BPRs with self-aligned vias to trench contacts in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 9. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including one or more BPRs with self-aligned vias to trench contacts as described herein). After the fabrication of the semiconductor product is complete (e.g., after manufacture of one or more layers of an IC structure with one or more BPRs with self-aligned vias to trench contacts as described herein), the wafer 2000 may undergo a singulation process in which each of the dies 2002 is separated from one another to provide discrete "chips" of the semiconductor product. In particular, devices that include one or more IC structures with one or more BPRs with self-aligned vias to trench contacts as disclosed herein may take the form of the wafer 2000 (e.g., not singulated) or the form of the die 2002 (e.g., singulated). The die 2002 may include supporting circuitry to route electrical signals to various memory cells, transistors, capacitors, as well as any other IC components. In some embodiments, the wafer 2000 or the die 2002 may implement or include a memory device (e.g., an SRAM device), a logic device (e.g., an AND, OR, NAND, or NOR gate), or any other suitable circuit element. Multiple ones of these devices may be combined on a single die 2002. For example, a memory array formed by multiple memory devices may be formed on a same die 2002 as a processing device (e.g., the processing device 2402 of FIG. 11) or other logic that is configured to store information in the memory devices or execute instructions stored in the memory array.

Figure 9:
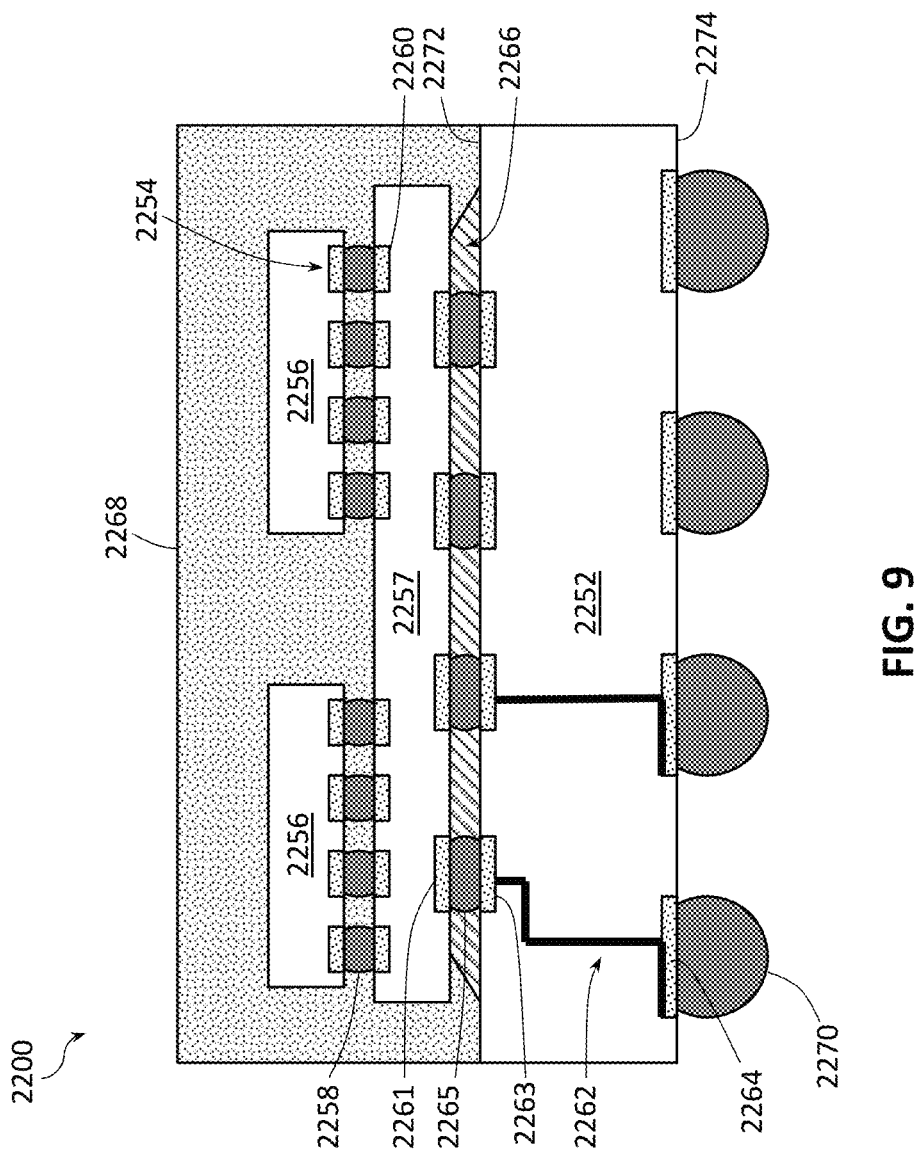
FIG. 9 is a cross-sectional side view of an IC package that may include one or more IC structures with one or more BPRs with self-aligned vias to trench contacts in accordance with any of the embodiments disclosed herein.

FIG. 9 is a side, cross-sectional view of an example IC package 2200 that may include one or more IC structures with one or more BPRs with self-aligned vias to trench contacts in accordance with any of the embodiments disclosed herein. In some embodiments, the IC package 2200 may be a system-in-package (SiP).

The package substrate 2252 may be formed of a dielectric material (e.g., a ceramic, a buildup film, an epoxy film having filler particles therein, etc.), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 9 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 9 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 9 are solder balls (e.g., for a ball grid array arrangement), but any suitable second-level interconnects 2270 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 10.

The dies 2256 may take the form of any of the embodiments of the die 2002 discussed herein (e.g., may include any of the embodiments of the IC structures with one or more BPRs with self-aligned vias to trench contacts as described herein). In embodiments in which the IC package 2200 includes multiple dies 2256, the IC package 2200 may be referred to as a multi-chip package (MCP). The dies 2256 may include circuitry to perform any desired functionality. For example, one or more of the dies 2256 may be logic dies (e.g., silicon-based dies), and one or more of the dies 2256 may be memory dies (e.g., high bandwidth memory). In some embodiments, any of the dies 2256 may include one or more IC structures with one or more BPRs with self-aligned vias to trench contacts as discussed above; in some embodiments, at least some of the dies 2256 may not include any IC structures with one or more BPRs with self-aligned vias to trench contacts.

The IC package 2200 illustrated in FIG. 9 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 9, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 10:
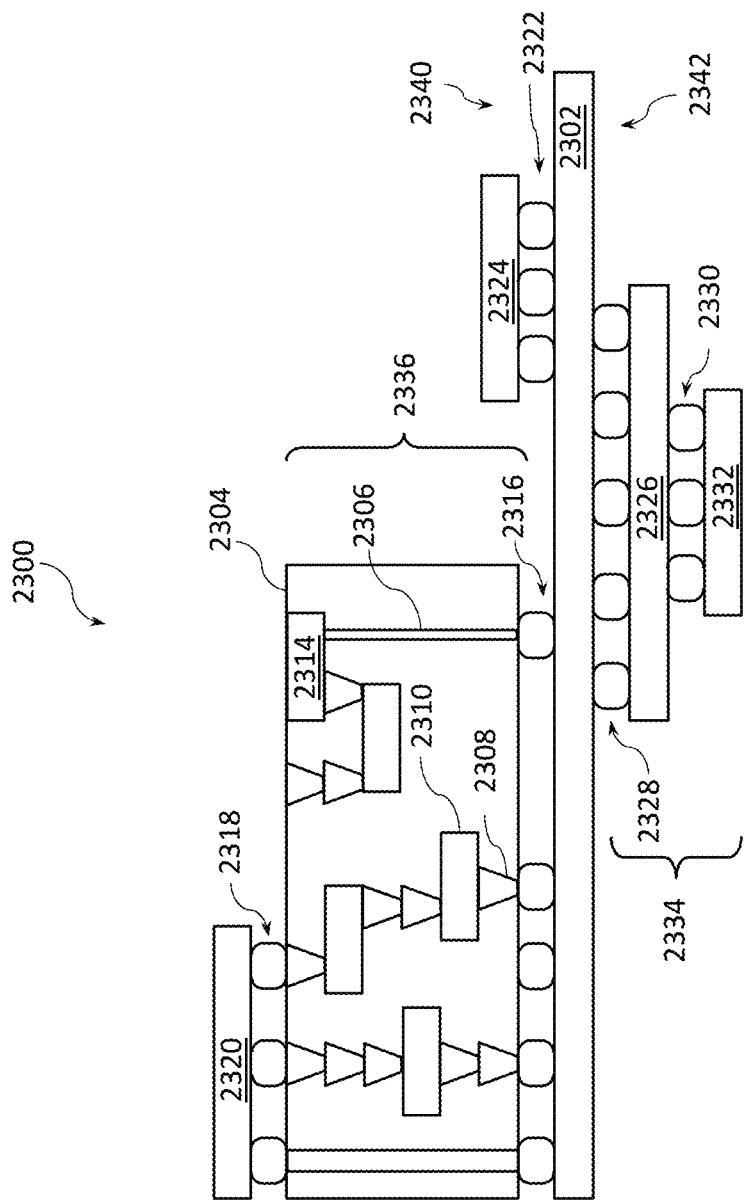
FIG. 10 is a cross-sectional side view of an IC device assembly that may include one or more IC structures with one or more BPRs with self-aligned vias to trench contacts in accordance with any of the embodiments disclosed herein.

FIG. 10 is a cross-sectional side view of an IC device assembly 2300 that may include components having one or more IC structures with one or more BPRs with self-aligned vias to trench contacts in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of one or more IC structures with one or more BPRs with self-aligned vias to trench contacts in accordance with any of the embodiments disclosed herein; e.g., any of the IC packages discussed below with reference to the IC device assembly 2300 may take the form of any of the embodiments of the IC package 2200 discussed above with reference to FIG. 9 (e.g., may include one or more IC structures with one or more BPRs with self-aligned vias to trench contacts provided on a die 2256).

In some embodiments, the circuit board 2302 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 10 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 10), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 8B), an IC device, or any other suitable component. In particular, the IC package 2320 may include one or more IC structures with one or more BPRs with self-aligned vias to trench contacts as described herein. Although a single IC package 2320 is shown in FIG. 10, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 10, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include any number of metal lines 2310, vias 2308, and through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as RF devices, power amplifiers, power management devices, antennas, arrays, sensors, and microelectromechanical systems (MEMS) devices may also be formed on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 10 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 11:
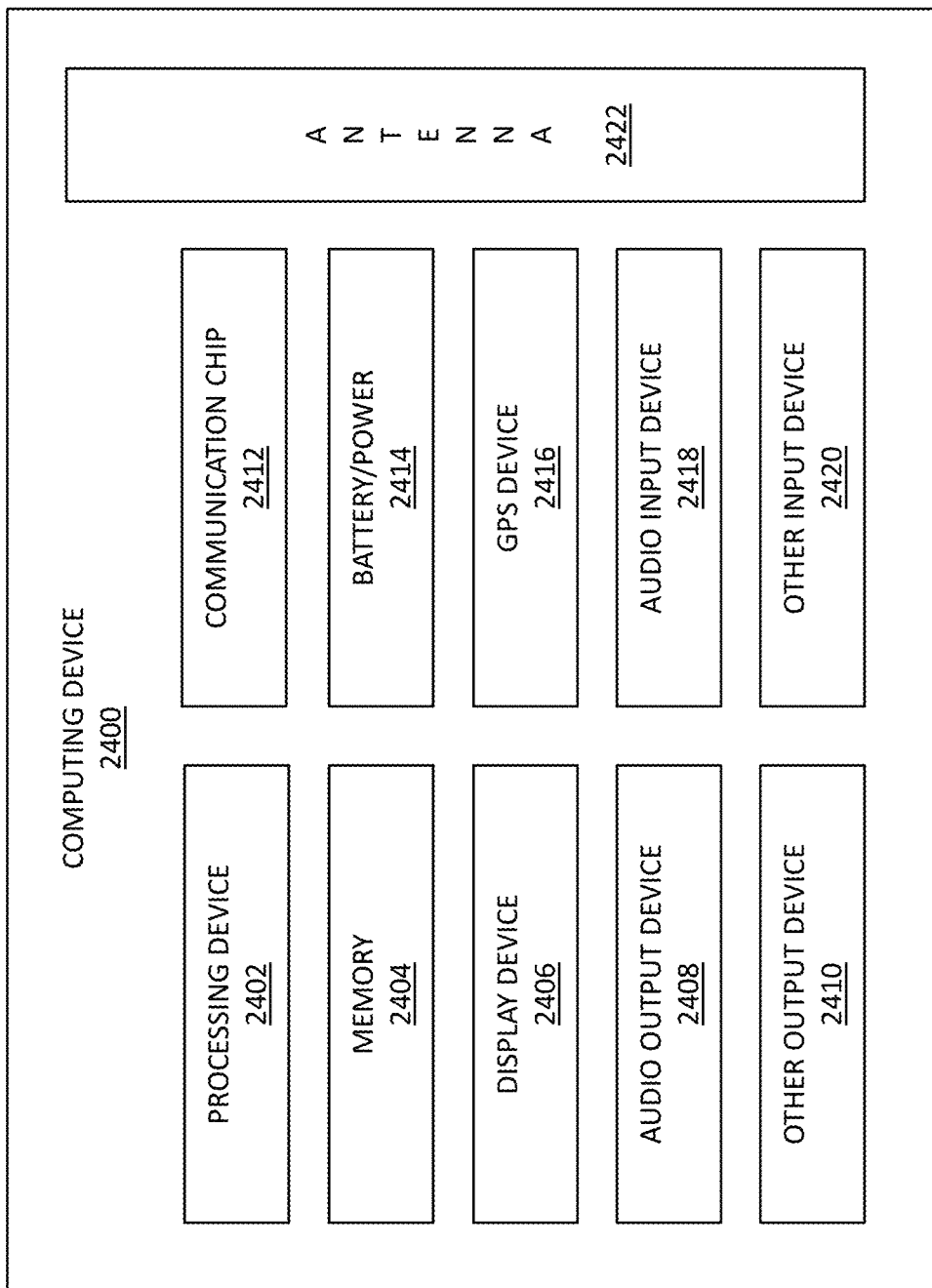
FIG. 11 is a block diagram of an example computing device that may include one or more IC structures with one or more BPRs with self-aligned vias to trench contacts in accordance with any of the embodiments disclosed herein.

FIG. 11 is a block diagram of an example computing device 2400 that may include one or more components with one or more BPRs with self-aligned vias to trench contacts in accordance with any of the embodiments disclosed herein. For example, any suitable ones of the components of the computing device 2400 may include a die (e.g., the die 2002, shown in FIG. 8B) including one or more IC structures with one or more BPRs with self-aligned vias to trench contacts in accordance with any of the embodiments disclosed herein. Any of the components of the computing device 2400 may include an IC package 2200 (e.g., as shown in FIG. 9). Any of the components of the computing device 2400 may include an IC device assembly 2300 (e.g., as shown in FIG. 10).

A number of components are illustrated in FIG. 11 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single system on a chip (SoC) die.

Additionally, in various embodiments, the computing device 2400 may not include one or more of the components illustrated in FIG. 11, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid state memory, and/or a hard drive. In some embodiments, the memory 2404 may include memory that shares a die with the processing device 2402.

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

SELECT EXAMPLES

The following paragraphs provide various examples of the embodiments disclosed herein.

Example 1 provides an IC structure that includes a support structure (e.g., a support structure 102, shown in the present drawings, e.g., a substrate), having a first face and an opposing second face; and an elongated channel structure (e.g., a fin or a nanoribbon) of a channel material (which may include a combination of semiconductor materials), the elongated structure provided over the second face of the support structure and having a long axis substantially parallel to the support structure. The IC structure further includes a transistor arrangement, having a channel portion that includes a portion of the channel material, and a gate stack (that may include at least a gate electrode material, and, in some embodiments, also a gate dielectric material), at least partially wrapping around the channel portion. The IC structure also includes a power rail of an electrically conductive material (which may include a combination of electrically conductive materials), the power rail extending between the first face and the second face of the support structure and having a long axis substantially parallel to the long axis of the elongated channel structure, where, in a cross-section of the IC structure taken along a plane substantially perpendicular to each of the support structure and the long axis of the power rail (and, hence, also substantially perpendicular to the long axis of the elongated channel structure) and including the gate stack, a top of the power rail is closer to the first face of the support structure than a top of the gate stack by at least half of a dimension of the gate stack in the cross-section as measured in a direction substantially perpendicular to the support structure.

Example 2 provides the IC structure according to example 1, where the transistor arrangement further includes a first source or drain (S/D) region and a second S/D region, provided in the channel material on either side of the channel portion, and the power rail is electrically coupled to the first S/D region.

Example 3 provides the IC structure according to example 2, further including a trench contact, electrically coupled to the first S/D region, and an electrically conductive via, electrically coupled between the power rail and the trench contact, thus coupling the power rail to the first S/D region.

Example 4 provides the IC structure according to example 3, where sidewalls of the electrically conductive via in planes substantially perpendicular to the long axis of the power rail (and, hence, also substantially perpendicular to the long axis of the elongated channel structure, e.g., y-z plane sidewalls of the example coordinate system shown in the drawings) are aligned with corresponding sidewalls (i.e., sidewalls that are also in planes substantially perpendicular to the long axis of the power rail, e.g., y-z plane sidewalls of the example coordinate system shown in the drawings) of the trench contact.

Example 5 provides the IC structure according to examples 3 or 4, sidewalls of the electrically conductive via in planes substantially parallel to the long axis of the power rail (and, hence, also substantially parallel to the long axis of the elongated channel structure, e.g., x-z plane sidewalls of the example coordinate system shown in the drawings) are aligned with corresponding sidewalls (i.e., sidewalls that are also in planes substantially parallel to the long axis of the power rail, e.g., x-z plane sidewalls of the example coordinate system shown in the drawings) of the power rail.

Example 6 provides the IC structure according to any one of examples 3-5, where a material composition of an electrically conductive material of the via is substantially same as a material composition of the electrically conductive material of the power rail and there are no barrier materials or liner materials between the electrically conductive material of the via and the electrically conductive material of the power rail.

Example 7 provides the IC structure according to example 6, where the material composition of an electrically conductive material of the via is different from a material composition of the trench contact.

Example 8 provides the IC structure according to any one of examples 3-7, where a distance from the electrically conductive via to the first S/D region is smaller than a distance from the electrically conductive via to the gate stack. For example, the electrically conductive via may be opposite the first S/D region but not opposite the gate stack.

Example 9 provides the IC structure according to any one of examples 3-8, where a distance from the electrically conductive via to the elongated channel structure is between about 2 and 100 nanometers, including all values and ranges therein, e.g., between about 3 and 60 nanometers, or between about 5 and 30 nanometers.

Example 10 provides the IC structure according to any one of the preceding examples, where, in the cross-section, the top of the power rail is closer to the first face of the support structure than a bottom of the gate stack.

Example 11 provides the IC structure according to any one of the preceding examples, further including a backside interconnect coupled to at least a portion of the power rail at the first face of the support structure.

Example 12 provides the IC structure according to any one of examples 1-11, where the elongated channel structure is a fin, extending away from the support structure.

Example 13 provides the IC structure according to example 12, where the IC structure further includes one or more dielectric materials (e.g., the STI material 106, described herein) provided over the second face of the support structure and surrounding a first portion of the fin; the channel portion of the transistor arrangement is a second portion of the fin, where the first portion of the fin is closer to the support structure than the second portion of the fin (i.e., the first portion is the lower portion of the fin and the second portion is the upper portion of the fin); and, in the cross-section, the top of the power rail is below a top of the first portion of the fin.

Example 14 provides the IC structure according to any one of examples 1-11, where the elongated channel structure is a nanoribbon, substantially parallel to the support structure.

Example 15 provides an IC structure that includes a support structure (e.g., a substrate, a wafer, a chip, or a die), having a first face and an opposing second face; a plurality of elongated structures of a channel material over the support structure, substantially parallel to one another and each having a long axis substantially parallel to the support structure; one or more dielectric materials over the support structure, enclosing at least portions of the plurality of elongated structures; a plurality of gate metal lines over and wrapping around portions of at least some of the plurality of elongated structures, the plurality of gate metal lines being substantially parallel to one and each having a long axis in a direction that is substantially perpendicular to the long axis of at least one of the plurality of elongated structures; and an opening in the one or more dielectric materials between a pair of adjacent elongated structures of the plurality of elongated structures, the opening extending in a direction substantially parallel to the long axis of at least one of the plurality of elongated structures and disrupting electrical continuity of the plurality of gate metal lines between the pair of adjacent elongated structures so that each of the plurality of gate metal lines is separated by the opening into a first portion and a second portion. In such an IC structure, the opening includes one or more electrically conductive materials, and, for each of the gate metal lines, the one or more electrically conductive materials are recessed in a portion of the opening that is between the first portion and the second portion of the gate metal line to be below the gate metal line.

Example 16 provides the IC structure according to example 15, where the support structure has a first face and an opposing second face, the plurality of elongated structures and the plurality of the gate metal lines are over the second face of the support structure, the IC structure further includes a backside interconnect over the first face of the support structure, and the opening extends between the first face and the second face of the support structure so that the backside interconnect is electrically coupled to the one or more electrically conductive materials of the opening at the first face of the support structure.

Example 17 provides the IC structure according to examples 15 or 16, where, for each of the gate metal lines, the opening includes one or more dielectric materials in the portion of the opening that is between the first portion and the second portion of the gate metal line.

Example 18 provides the IC structure according to any one of examples 15-17, where the support structure has a first face and an opposing second face, the plurality of elongated structures and the plurality of the gate metal lines are over the second face of the support structure, the IC structure further includes a trench contact so that the opening is between the trench contact and the first face of the support structure, and the IC structure further includes an electrically conductive via in a portion of an opening that is not between the first portion and the second portion of any of the gate metal lines, the electrically conductive via electrically coupling the one or more electrically conductive materials of the opening to the trench contact.

Example 19 provides a method of fabricating an IC structure. The method includes providing a support structure (e.g., a substrate, a wafer, a chip, or a die), having a first face and an opposing second face; providing an elongated channel structure of a channel material (which may include a combination of semiconductor materials) over the second face of the support structure, the elongated channel structure having a long axis substantially parallel to the support structure; and providing a transistor arrangement, having a channel portion that includes a portion of the channel material, and a gate stack (that may include at least a gate electrode material, and, in some embodiments, also a gate dielectric material), at least partially wrapping around the channel portion. The method further includes providing a power rail of an electrically conductive material (which may include a combination of electrically conductive materials), the power rail extending between the first face and the second face of the support structure and having a long axis substantially parallel to the long axis of the elongated channel structure, where, in a cross-section of the IC structure taken along a plane substantially perpendicular to each of the support structure and the long axis of the power rail (and, hence, also substantially perpendicular to the long axis of the elongated channel structure) and including the gate stack, a top of the power rail is closer to the first face of the support structure than a top of the gate stack by at least half of a dimension of the gate stack in the cross-section as measured in a direction substantially perpendicular to the support structure.

Example 20 provides the method according to example 19, where the elongated channel structure and the transistor arrangement are included in a device layer of the IC structure, the device layer provided over the support structure, and where providing the power rail includes forming an opening that is substantially perpendicular to the support structure, extends through the device layer and through the support structure, and has a long axis substantially parallel to the long axis of the elongated channel structure, lining at least portions of sidewalls of the opening that extend through at least a portion of the device layer with a liner dielectric material to form a lined opening, filling the lined opening with the electrically conductive material, providing a mask for a trench contact over the device layer, where the mask is substantially parallel to the support structure and substantially perpendicular to the long axis of the opening, and where the mask covers a portion of the opening, recessing the electrically conductive material in portions of the opening not covered by the mask, and replacing the mask for the trench contact with the trench contact. In such a method, the electrically conductive material is recessed in the portions of the opening not covered by the mask so that in all portions of the opening except for the portion of the opening covered by the mask, a top of the recessed electrically conductive material is closer to the first face of the support structure than the top of the gate stack, and the electrically conductive material in the portion of the opening covered by the mask is electrically continuous with the recessed electrically conductive material and with the trench contact.

Example 21 provides the method according to example 20, where the power rail is formed by at least the recessed electrically conductive material in the opening, and the electrically conductive material in the portion of the opening covered by the mask forms an electrically conductive via that is electrically coupled between the power rail and the trench contact.

Example 22 provides the method according to any one of examples 19-21, further including processes for forming the IC structure according to any one of the preceding examples.

Example 23 provides an IC package that includes an IC die and a further IC component, coupled to the IC die. The IC die includes one or more IC structures according to any one of the preceding examples (e.g., each IC structure may be an IC structure according to any one of examples 1-19 and/or may be formed according to a method of any one of examples 19-22).

Example 24 provides the IC package according to example 23, where the further component is one of a package substrate, a flexible substrate, or an interposer.

Example 25 provides the IC package according to examples 23 or 24, where the further component is coupled to the IC die via one or more first-level interconnects.

Example 26 provides the IC package according to example 25, where the one or more first-level interconnects include one or more solder bumps, solder posts, or bond wires.

Example 27 provides a computing device that includes a circuit board; and an IC die coupled to the circuit board, where the IC die includes one or more of: one or more IC structures arrangements according to any one of the preceding examples (e.g., each IC structure may be an IC structure according to any one of examples 1-18 and/or may be formed according to a method of any one of examples 19-22), and the IC package according to any one of the preceding examples (e.g., the IC package according to any one of examples 23-26).

Example 28 provides the computing device according to example 27, where the computing device is a wearable computing device (e.g., a smart watch) or handheld computing device (e.g., a mobile phone).

Example 29 provides the computing device according to examples 27 or 28, where the computing device is a server processor.

Example 30 provides the computing device according to examples 27 or 28, where the computing device is a motherboard.

Example 31 provides the computing device according to any one of examples 27-30, where the computing device further includes one or more communication chips and an antenna.

Example 32 provides a method of fabricating an IC structure, the method comprising processes for forming the IC structure according to any one of the preceding examples (e.g., the IC structure may be an IC structure according to any one of examples 1-19).

Example 33 provides a method of fabricating an IC package, the method comprising processes for forming the IC package according to any one of the preceding examples (e.g., the IC package may be an IC package according to any one of examples 23-26).

Example 34 provides a method of fabricating an computing device, the method comprising processes for forming the computing device according to any one of the preceding examples (e.g., the computing device may be a computing device according to any one of examples 27-31).

Example 35 provides a method of fabricating an microelectronic device that may include one or more of the IC structures according to any one of the preceding examples, the method comprising processes for forming the one or more of the IC structures according to any one of the preceding examples (e.g., each of the one or more of the IC structures may be IC structures according to any one of examples 1-19).

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) structure, comprising:
a substrate having a first face and an opposing second face;
an elongated structure of a semiconductor material over the second face of the substrate, the elongated structure having a long axis substantially parallel to the substrate;
a transistor arrangement comprising a channel portion that includes a portion of the semiconductor material, a region that is either a source region or a drain region adjacent to the channel portion, and a gate at least partially wrapping around the channel portion;
a conductive line coupled to the region;
a conductive structure extending between the first face and the second face of the substrate and having a long axis substantially parallel to the long axis of the elongated structure; and
a conductive via coupled between the conductive structure and the conductive line,
wherein, in a cross-section of the IC structure taken along a plane substantially perpendicular to the long axis of the conductive structure and including the gate, a top of the conductive structure is closer to the first face of the substrate than a top of the gate, and
wherein, in a cross-section of the IC structure taken along a plane substantially parallel to the long axis of the conductive structure and including the conductive via and the conductive line, sidewalls of the conductive via are aligned with sidewalls of the conductive line.

2. The IC structure according to claim 1, wherein, in a cross-section of the IC structure taken along a plane substantially perpendicular to the long axis of the conductive structure and including the conductive via and the conductive structure, sidewalls of the conductive via are aligned with sidewalls of the conductive structure.

3. The IC structure according to claim 1, wherein a material composition of an electrically conductive material of the conductive via is substantially same as a material composition of an electrically conductive material of the conductive structure and there are no barrier materials or liner materials between the electrically conductive material of the conductive via and the electrically conductive material of the conductive structure.

4. The IC structure according to claim 3, wherein the material composition of an electrically conductive material of the conductive via is different from a material composition of the conductive line.

5. The IC structure according to claim 1, wherein a distance from the conductive via to the region is smaller than a distance from the conductive via to the gate.

6. The IC structure according to claim 1, wherein a distance from the conductive via to the elongated structure is between about 2 and 100 nanometers.

7. The IC structure according to claim 1, wherein, in the cross-section, the top of the conductive structure is closer to the first face of the substrate than a bottom of the gate.

8. The IC structure according to claim 1, further comprising a backside interconnect coupled to at least a portion of the conductive structure at the first face of the substrate.

9. The IC structure according to claim 1, wherein the elongated structure is a fin, extending away from the substrate.

10. The IC structure according to claim 9, wherein:
the IC structure further includes one or more dielectric materials over the second face of the substrate and surrounding a first portion of the fin,
the channel portion is a second portion of the fin, where the first portion is closer to the substrate than the second portion; and
in the cross-section, the top of the conductive structure is below a top of the first portion of the fin.

11. The IC structure according to claim 1, wherein the elongated structure is a nanoribbon, substantially parallel to the substrate.

12. The IC structure according to claim 1, wherein the conductive via is coupled between the conductive structure and the conductive line by having one end being in conductive contact with the conductive structure and by having another end being in conductive contact with the conductive line.

13. The IC structure according to claim 1, wherein the conductive via is coupled between the conductive structure and the conductive line by having one end being in direct physical contact with the conductive structure and by having another end being in direct physical contact with the conductive line.

14. A method of fabricating an integrated circuit (IC) structure, the method comprising:
providing a substrate having a first face and an opposing second face;
providing an elongated structure of a semiconductor material over the second face of the substrate, the elongated structure having a long axis substantially parallel to the substrate;
providing a transistor arrangement, the transistor arrangement comprising:
a channel portion that includes a portion of the semiconductor material,
a region that is either a source region or a drain region adjacent to the channel portion, and
a gate at least partially wrapping around the channel portion;
providing a conductive line coupled to the region;
providing a conductive structure of an electrically conductive material, the conductive structure extending between the first face and the second face of the substrate and having a long axis substantially parallel to the long axis of the elongated structure; and
providing a conductive via coupled between the conductive structure and the conductive line, wherein, in a cross-section of the IC structure taken along a plane substantially perpendicular to the long axis of the conductive structure and including the gate, a top of the conductive structure is closer to the first face of the substrate than a top of the gate, and wherein, in a cross-section of the IC structure taken along a plane substantially parallel to the long axis of the conductive structure and including the conductive via and the conductive line, sidewalls of the conductive via are aligned with sidewalls of the conductive line.

15. The method according to claim 14, wherein the elongated structure and the transistor arrangement are included in a device layer of the IC structure, the device layer provided over the substrate, and wherein providing the conductive structure includes:

forming an opening that is substantially perpendicular to the substrate, extends through the device layer and through the substrate, and has a long axis substantially parallel to the long axis of the elongated structure, lining at least portions of sidewalls of the opening that extend through at least a portion of the device layer with a liner dielectric material to form a lined opening, filling the lined opening with the electrically conductive material, providing a mask for a conductive line over the device layer, where the mask is substantially parallel to the substrate and substantially perpendicular to the long axis of the opening, and where the mask covers a portion of the opening, recessing the electrically conductive material in portions of the opening not covered by the mask to provide a recessed electrically conductive material, and replacing the mask for the conductive line with the conductive line, wherein the electrically conductive material is recessed in the portions of the opening not covered by the mask so that:

in all portions of the opening except for the portion of the opening covered by the mask, a top of the recessed electrically conductive material is closer to the first face of the substrate than the top of the gate, and the electrically conductive material in the portion of the opening covered by the mask is electrically continuous with the recessed electrically conductive material and with the conductive line.

16. An integrated circuit (IC) structure, comprising:
a substrate having a first face and an opposing second face;

an elongated structure of a semiconductor material over the second face of the substrate, the elongated structure having a long axis substantially parallel to the substrate;

a transistor arrangement comprising a channel portion that includes a portion of the semiconductor material, a region that is either a source region or a drain region adjacent to the channel portion, and a gate at least partially wrapping around the channel portion;

a conductive line coupled to the region;

a conductive structure extending between the first face and the second face of the substrate and having a long axis substantially parallel to the long axis of the elongated structure; and a conductive via coupled between the conductive structure and the conductive line, wherein, in a cross-section of the IC structure taken along a plane substantially perpendicular to the long axis of the conductive structure and including the gate, a top of the conductive structure is closer to the first face of the substrate than a top of the gate, and wherein, in a cross-section of the IC structure taken along a plane substantially perpendicular to the long axis of the conductive structure and including the conductive via and the conductive structure, sidewalls of the conductive via are aligned with sidewalls of the conductive structure.

17. The IC structure according to claim 16, wherein, in a cross-section of the IC structure taken along a plane substantially parallel to the long axis of the conductive structure and including the conductive via and the conductive line, sidewalls of the conductive via are aligned with sidewalls of the conductive line.

18. The IC structure according to claim 16, wherein the conductive via is coupled between the conductive structure and the conductive line by having one end being in conductive contact with the conductive structure and by having another end being in conductive contact with the conductive line.

19. The IC structure according to claim 16, wherein the conductive via is coupled between the conductive structure and the conductive line by having one end being in direct physical contact with the conductive structure and by having another end being in direct physical contact with the conductive line.

* * * * *